US006961261B2

(12) United States Patent
Iwata

(10) Patent No.: US 6,961,261 B2
(45) Date of Patent: Nov. 1, 2005

(54) MAGNETIC RANDOM ACCESS MEMORY AND DATA READ METHOD THEREOF

(75) Inventor: Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/431,369

(22) Filed: May 8, 2003

(65) Prior Publication Data

US 2004/0125648 A1 Jul. 1, 2004

(30) Foreign Application Priority Data

Dec. 25, 2002 (JP) ........................................ 2002-374716

(51) Int. Cl.⁷ .............................................. G11C 11/00
(52) U.S. Cl. .................. 365/158; 365/171; 365/230.03
(58) Field of Search ................................ 365/158, 171, 365/230.03

(56) References Cited

U.S. PATENT DOCUMENTS

| | | | |
|---|---|---|---|
| 5,640,343 | A | 6/1997 | Gallagher et al. |
| 5,894,447 | A | 4/1999 | Takashima |
| 6,097,625 | A | 8/2000 | Scheuerlein |

(Continued)

FOREIGN PATENT DOCUMENTS

| | | |
|---|---|---|
| EP | 0 959 475 A2 | 11/1999 |
| JP | 2000-296082 | 9/2000 |
| JP | 2001-350013 | 11/2001 |
| JP | 2001-365236 | 11/2001 |
| JP | 2001-390518 | 12/2001 |
| JP | 2001-390549 | 12/2001 |
| JP | 2001-401850 | 12/2001 |
| JP | 2002-140499 | 5/2002 |
| JP | 2002-176683 | 6/2002 |
| WO | WO 02/41321 A1 | 5/2002 |

OTHER PUBLICATIONS

Roy Scheuerlein, et al., "A 10ns Read and Write Non–Volatile Memory Array Using a Magnetic Tunnel Junction and FET Switch in each Cell", 2000 IEEE ISSCC Digest of Technical Papers, Feb. 2000, pp. 128–129.

M. Durlam, et al., "Nonvolatile RAM based on Magnetic Tunnel Junction Elements", 2000 IEEE ISSCC Digest of Technical Papers, Feb. 2000, pp. 130–131.

*Primary Examiner*—VanThu Nguyen
(74) *Attorney, Agent, or Firm*—Oblon, Spivak, McClelland, Maier & Neustadt, P.C.

(57) ABSTRACT

A magnetic random access memory having a memory cell array in which one block is formed from a plurality of magnetoresistive elements using a magnetoresistive effect, and a plurality of blocks are arranged in row and column directions, includes a plurality of first magnetoresistive elements arranged in a first block, a plurality of first word lines each of which is independently connected to one terminal of a corresponding one of the first magnetoresistive elements and runs in the row direction, a first read sub bit line commonly connected to the other terminal of each of the first magnetoresistive elements, a first block select switch whose first current path has one end connected to one end of the first read sub bit line, and a first read main bit line which is connected to the other end of the first current path and runs in the column direction.

54 Claims, 35 Drawing Sheets

U.S. PATENT DOCUMENTS

| | | | |
|---|---|---|---|
| 6,130,835 | A | 10/2000 | Scheuerlein |
| 6,169,688 | B1 | 1/2001 | Noguchi |
| 6,178,131 | B1 | 1/2001 | Ishikawa et al. |
| 6,191,972 | B1 | 2/2001 | Miura et al. |
| 6,226,197 | B1 | 5/2001 | Nishimura |
| 6,256,247 | B1 | 7/2001 | Perner |
| 6,259,644 | B1 * | 7/2001 | Tran et al. .................. 365/209 |
| 6,272,041 | B1 | 8/2001 | Naji |
| 6,317,375 | B1 | 11/2001 | Perner |
| 6,324,093 | B1 * | 11/2001 | Perner et al. ............... 365/171 |
| 6,331,943 | B1 | 12/2001 | Naji et al. |
| 6,341,084 | B2 * | 1/2002 | Numata et al. ............. 365/158 |
| 6,356,477 | B1 | 3/2002 | Tran |
| 6,445,613 | B1 | 9/2002 | Nagai |
| 6,456,524 | B1 * | 9/2002 | Perner et al. ............... 365/158 |
| 6,477,077 | B1 | 11/2002 | Okazawa |
| 6,490,191 | B2 * | 12/2002 | Pochmuller ................. 365/158 |
| 6,532,163 | B2 * | 3/2003 | Okazawa ..................... 365/97 |
| 6,643,168 | B2 * | 11/2003 | Okazawa ..................... 365/173 |
| 6,724,653 | B1 * | 4/2004 | Iwata et al. ................. 365/158 |
| 6,795,334 | B2 * | 9/2004 | Iwata et al. ................. 365/158 |
| 6,839,269 | B2 * | 1/2005 | Iwata et al. ................. 365/158 |
| 2003/0123271 | A1 * | 7/2003 | Iwata .......................... 365/63 |
| 2003/0161197 | A1 * | 8/2003 | Iwata et al. ................. 365/200 |
| 2003/0198080 | A1 * | 10/2003 | Iwata .......................... 365/158 |
| 2004/0125647 | A1 * | 7/2004 | Iwata et al. ................. 365/158 |

\* cited by examiner

MAGNETIC RANDOM ACCESS MEMORY AND DATA READ METHOD THEREOF

CROSS-REFERENCE TO RELATED APPLICATIONS

This application is based upon and claims the benefit of priority from the prior Japanese Patent Application No. 2002-374716, filed Dec. 25, 2002, the entire contents of which are incorporated herein by reference.

BACKGROUND OF THE INVENTION

1. Field of the Invention

The present invention relates to a magnetic random access memory (MRAM) which stores "1"- and "0"-data using a magnetoresistive effect.

2. Description of the Related Art

In recent years, many memories which store data by new principles have been proposed. One of them is a magnetic random access memory (MRAM) using a tunneling magnetoresistive (to be referred to as TMR hereinafter) effect. As a proposal for a magnetic random access memory, for example, the following nonpatent reference 1 is known: Roy Scheuerlein et al, "A 10 ns Read and Write Non-Volatile Memory Array Using a Magnetic Tunnel Junction and FET Switch in each Cell", 2000 ISSCC Digest of Technical Papers (U.S.A.), February 2000, pp. 128–129 is known.

A magnetic random access memory stores "1"- or "0"-data in an MTJ (Magnetic Tunnel Junction) element using the TMR effect for read operation. As the basic structure of an MTJ element, an insulating layer (tunneling barrier) is sandwiched between two magnetic layers (ferromagnetic layers).

Data stored in the MTJ element is determined on the basis of whether the magnetizing states of the two magnetic layers are parallel or antiparallel. "Parallel" means that the two magnetic layers have the same magnetizing direction. "Antiparallel" means that the two magnetic layers have opposite magnetizing directions.

When the magnetized state of the MTJ element is "parallel", the tunneling resistance of the insulating layer (tunneling barrier layer) sandwiched between the two magnetic layers of the MTJ element is minimized. For example, this state is defined as a "1"-state. When the magnetized state of the MTJ element is "antiparallel", the tunneling resistance of the insulating layer (tunneling barrier layer) sandwiched between the two magnetic layers of the MTJ element is maximized. For example, this state is defined as a "0"-state.

Currently, various kinds of cell array structures have been examined for a magnetic random access memory from the viewpoint of increasing the memory capacity or stabilizing write/read operation.

For example, currently, a cell array structure in which one memory cell is formed from one MOS transistor and one MTJ element is known. Additionally, a magnetic random access memory which has such a cell array structure and stores 1-bit data using two memory cells so as to implement stable read operation is also known.

However, in these magnetic random access memories, it is difficult to increase the memory capacity. This is because one MOS transistor corresponds to one MTJ element in these cell array structures.

For example, array structures in which a plurality of MTJ elements are connected in parallel have been proposed (e.g., patent reference 1 (Japanese Patent Application No. 2000-296082) and patent reference 2 (Japanese Patent Application No. 2001-350013)). According to these cell array structures, since one MOS transistor corresponds to a plurality of MTJ elements, the memory capacity can be increased as compared to the cell array structure having memory cells each formed from one MTJ element and one MOS transistor.

In the techniques disclosed in patent references 1 and 2, however, the MTJ elements are two-dimensionally arranged in one plane. For this reason, the integration density of MTJ elements cannot be sufficiently increased.

To solve this problem, a technique for three-dimensionally arranging MTJ elements on a semiconductor substrate has been proposed. More specifically, in this technique, a plurality of MTJ elements connected in series or parallel are arranged in correspondence with one MOS transistor (select transistor) formed in the surface region of a semiconductor substrate. In addition, the plurality of MTJ elements are stacked in a plurality of stages on one MOS transistor.

This technique is disclosed in detail in, e.g., patent reference 3 (Japanese Patent Application No. 2001-365236). According to this technique, a plurality of MTJ elements are stacked in a plurality of stages on one MOS transistor. This is convenient for increasing the memory capacity of the memory cell array.

In the techniques disclosed in patent references 1 and 2, a so-called destructive read operation principle is applied to read operation. As described in detail in these references, the destructive read operation principle has a problem that since read operation of one cycle basically comprises two read steps and two write steps, the read time is long.

To the contrary, in the technique disclosed in patent reference 3, the plurality of MTJ elements connected in series or parallel in a block have different resistance ratios. Hence, data of the plurality of MTJ elements in the block can be read out simultaneously by only one read step.

In the technique disclosed in patent reference 3, however, since the plurality of MTJ elements connected in series or parallel in a block must have different resistance ratios, the structure and manufacturing method of an MTJ element are complex. Additionally, since read data contains the data of the plurality of MTJ elements, an A/D conversion circuit or logic circuit which extracts the data of each MTJ element from the read data is necessary, resulting in a complex read circuit.

Still another example is a magnetic random access memory having a circuit structure as shown in FIG. 46 (e.g., patent reference 4 (Japanese Patent Application No. 2001-390549) and patent reference 5 (Japanese Patent Application No. 2001-390518)).

In a magnetic random access memory with such a circuit structure, assume that four MTJ elements (MTJ1, MTJ2, MTJ3, and MTJ4) 12 selected by a read word line RWL1 in, e.g., a lower left block BK11 are to be simultaneously read-accessed. The MTJ elements MTJ1, MTJ2, MTJ3, and MTJ4 form two complementary pairs.

In this circuit structure, assume that the same potential is biased to bit lines BL1, BL2, BL3, and BL4. In this case, the MTJ elements 12 in an unselected lower right block BLj1 make current paths between the bit lines BL1, BL2, BL3, and BL4. But no current flows between the bit lines BL1, BL2, BL3, and BL4, because their potentials are same. Hence, currents (solid lines) flowing to the MTJ elements MTJ1, MTJ2, MTJ3, and MTJ4 in the selected lower left block BK11 are read out by sense amplifiers 15-1, 15-2, 15-3, and 15-4, respectively.

However, if a potential difference is generated, a current flows through the MTJ elements 12 in an unselected lower right block BLj1. As the number of MTJ elements connected to each of the bit lines BL1, BL2, BL3, and BL4 increases, the current becomes large.

A select cell MOS transistor (column select switch 14-1) is inserted between the common line to the sense amplifiers 15-1, 15-2, 15-3, and 15-4 and the bit lines BL1, BL2, BL3, and BL4. Since the select MOS transistor has a resistance, a potential difference is generated in accordance with the resistance of the selected MTJ element. When the potential difference is generated between the bit lines BL1, BL2, BL3, and BL4, a current flows through the common node of the MTJ elements in the block.

For descriptive convenience, assume that the MTJ elements connected to the bit lines BL1, BL2, BL3, and BL4 have the same resistance value, only the MTJ element connected to the bit line BL1 is in a high-resistance state (the magnetizing directions of the storing layer and fixed layer are antiparallel), and the MTJ elements connected to the remaining bit lines BL2, BL3, and BL4 are in a low-resistance state (the magnetizing directions of the storing layer and fixed layer are parallel).

Let Is be the signal current difference when the MTJ elements are in the high- and low-resistance states, V be the bias voltage from the sense amplifier, Rm be the resistance of the MTJ element, Rt be the resistance of the MOS transistor of the block select switch, and Rc be the resistance of the MOS transistor of the column select switch. The signal current difference Is is given by $$Is=V/(Rt+Rc+Rm)-V/[Rt+Rc+Rm\cdot(1+MR)]=MR\times V/Rm\div[1+(Rt+Rc)/Rm]+[1+MR+(Rt+Rc)/Rm] \quad (1)$$

A potential difference $\triangle V$ between the bit line BL1 and the bit lines BL2, BL3, and BL4 due to the resistance of the MTJ element and that of the MOS transistor by data is given by $$\triangle V = V/[Rt+Rc+Rm\cdot(1+MR)]\times[Rt+Rm\cdot(1+MR)] - \quad (2)$$
$$V/[Rt+Rc+Rm]\times[Rt+Rm] = MR\times V\times$$
$$Rc/Rm \div [1+(Rt+Rc)/Rm] \div [1+MR+(Rt+Rc)/Rm]$$

Let n be the number of MTJ elements connected to a bit line BL. Then, a current
(three dotted lines in FIG. 46) which flows in a direction to cancel the signal current difference Is through the common terminal of the MTJ elements flows through a synthesized resistance in which the synthesized resistance of the three MTJ elements MTJ2, MTJ3, and MTJ4 arrayed in parallel and one MTJ element MTJ1 is in a n−1 parallel state. Hence, the current
is given by $$\triangle I = \triangle V[(Rm+Rm/3)/(n-1)] \quad (3)$$
$$= V\times(n-1)/(4\cdot Rm/3)\times Rc/Rm\times MR\div$$
$$[1+(Rt+Rc)/Rm]\div[1+MR+(Rt+Rc)/Rm]$$

From equations (1) to (3), the net signal current difference Is' is given by $$Is' = Is - \triangle I \quad (4)$$

-continued
$$= MR\times V/Rm\div[1+(Rt+Rc)/Rm]\div$$
$$[1+MR+(Rt+Rc)/Rm]\times[1-Rc\cdot(n-1)/(4\cdot Rm/3)]$$

In equation (4), if the relationship 1−Rc·(n−1)/(4·Rm/3) >0, i.e., Rm/Rc>4(n−1)/3 is not satisfied, a read error occurs.

To prevent the read error, the resistance Rm of the MTJ element must be increased, the channel width of the MOS transistor of the column select switch must be increased, or the number of cells connected to the bit line BL must be decreased.

However, if the number of cell arrays is simply increased while decreasing the number of cells connected to the bit line BL due to the constraint on the maximum number of cells connectable to the bit line BL, the chip size increases, and it may be impossible to sufficiently increase the integration density of MTJ elements. For this reason, the above measures can hardly be taken for a large-capacity memory.

BRIEF SUMMARY OF THE INVENTION

According to a first aspect of the present invention, there is provided a magnetic random access memory having a memory cell array in which one block is formed from a plurality of magnetoresistive elements using a magnetoresistive effect, and a plurality of blocks are arranged in row and column directions, comprising:

a plurality of first magnetoresistive elements arranged in a first block;

a plurality of first word lines each of which is independently connected to one terminal of a corresponding one of the plurality of first magnetoresistive elements and runs in the row direction;

a first read sub bit line commonly connected to the other terminal of each of the plurality of first magnetoresistive elements;

a first block select switch whose first current path has one end connected to one end of the first read sub bit line; and a first read main bit line which is connected to the other end of the first current path and runs in the column direction.

According to a second aspect of the present invention, there is provided a data reading method of a magnetic random access memory comprising a first block, the first block comprising a plurality of first magnetoresistive elements which read data using a magnetoresistive effect, a plurality of first word lines each of which is independently connected to one terminal of a corresponding one of the plurality of first magnetoresistive elements, a first read sub bit line commonly connected to the other terminal of each of the plurality of first magnetoresistive elements, a first block select switch whose first current path has one end connected to the first read sub bit line, and a first read main bit line connected to the other end of the first current path, a second block arranged on the same row as that of the first block and on a different column, the second block comprising a plurality of second magnetoresistive elements which read data using the magnetoresistive effect, the plurality of first word lines each of which is independently connected to one terminal of a corresponding one of the plurality of second magnetoresistive elements, a second read sub bit line commonly connected to the other terminal of each of the plurality of first magnetoresistive elements, a second block select switch whose second current path has one end connected to the second read sub bit line, and a second read main bit line connected to the other end of the second current path, a third block arranged on the same column as that of the first block and on a different row, the third block comprising a plurality of third magnetoresistive elements which read data using the magnetoresistive effect, a plurality of second word lines each of which is independently connected to one terminal of a corresponding one of the plurality of third magnetoresistive elements, a third read sub bit line commonly connected to the other terminal of each of the plurality of third magnetoresistive elements, a third block select switch whose third current path has one end connected to the third read sub bit line, and the first read main bit line connected to the other end of the third current path, a first bias circuit which is arranged around the first to third blocks and connected to the first read main bit line, a second bias circuit which is arranged around the first to third blocks and connected to the second read main bit line, and a sense amplifier which is arranged around the first to third blocks and connected to the first and second read main bit lines, comprising:

in reading data of a first selected magnetoresistive element in the plurality of first magnetoresistive elements in the first block, connecting the first read main bit line to the sense amplifier;

selecting, from the plurality of first word lines, a selected word line to be connected to the first selected magnetoresistive element; and supplying a first read current to the first selected magnetoresistive element and supplying a second read current to a second selected magnetoresistive element to be connected to the selected word line in the plurality of second magnetoresistive elements in the second block to cause the sense amplifier to read out data of the first selected magnetoresistive element.

DETAILED DESCRIPTION OF THE INVENTION

1. Outline of Present Invention

The outline of magnetic random access memories according to the embodiments of the present invention will be described.

First, magnetic random access memories (MRAMs) according to the embodiments of the present invention employ [1] a structure in which one read switch element is shared by a plurality of MTJ (magnetic tunnel junction) elements, and the plurality of MTJ elements are stacked in a plurality of stages in a direction (vertical direction) perpendicular to the surface of a semiconductor substrate to form one block, [2] a structure in which one read switch element is shared by a plurality of MTJ elements, and the plurality of MTJ elements are arranged in a direction (lateral direction) parallel to the surface of a semiconductor substrate to form one block, or [3] a structure in which two read switch elements are shared by a plurality of MTJ elements, the plurality of MTJ elements are arranged in a direction (lateral direction) parallel to the surface of a semiconductor substrate to form one block, and two block select switches are arranged.

Second, in the magnetic random access memories according to the embodiments of the present invention, in each of the block arrangements [1] to [3], each of the plurality of MTJ elements independently has a word line connected to one terminal. A read sub bit line is commonly connected to the other terminal of each of the plurality of MTJ elements. The read sub bit line is connected to a read main bit line through a read select switch. Hence, each read bit line is divided into a main bit line and a sub bit line.

Third, in the magnetic random access memories according to the embodiments of the present invention, a cell array structure is formed by arraying a plurality of blocks having the arrangement [1], [2], or [3] in a matrix. A sense amplifier and bias circuits which bias to the read main bit lines are arranged in the peripheral circuit portion around the cell array.

Fourth, in the magnetic random access memories according to the embodiments of the present invention, in read operation, a read current is supplied to all MTJ elements connected to the same word line as that of the selected MTJ element. In addition, in blocks on the same row as that of the selected block, an equipotential is applied from the bias circuits to the read bit lines of the blocks. In the read operation, the ground potential or power supply potential is supplied to the selected word line of the selected block. Unselected word lines of the selected blocks are set in a floating state.

2. Embodiments of Present Invention

Details of the magnetic random access memories according to the embodiments of the present invention will be described.

Figure 46:
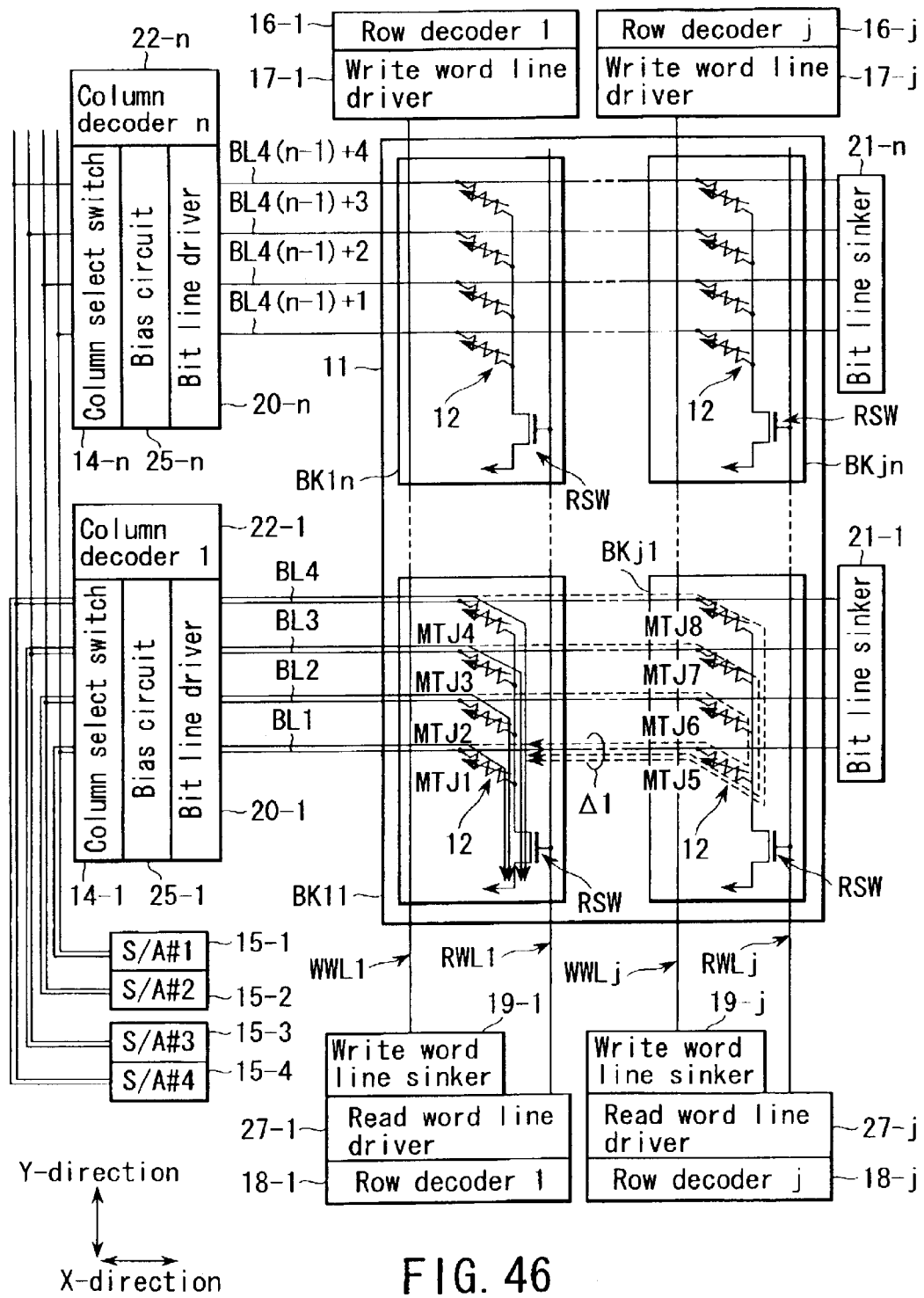
FIG. 46 is a view showing the schematic arrangement of a magnetic random access memory according to a prior art.

In each embodiment, the arrangement of patent references 4 and 5 shown in FIG. 46 is changed to decrease the number of cells connected to a bit line BL. In each embodiment, since the bit line BL is used as a data read line, the positional relationship between word lines WL and the bit lines BL is reversed to that of the prior-art structure shown in FIG. 46.

The embodiments can roughly be classified into three cell structures: [1] stacked cell structure, [2] horizontal cell structure, and [3] cross-point cell structure.

The embodiments will be described below with reference to the accompanying drawings. The same reference numerals denote the same parts throughout the drawings.

[1] Stacked Cell Structure

In the first to fourth embodiments, a plurality of MTJ elements are stacked on one read switching element, and the plurality of stacked MTJ elements are connected to the switching element to form one block.

In the first to fourth embodiments, four MTJ elements are stacked in one block. However, the number of MTJ elements is not limited to this.

[1-1: First Embodiment]

In the first embodiment, a stacked cell structure is formed by stacking MTJ elements, and a MOS transistor is used as a read switching element.

A. Overall Circuit Structure

Figure 1:
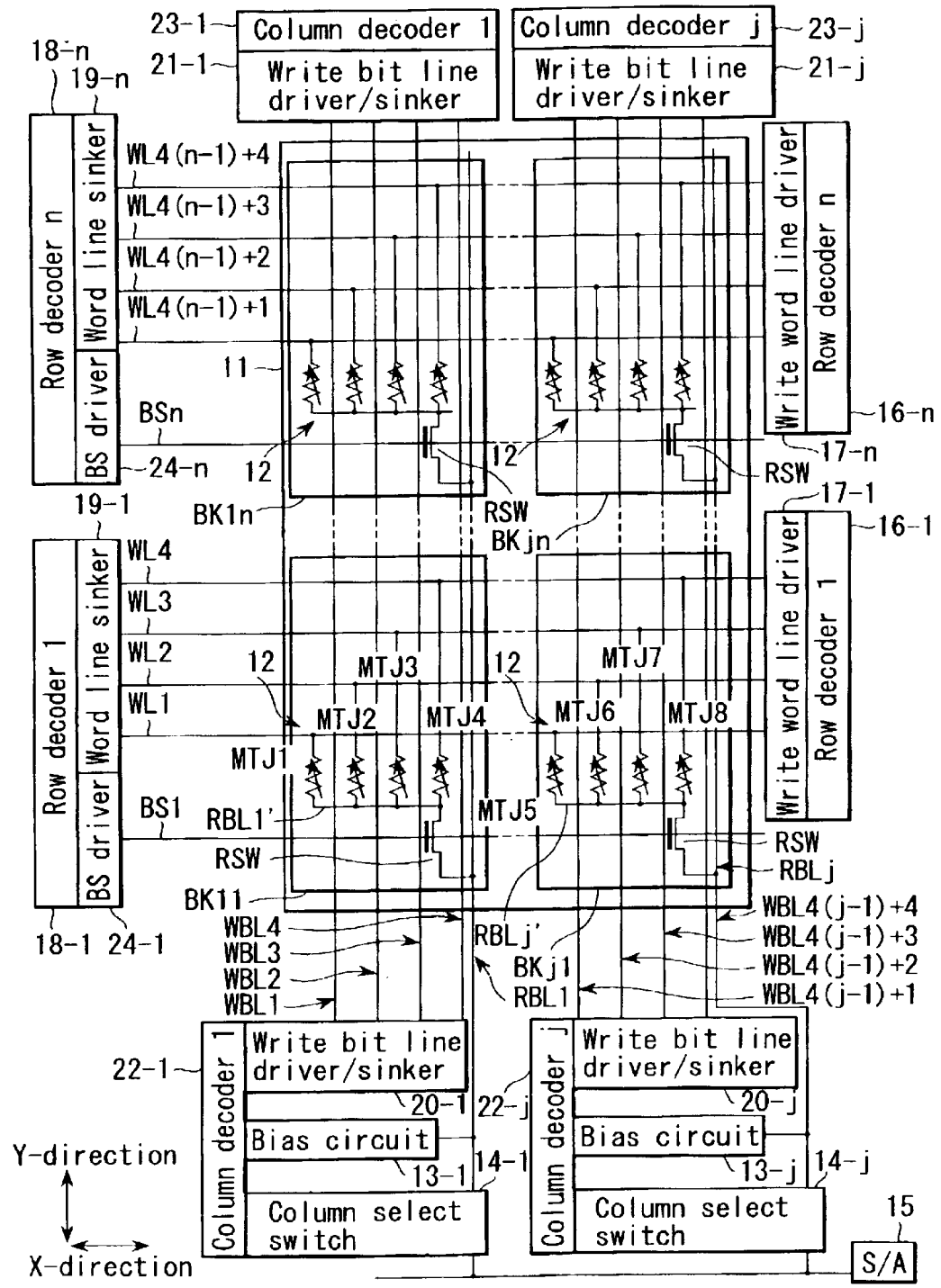
FIG. 1 is a view showing the schematic arrangement of a magnetic random access memory according to the first embodiment of the present invention.

FIG. 1 is a view showing the schematic arrangement of a magnetic random access memory according to the first embodiment of the present invention.

A memory cell array 11 has a plurality of MTJ elements 12 arranged in an array in the X-, Y-, and Z-directions. The Z-direction means a direction perpendicular to the drawing surface, i.e., perpendicular to the X- and Y-directions.

In this embodiment, the memory cell array 11 has a cell array structure formed from j MTJ elements 12 arranged in the X-direction, n MTJ elements 12 arranged in the Y-direction, and four MTJ elements 12 (MTJ1, MTJ2, MTJ3, and MTJ4) stacked in the Z-direction.

The four MTJ elements 12 stacked in the Z-direction form one block BKik (i=1, 2, ..., j, k=1, 2, ..., n). The four MTJ elements 12 in the block BKik actually overlap each other in the direction (Z-direction) perpendicular to the drawing surface.

In this embodiment, j blocks BKik arranged in the X-direction form one row. The memory cell array 11 has n rows. In addition, n blocks BKik arranged in the Y-direction form one column. The memory cell array 11 has j columns.

One terminal of each of the four MTJ elements 12 in the block BKik is commonly connected by a read sub bit line RBLi' (i=1, 2, ..., j) and then connected to a read main bit line RBLi through a read select switch (block select switch or row select switch) RSW formed from, e.g., a MOS transistor. The read main bit line RBLi runs in the Y-direction. One read main bit line RBLi is arranged in, e.g., one column.

The read main bit line RBLi is connected to a sense amplifier (S/A) 15 through a bias circuit 13-$i$ and column select switch 14-$i$ formed from, e.g., a MOS transistor.

The other terminal of each of the four MTJ elements 12 in the block BKik is independently connected to a corresponding one of read/write word lines WL4(n−1)+1, WL4(n−1)+2, WL4(n−1)+3, and WL4(n−1)+4. That is, the four word lines WL4(n−1)+1, WL4(n−1)+2, WL4(n−1)+3, and WL4(n−1)+4 are arranged in one row in correspondence with the four MTJ elements 12 in one block BKik. In this case, n indicates a row number (n=1, 2, ...)

The word lines WL4(n−1)+1, WL4(n−1)+2, WL4(n−1)+3, and WL4(n−1)+4 run in the X-direction. One end of each of the word lines is connected to a row decoder 16-$n$ and write word line driver 17-$n$. The other end is connected to a row decoder 18-$n$ and word line sinker 19-$n$.

A plurality of (in this embodiment, four) write bit lines WBL4(j−1)+1, WBL4(j−1)+2, WBL4(j−1)+3, and WBL4(j−1)+4 which run in the Y-direction and are stacked in the Z-direction are arranged respectively near and in correspondence with the four MTJ elements 12 that construct the block BKik.

The two ends of each of the write bit lines WBL4(j−1)+1, WBL4(j−1)+2, WBL4(j−1)+3, and WBL4(j−1)+4 are connected to write bit line drivers/sinkers 20-$j$ and 21-$j$ and column decoders 22-$j$ and 23-$j$.

The gate of the read select switch (MOS transistor) RSW forms a block select line BSn (n=1, 2, ...) One block select line BSn is arranged in one row. For example, when one column is formed from four blocks, the number of block select lines BSn is four. The block select line BSn runs in the X-direction. One end of the block select line BSn is connected to a block select driver (BS driver) 24-$n$ (n=1, 2, ...)

B. Write/Read Operation Principle

Data write/read operation in the first embodiment of the present invention will be described next.

(1) Write Operation Principle

The write method of the first embodiment is the same as that for a normal cell having one MOS transistor and one MTJ element. Assume that data should be written in the MTJ element MTJ1 in a lower left block BK11.

First, a word line WL1 and write bit line WBL1 are selected. Currents are supplied to the selected word line WL1 and write bit line WBL1, and magnetic fields generated from these currents are synthesized. Magnetization of the MTJ element MTJ1 at the intersection between the selected word line WL1 and write bit line WBL1 is inverted or not inverted by the synthesized magnetic field to write arbitrary data in the MTJ element MTJ1.

Data to be written in the MTJ element MTJ1 is determined by the direction of the write current flowing to the write bit line WBL1.

(2) Read Operation Principle

① Outline of Read Operation

The outline of read operation principle according to the first embodiment will be described. Assume that the data of the MTJ element MTJ1 in the lower left block BK11 should be read out.

First, a column select switch 14-1 selected by a column decoder 22-1 is turned on to connect a read bit line RBL1 selected by a column address signal to the sense amplifier 15. A bias current is supplied from the sense amplifier 15. The voltage of the read bit line RBL1 is set to a predetermined voltage (Vconst) by the feedback circuit of the sense amplifier 15 (to be described later).

Unselected read bit lines RBLj are not connected to the sense amplifier 15 because column select switches 14-$j$ are OFF, though the predetermined voltage (Vconst) is applied from bias circuits 13-$j$ to the read bit lines RBLj. The predetermined voltage applied to the read bit lines RBLj is the same as that applied to the read bit line RBL1.

In addition, a block select line BS1 is driven by a row address signal (in this case, address signal bits except two bits) necessary for selecting the block BK11, and the MOS transistor RSW for selecting the block BK11 is turned on.

In the block BK11, the word line WL1 selected by the row address signal is set to a ground potential VSS, and unselected word lines WL2, WL3, and WL4 are set in the floating state.

With this operation, a bias current from the sense amplifier 15 flows to the MTJ element MTJ1 selected by the row address signal and column address signal so that the data written in the MTJ element MTJ1 is read out.

No currents flow to the MTJ elements 12 in upper left and upper right blocks BKln and BKjn in which the block select MOS transistors RSW are OFF.

A bias current from the bias circuit 13-$j$ is supplied to the MTJ elements 12 in a lower right block BKj1 which is not selected by the column address signal and whose block select MOS transistor RSW is ON. The current flowing to an MTJ element MTJ5 which is connected to the word line WL1 in the unselected block BKj1 flows to the ground potential VSS through the word line WL1. Hence, the current does not reflux to the MTJ element MTJ1 in the block BK11 selected by the row address signal and column address signal.

② Details of Read Operation

Figure 2:
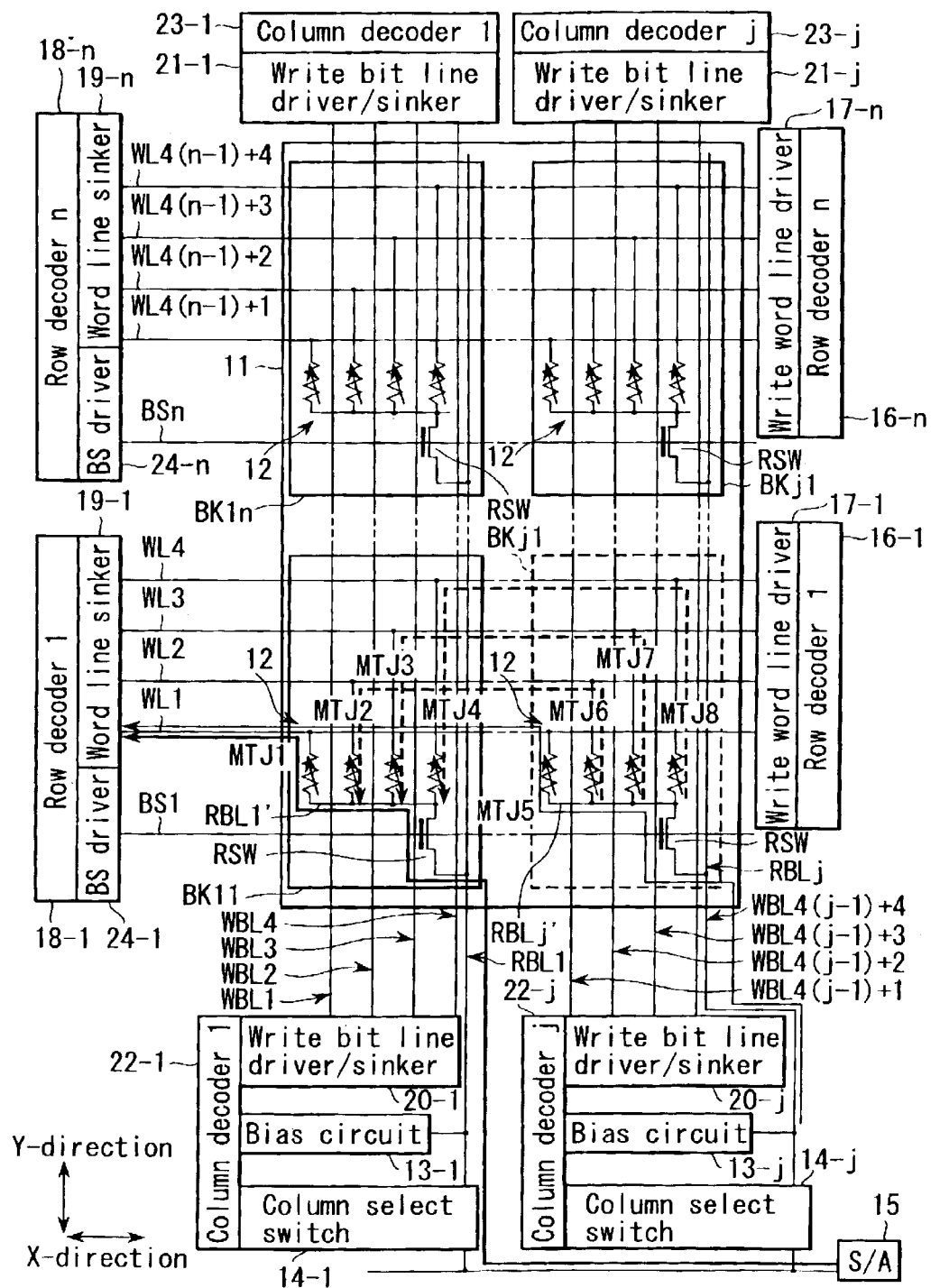
FIG. 2 is a view showing the data read operation of the magnetic random access memory according to the first embodiment of the present invention.

The above-described data read operation will be described next in more detail with reference to FIG. 2. Assume also here that the data of the MTJ element MTJ1 in the lower left block BK11 should be read out.

Assume that the common nodes of the MTJ elements 12, which correspond to the read sub bit line RBLi', are set at an equipotential (e.g., the ground potential). In this case, the MTJ elements 12 in an unselected lower right block BLj1 make current paths between the word lines WL1, WL2, WL3, and WL4. But no current flows between the word lines WL1, WL2, WL3, and WL4, because their potentials are same. Hence, currents (dotted lines in FIG. 2) flowing to the MTJ element MTJ1 in the selected lower left block BK11 are read out by the sense amplifier 15. In this circuit structure, assume that the same potential is biased to bit lines BL1, BL2, BL3, and BL4.

The read main bit lines RBLj are not biased by the sense amplifier 15 but biased to an equipotential by the bias circuits 13-j. Hence, whether the read main bit lines RBLj are connected to the sense amplifier 15 is irrelevant here.

However, when the common nodes of the MTJ elements 12 have a potential difference, currents flow between the word lines WL1, WL2, WL3, and WL4. Hence, note the following points.

The read select switch RSW and column select switch 14-1 are present between the sense amplifier 15 and the common node of the MTJ elements 12, i.e., the read sub bit line RBLi'. That is, two select MOS transistors are present. Since the select MOS transistors have resistances, a potential difference is generated in accordance with the resistance of the selected MTJ element MTJ1.

For the descriptive convenience, assume that the MTJ elements 12 connected to the word lines WL1, WL2, WL3, and WL4 have the same resistance value, only the MTJ element 12 connected to the word line WL1 is in a high-resistance state (the magnetizing directions of the storing layer and fixed layer are antiparallel), and the MTJ elements 12 connected to the remaining word lines WL2, WL3, and WL4 are in a low-resistance state (the magnetizing directions of the storing layer and fixed layer are parallel).

Let Is be the signal current difference when the MTJ elements 12 are in the high- and low-resistance states, V be the bias voltage from the sense amplifier 15, Rm be the resistance of the MTJ element, Rt be the resistance of the row select MOS transistor, and Rc be the total resistance of the column select MOS transistor and block select MOS transistor. The signal current difference Is is given by $$Is = V/(Rt+Rc+Rm) - V/[Rt+Rc+Rm\cdot(1+MR)] = MR \times V/Rm \div [1+(Rt+Rc)/Rm] \div [1+MR+(Rt+Rc)/Rm] \quad (5)$$

A potential difference $\Delta V$ V between the common nodes of the MTJ elements 12, which correspond to the read sub bit line RBLi', due to the resistance of the MTJ elements 12 and that of the MOS transistor by data is given by $$\Delta V = V/[Rt+Rc+Rm\cdot(1+MR)] \times [Rt+Rm\cdot(1+MR)] - \quad (6)$$
$$V/[Rt+Rc+Rm] \times [Rt+Rm] = MR \times V \times$$
$$Rc/Rm \div [1+(Rt+Rc)/Rm] \div [1+MR+(Rt+Rc)/Rm]$$

Let m be the number of MTJ elements 12 connected to the word line WL. Then, a current $\Delta I$ I which flows in a direction to cancel the signal current difference Is through the common terminal of the MTJ elements 12 is given by $$\Delta I = \quad (7)$$
$$\Delta V [\{Rm + Rm/(m-1)\}/3] = V \times 3 \cdot (m-1)/(m \cdot Rm) \times Rc/Rm \times$$

-continued
$$MR \div [1+(Rt+Rc)/Rm] \div [1+MR+(Rt+Rc)/Rm]$$

From equations (5), (6), and (7), the net signal current difference Is' is given by $$Is' = Is - \Delta I \quad (8)$$
$$= MR \times V/Rm \div [1+(Rt+Rc)/Rm] \div$$
$$[1+MR+(Rt+Rc)/Rm] \times [1 - Rc \cdot 3 \cdot (m-1)/(m \cdot Rm)]$$

If the relationship $1 - Rc \cdot 3 \cdot (m-1)/(m \cdot Rm) > 0$, i.e., $Rm/Rc > 3 \cdot (m-1)/m$ is not satisfied, a read error occurs. Since $1 > (m-1)/m$, it is more strictly necessary to satisfy $Rm/Rc > 3$.

That is, the constraint of Rm/Rc for preventing any read error depends, not on the number of cells connected to the word line WL, but on the resistance Rm of the MTJ elements and the total resistance Rc of the column select MOS transistor and block select MOS transistor.

As described above, according to this embodiment, the total resistance Rc of the column select MOS transistor and block select MOS transistor is substantially twice that in patent references 4 and 5. However, the parameters m and n that indicate the array scale are not contained in the constraint expression. For this reason, the array scale is not limited. That is, this proposal is more advantageous in capacity than patent references 4 and 5.

C. Circuit Structure of Peripheral Circuit Portion

The detailed arrangement of the peripheral circuit portion will be described next. Only a peripheral circuit portion corresponding to the MTJ element MTJ1 in the block BK11 will be illustrated and described.

(1) Word Line Driver/Sinker

① CIRCUIT Example 1

Figure 3:
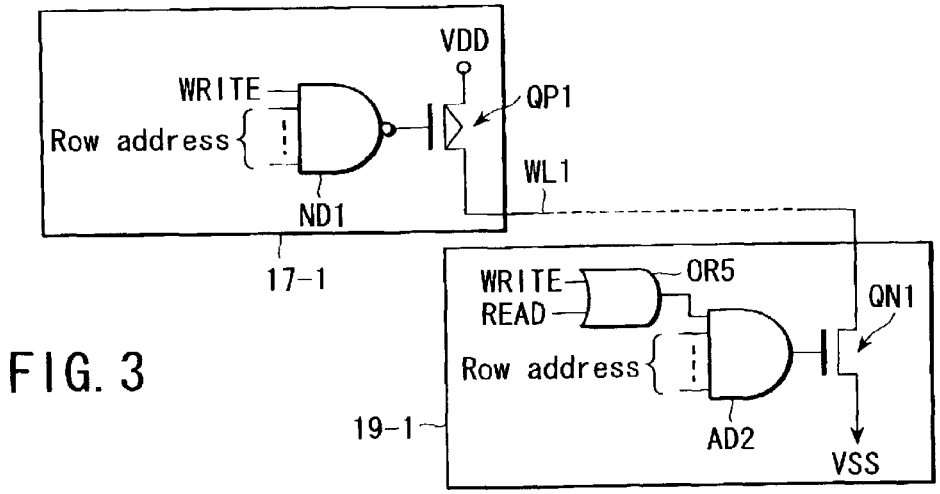
FIG. 3 is a view showing Circuit Example 1 of a word line driver/sinker according to the first embodiment of the present invention.

FIG. 3 shows Circuit Example 1 of the word line driver/sinker according to the first embodiment of the present invention.

A write word line driver 17-1 has a PMOS transistor QP1 and NAND circuit ND1. A word line sinker 19-1 has an NMOS transistor QN1, AND circuit AD2, and OR circuit OR5.

The PMOS transistor QP1 is connected between a power supply terminal VDD and one end of the word line WL1. The output signal from the NAND circuit ND1 is supplied to the gate of the PMOS transistor QP1.

A write signal WRITE is input to the NAND circuit ND1. The write signal WRITE determines the period during which the write current is to be supplied. A row address signal for selecting the word line WL1 is also input to the NAND circuit ND1.

The NMOS transistor QN1 is connected between the other end of the word line WL1 and the ground terminal VSS. The output signal from the OR circuit OR5 is supplied to the AND circuit AD2. The output signal from the AND circuit AD2 is supplied to the gate of the NMOS transistor QN1.

The write signal WRITE and a read signal READ are input to the OR circuit OR5. The read signal READ determines the read operation period. The row address signal is input to the AND circuit AD2.

In Circuit Example 1, a data write/read is executed in the following way.

In the write mode, the PMOS transistor QP1 serving as the driver and the NMOS transistor QN1 serving as the sinker of the selected row address signal are turned on by the row decoder to supply a current to the selected word line WL1.

In the write mode, since PMOS transistors serving as the drivers and NMOS transistors serving as the sinkers of unselected word lines WL are OFF, no currents flow to the unselected word lines WL.

In the read mode, the NMOS transistor QN1 serving as the sinker of the selected row address signal is turned on by the row decoder to bias the selected word line WL1 to the ground potential VSS.

In the read mode, since PMOS transistors serving as the drivers and NMOS transistors serving as the sinkers of unselected word lines WL are OFF, the unselected word lines WL are set in the floating state in this circuit.

② CIRCUIT Example 2

Figure 4:
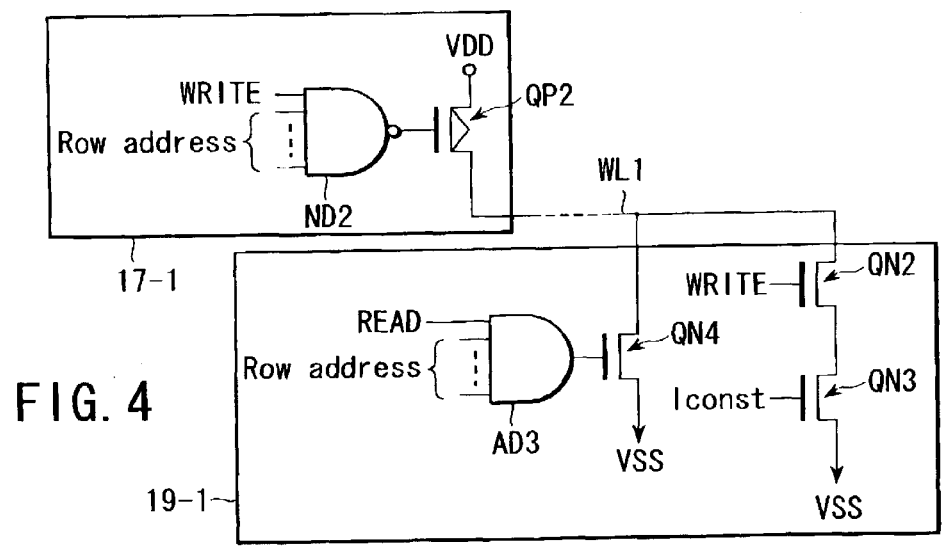
FIG. 4 is a view showing Circuit Example 2 of the word line driver/sinker according to the first embodiment of the present invention.

FIG. 4 shows Circuit Example 2 of the word line driver/sinker according to the first embodiment of the present invention.

In Circuit Example 2, only one of the sinker and driver needs to have address selectivity. For this reason, the circuit scale is reduced by omitting the decoder on the sinker side. In addition, the dependence on the power supply voltage is eliminated, and the dependence on the temperature is eliminated. Alternatively, a current source circuit is arranged to supply a current in the write mode such that dependence on the temperature can be obtained in correspondence with the switching characteristics of MTJ elements. The output (Iconst) from the current supply circuit is input to the gate to operate in the saturation condition, thereby forming a current mirror for the current output from the current source. In this case, an NMOS transistor sinker for the read mode must be particularly arranged, unlike the Circuit Example 1 shown in FIG. 3.

Since Circuit Example 2 is different from Circuit Example 1 in the arrangement of the word line sinker 19-1, the write word line driver 17-1 will be only briefly described.

The write word line driver 17-1 has a PMOS transistor QP2 and NAND circuit ND2, as in Circuit Example 1. The word line sinker 19-1 has NMOS transistors QN2, QN3, and QN4 and an AND circuit AD3.

The NMOS transistors QN2 and QN3 are connected between the other end of the word line WL1 and the ground terminal VSS. The write signal WRITE is input to the gate of the NMOS transistor QN2. A predetermined voltage (Iconst) is supplied to the gate of the NMOS transistor QN3.

The NMOS transistor QN4 is connected between the other end of the word line WL1 and the ground terminal VSS. The output signal from the AND circuit AD3 is input to the gate of the NMOS transistor QN4.

The read signal READ is input to the AND circuit AD3. The row address signal is also input to the AND circuit AD3.

In Circuit Example 2, a data write/read is executed in the following way.

In the write mode, the PMOS transistor QP2 serving as the driver and the NMOS transistors QN2 (turned on by the write signal WRITE) and QN3 (turned on by Iconst) serving as the sinkers of the selected row address signal are turned on by the row decoder to supply a current to the selected word line WL1.

In the write mode, since PMOS transistors serving as the drivers of unselected word lines WL are OFF, no currents flow to the unselected word lines WL.

In the read mode, the NMOS transistor QN4 serving as the sinker of the selected row address signal is turned on by the row decoder to set the selected word line WL1 to the ground potential VSS.

In the read mode, since PMOS transistors serving as the drivers and NMOS transistors serving as the sinkers of unselected word lines WL are OFF, the unselected word lines WL are set in the floating state.

(2) Write Bit Line Driver/Sinker

① CIRCUIT Example 1

Figure 5:
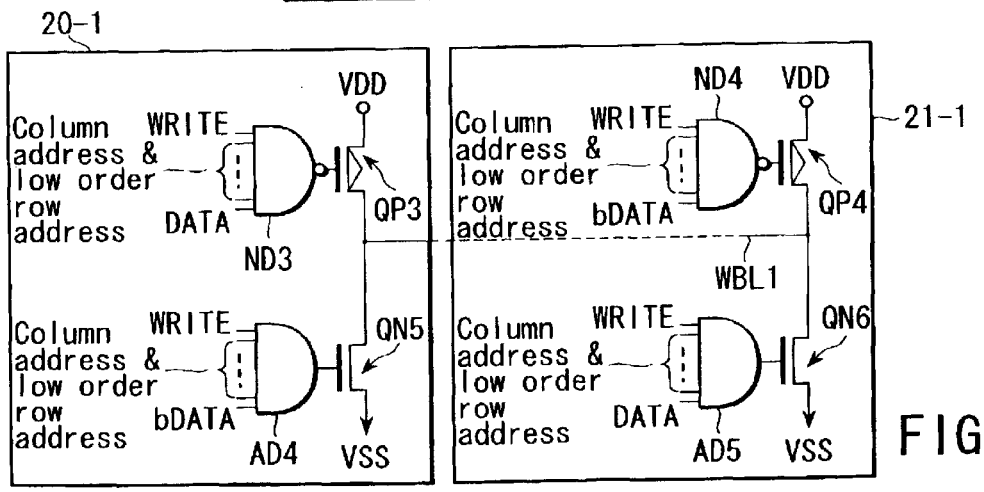
FIG. 5 is a view showing Circuit Example 1 of a write bit line driver/sinker according to the first embodiment of the present invention.

FIG. 5 shows Circuit Example 1 of the write bit line driver/sinker according to the first embodiment of the present invention.

A write bit line driver/sinker 20-1 has a PMOS transistor QP3, NMOS transistor QN5, NAND circuit ND3, and AND circuit AD4.

The PMOS transistor QP3 is connected between the power supply terminal VDD and one end of the write bit line WBL1. The output signal from the NAND circuit ND3 is supplied to the gate of the PMOS transistor QP3.

The NMOS transistor QN5 is connected between one end of the write bit line WBL1 and the ground terminal VSS. The output signal from the AND circuit AD4 is supplied to the gate of the NMOS transistor QN5.

The write signal WRITE, the column address signal, the low order row address signal, and a data signal DATA are input to the NAND circuit ND3. The write signal WRITE, the column address signal, the low order row address signal, and an inverted signal bDATA of the data signal DATA are input to the AND circuit AD4.

A write bit line driver/sinker 21-1 has a PMOS transistor QP4, NMOS transistor QN6, NAND circuit ND4, and AND circuit AD5.

The PMOS transistor QP4 is connected between the power supply terminal VDD and one end of the write bit line WBL1. The output signal from the NAND circuit ND4 is supplied to the gate of the PMOS transistor QP4.

The NMOS transistor QN6 is connected between one end of the write bit line WBL1 and the ground terminal VSS. The output signal from the AND circuit AD5 is supplied to the gate of the NMOS transistor QN6.

The write signal WRITE, column address signal, low order row address signal, and inverted signal bDATA are input to the NAND circuit ND4. The write signal WRITE, column address signal, low order row address signal, and data signal DATA are input to the AND circuit AD5.

Since the direction of the current to be supplied to the write bit line WBL1 must be changed in accordance with write data, the data signal DATA and its inverted signal bDATA are used. The address signal contains a column address signal and a row address signal for selecting an MTJ element in the block. Since four cells are present in a block in the example show in FIG. 1, the address signal is formed from 2 bits.

In Circuit Example 1, a data write is executed in the following way.

In the write mode, the PMOS transistor QP3 serving as the driver and the NMOS transistor QN6 serving as the sinker of the selected column address signal are turned on by the column decoder to supply a current to the selected write bit line WBL1. Alternatively, the PMOS transistor QP4 serving as the driver and the NMOS transistor QN5 serving as the sinker of the selected column address signal are turned on by the column decoder to supply a current to the selected write bit line WBL1.

In the write mode, since PMOS transistors serving as the drivers and NMOS transistors serving as the sinkers of unselected write bit lines WBL are OFF, no currents flow to the unselected write bit lines WBL.

In Circuit Example 1, the same signals as those of the write word line driver/sinker shown in FIG. 3 are used. However, other signals may be used to shift the timing from that of the write word line WL.

② CIRCUIT Example 2

Figure 6:
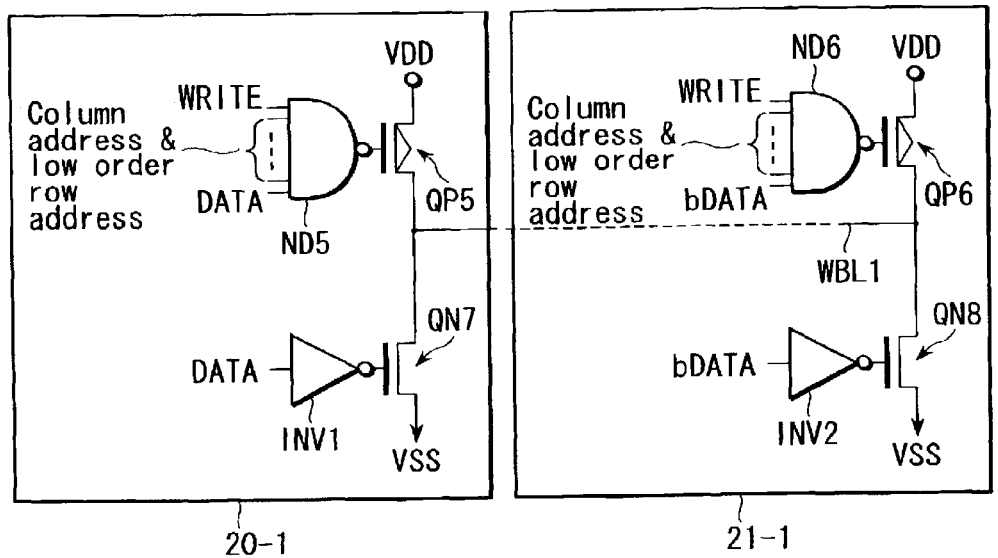
FIG. 6 is a view showing Circuit Example 2 of the write bit line driver/sinker according to the first embodiment of the present invention.

FIG. 6 shows Circuit Example 2 of the write bit line driver/sinker according to the first embodiment of the present invention.

In Circuit Example 2, only one of the sinker and driver needs to have address selectivity. For this reason, the circuit scale is reduced by omitting the decoder on the sinker side.

Since Circuit Example 2 is different from Circuit Example 1 in the arrangement on the sinker side, the arrangement on the driver side will be only briefly described.

The write bit line driver/sinker 20-1 has a PMOS transistor QP5, NMOS transistor QN7, NAND circuit ND5, and inverter INV1.

The NMOS transistor QN7 is connected between one end of the write bit line WBL1 and the ground terminal VSS. The output signal from the inverter INV1 is supplied to the gate of the NMOS transistor QN7. The data signal DATA is input to the inverter INV1.

The write bit line driver/sinker 21-1 has a PMOS transistor QP6, NMOS transistor QN8, NAND circuit ND6, and inverter INV2.

The NMOS transistor QN8 is connected between one end of the write bit line WBL1 and the ground terminal VSS. The output signal from the inverter INV1 is supplied to the gate of the NMOS transistor QN8. The inverted signal bDATA of the data signal DATA is input to the inverter INV2.

In Circuit Example 2, a data write is executed in the following way.

In the write mode, the PMOS transistor QP5 serving as the driver and the NMOS transistor QN8 serving as the sinker of the selected column address signal are turned on by the column decoder to supply a current to the selected write bit line WBL1. Alternatively, the PMOS transistor QP6 serving as the driver and the NMOS transistor QN7 serving as the sinker of the selected column address signal are turned on to supply a current to the selected write bit line WBL1.

In the write mode, since PMOS transistors serving as the drivers and NMOS transistors serving as the sinkers of unselected write bit lines WBL are OFF, no currents flow to the unselected write bit lines WBL.

③ CIRCUIT Example 3

Figure 7:
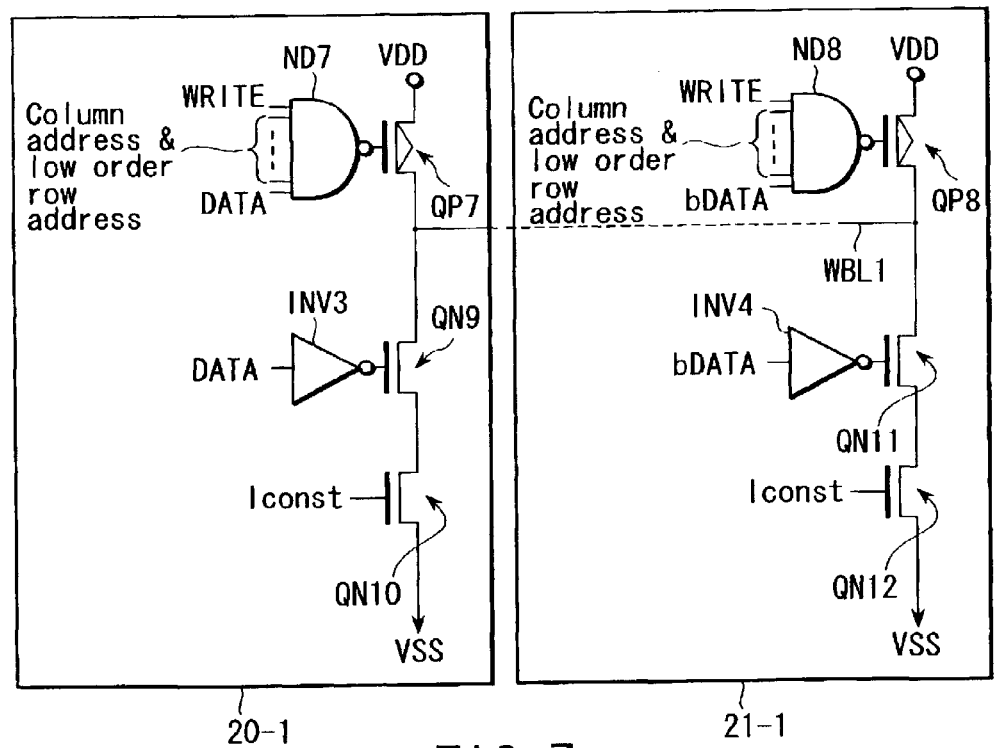
FIG. 7 is a view showing Circuit Example 3 of the write bit line driver/sinker according to the first embodiment of the present invention.

FIG. 7 shows Circuit Example 3 of the write bit line driver/sinker according to the first embodiment of the present invention.

In Circuit Example 3, only one of the sinker and driver needs to have address selectivity. For this reason, the circuit scale is reduced by omitting the decoder on the sinker side. In addition, the dependence on the power supply voltage is eliminated, and the dependence on the temperature is eliminated. Alternatively, a current source circuit is arranged to supply a current in the write mode such that dependence on the temperature can be obtained in correspondence with the switching characteristics of MTJ elements. The output (Iconst) from the current supply circuit is input to the gate to operate in the saturation condition, thereby forming a current mirror for the current output from the current source.

Since Circuit Example 3 is different from Circuit Example 1 in the arrangement on the sinker side, the arrangement on the driver side will be only briefly described.

The write bit line driver/sinker 20-1 has a PMOS transistor QP7, NMOS transistors QN9 and QN10, NAND circuit ND7, and inverter INV3.

The NMOS transistors QN9 and QN10 are connected between one end of the write bit line WBL1 and the ground terminal VSS. The output signal from the inverter INV3 is supplied to the gate of the NMOS transistor QN9. The data signal DATA is input to the inverter INV3. A predetermined voltage (Iconst) is supplied to the gate of the NMOS transistor QN10.

The write bit line driver/sinker 21-1 has a PMOS transistor QP8, NMOS transistors QN11 and QN12, NAND circuit ND8, and inverter INV4.

The NMOS transistors QN11 and QN12 are connected between one end of the write bit line WBL1 and the ground terminal VSS. The output signal from the inverter INV4 is supplied to the gate of the NMOS transistor QN11. The inverted signal bDATA is input to the inverter INV4. A predetermined voltage (Iconst) is supplied to the gate of the NMOS transistor QN12.

In Circuit Example 3, a data write is executed in the following way.

In the write mode, the PMOS transistor QP7 serving as the driver and the NMOS transistors QN11 and QN12 serving as the sinkers of the selected column address signal are turned on by the column decoder to supply a current to the selected write bit line WBL1. Alternatively, the PMOS transistor QP8 serving as the driver and the NMOS transistors QN9 and QN10 serving as the sinkers of the selected column address signal are turned on to supply a current to the selected write bit line WBL1.

In the write mode, since PMOS transistors serving as the drivers and NMOS transistors serving as the sinkers of unselected write bit lines WBL are OFF, no currents flow to the unselected write bit lines WBL.

In Circuit Example 3, the same signals as those of the write word line driver/sinker shown in FIG. 3 are used. However, other signals may be used to shift the timing from that of the write word line WL (Japanese Patent Application No. 2002-140499).

(3) Block Select Driver

Figure 8:
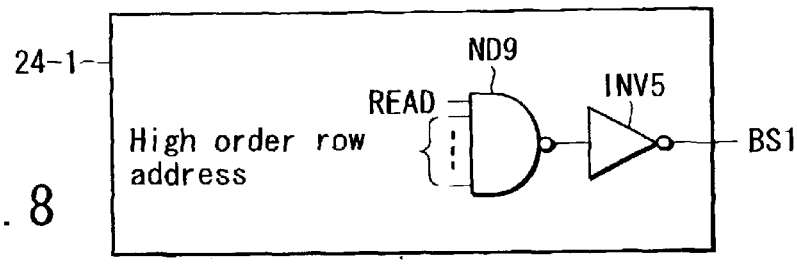
FIG. 8 is a view showing a circuit example of a block select driver according to the first embodiment of the present invention.

FIG. 8 shows a circuit example of the block select driver according to the first embodiment of the present invention.

A block select driver 24-1 has a NAND circuit ND9 and inverter INV5.

The output signal from the NAND circuit ND9 is supplied to the inverter INV5. The inverter INV5 is connected to the block select line BS1. The write signal WRITE and high order row address signal are input to the NAND circuit ND9.

In the block select driver 24-1, decoding is performed on the basis of only high order address bits of the row address signal except low order address signal bits that are necessary for discriminating a cell in the block. In the example shown in FIG. 1, four cells are present in a block. Hence, of the total row address signal bits, address signal bits except two bits are input.

The block select signal is unnecessary in the write mode.

(4) Bias Circuit, Column Select Switch, and Sense Amplifier

Figure 9:
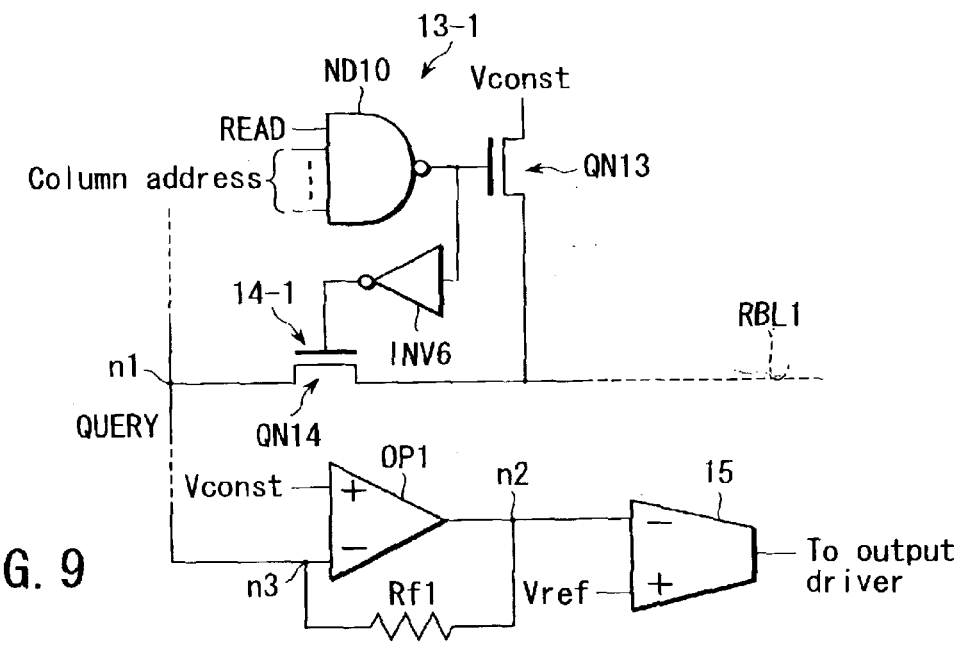
FIG. 9 is a view showing a circuit example of a bias circuit, column select switch, and sense amplifier according to the first embodiment of the present invention.

FIG. 9 shows a circuit example of the bias circuit, column select switch, and sense amplifier according to the first embodiment of the present invention.

A bias circuit 13-1, a column select switch 14-1, and the sense amplifier 15 have NMOS transistors QN13 and QN14, a NAND circuit ND10, an inverter INV6, an operational amplifier OP1, a feedback resistor Rf1, and the sense amplifier (differential amplifier in FIG. 9) 15.

The NMOS transistor QN14 serving as the column select switch 14-1 is connected between a node n1 and one end of the read bit line RBL1. The output signal from the inverter INV6 is input to the gate of the NMOS transistor QN14. The output signal from the NAND circuit ND10 is input to the inverter INV6. The read signal READ and column address signal are input to the NAND circuit ND10.

One terminal of the NMOS transistor QN13 is connected to one end of the read bit line RBL1. The other terminal of the NMOS transistor QN13 is biased to a predetermined potential (Vconst). The output signal from the NAND circuit ND10 is supplied to the gate of the NMOS transistor QN13.

The negative input terminal of the operational amplifier OP1 is connected to the node n1. The output terminal of the operational amplifier OP1 is connected to a node n2. A predetermined potential (Vconst) is supplied to the positive input terminal. The feedback resistor Rf1 is connected between the node n2 and the node n3. The arrangement of the operational amplifier OP1 will be described later.

The negative input terminal of the sense amplifier (differential amplifier) 15 is connected to the node n2. The output terminal of the sense amplifier 15 is connected to the output driver. A reference potential Vref is supplied to the positive input terminal. The reference potential Vref is an intermediate potential generated in the device such that it has a value between the output potential of the operational amplifier OP1 for "1"-data and the output potential of the operational amplifier OP1 for "0"-data. The arrangements of the sense amplifier (differential amplifier) 15 and a reference potential Vref generation circuit will be described later.

In this circuit example, a data read is executed in the following way.

In the read mode, the NMOS transistor QN14 serving as the column select switch of the selected column address signal is turned on by the column decoder to connect the selected read bit line RBL1 to the sense amplifier 15. The selected read bit line RBL1 is biased to the predetermined potential (Vconst) by feedback of the operational amplifier OP1. The output signal from the operational amplifier OP1 is amplified by the sense amplifier (differential amplifier) 15 on the output side and sent to the output driver.

Unselected read bit lines RBLj are biased to the predetermined potential (Vconst) by the bias circuits 13-j. Hence, when the selected bit line BL and unselected bit lines BL are biased to an equipotential, the roundabout current can be eliminated.

Figure 10:
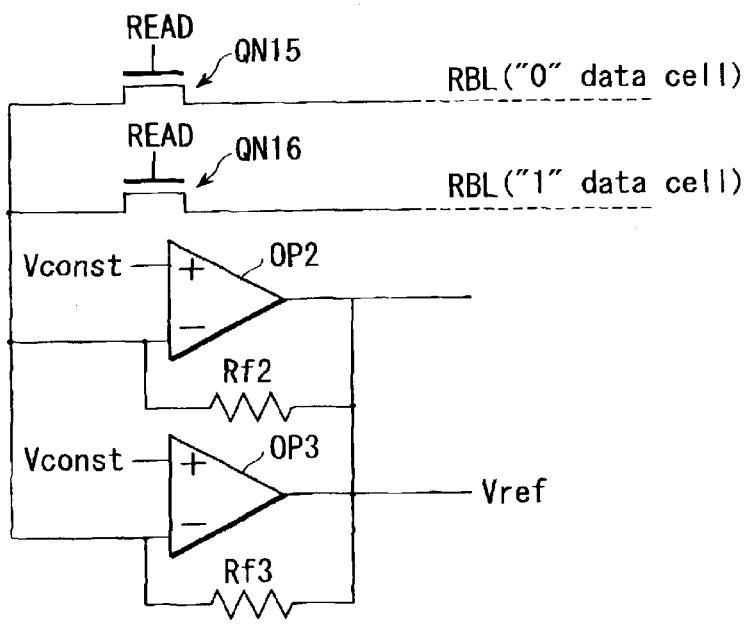
FIG. 10 is a view showing a circuit example of a reference potential generation circuit according to the first embodiment of the present invention.

FIG. 10 shows a circuit example of a reference potential generation circuit according to the first embodiment of the present invention.

The parameters and layout of the operational amplifier, feedback resistor, select switch, and the like are the same as those of the operational amplifier, feedback resistor, and select switch for the data read shown in FIG. 9 as much as possible. This is because the parasitic resistances and parasitic capacitances must not change.

Generation of the reference potential for the sense amplifier (differential amplifier) 15 will be described below.

Let Rf be the feedback resistance, R0 be the resistance for "0"-data, and R1 be the resistance for "1"-data. The resistances of MOS transistors are neglected. Let V0 and V1 be the operational amplifier outputs for "0"- and "1"-data, respectively.

When an operational amplifier OP is operated to make the positive and negative inputs have an equipotential, relations (9), (10), and (11) below hold.

$$Vconst/R0=(V0-Vconst)/Rf \to V0=(1+Rf/R0)\cdot Vconst \quad (9)$$

$$Vconst/R1=(V1-Vconst)/Rf \to V1=(1+Rf/R1)\cdot Vconst \quad (10)$$

$$Vconst\cdot(1/R0+1/R1)=2\cdot(Vref-Vconst)/Rf \to Vref=\{1+(Rf/R0+Rf/R1)/2\}\cdot Vconst \quad (11)$$

Equation (12) can be derived from relations (9), (10), and (11).

$$Vref=(V0+V1)/2 \quad (12)$$

The reference potential may be generated by a method proposed in Japanese Patent Application No. 2001-401850 or 2002-176683.

Figure 11:
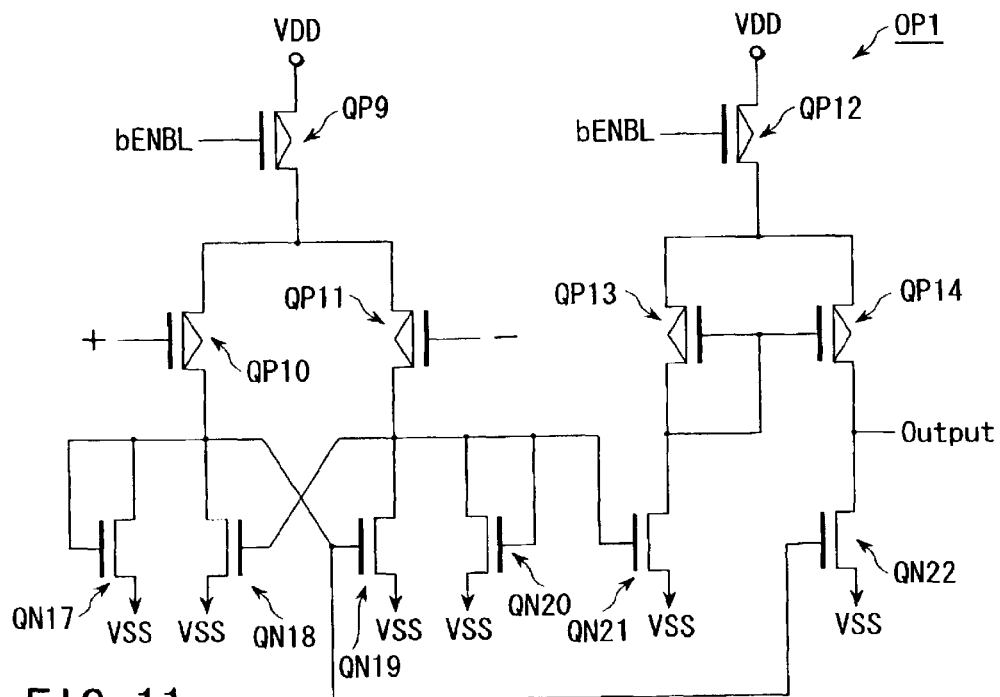
FIG. 11 is a view showing a circuit example of an operational amplifier according to the first embodiment of the present invention.

FIG. 11 shows a circuit example of the operational amplifier according to the first embodiment of the present invention.

The operational amplifier has PMOS transistors QP9, QP10, QP11, QP12, QP13, and QP14 and NMOS transistors QN17, QN18, QN19, QN20, QN21, and QN22.

In this circuit example, when an inverted signal bENBL of an enable signal ENBL changes to "L" level, the operational amplifier OP1 is set in an operative state. Before and after the word line WL and column select switch are activated, the inverted signal bENBL is changed to "L" level to set the operational amplifier OP1 in the operative state.

Figure 12:
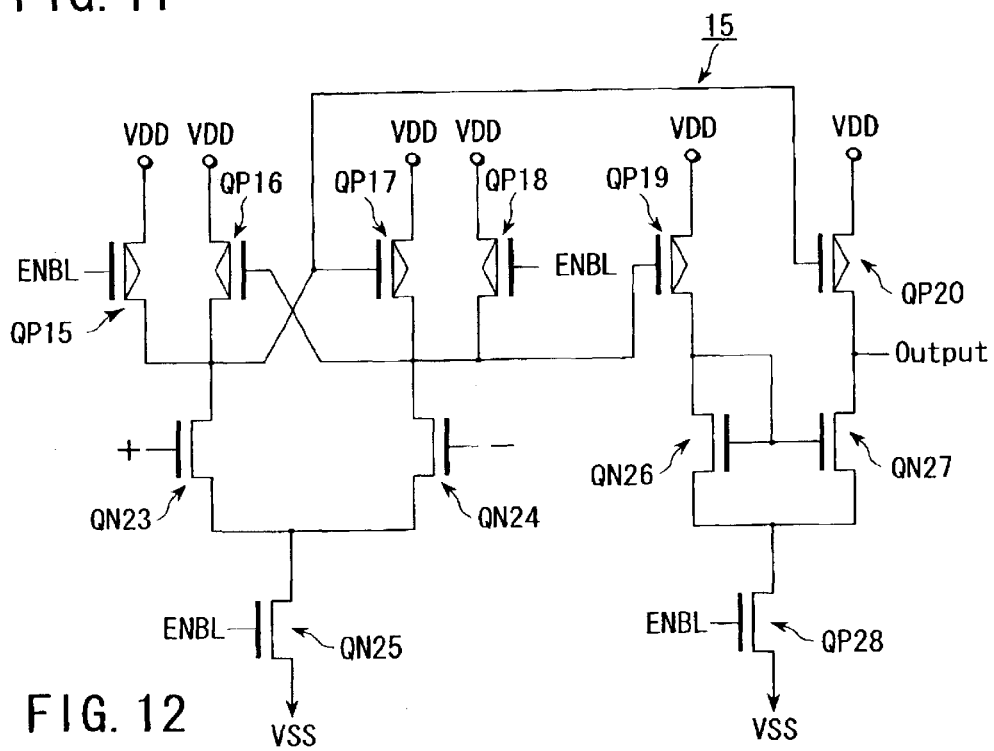
FIG. 12 is a view showing a circuit example of a differential amplifier according to the first embodiment of the present invention.

FIG. 12 is a view showing a circuit example of the differential amplifier according to the first embodiment of the present invention.

The differential amplifier 15 has PMOS transistors QP15, QP16, QP17, QP18, QP19, and QP20 and NMOS transistors QN23, QN24, QN25, QN26, QN27, and QN28.

In this circuit example, when the enable signal ENBL changes to "H" level, the differential amplifier is set in an operative state. After the word line WL, column select switch, and operational amplifier OP1 are activated, and the output from the operational amplifier OP1 stabilizes, the enable signal ENBL is changed to "H" level.

D. Device Structure of Memory Cell Portion

The device structure of the memory cell portion will be described next. The device structure of the block BK11 shown in FIG. 1 will be exemplified.

Figure 13:
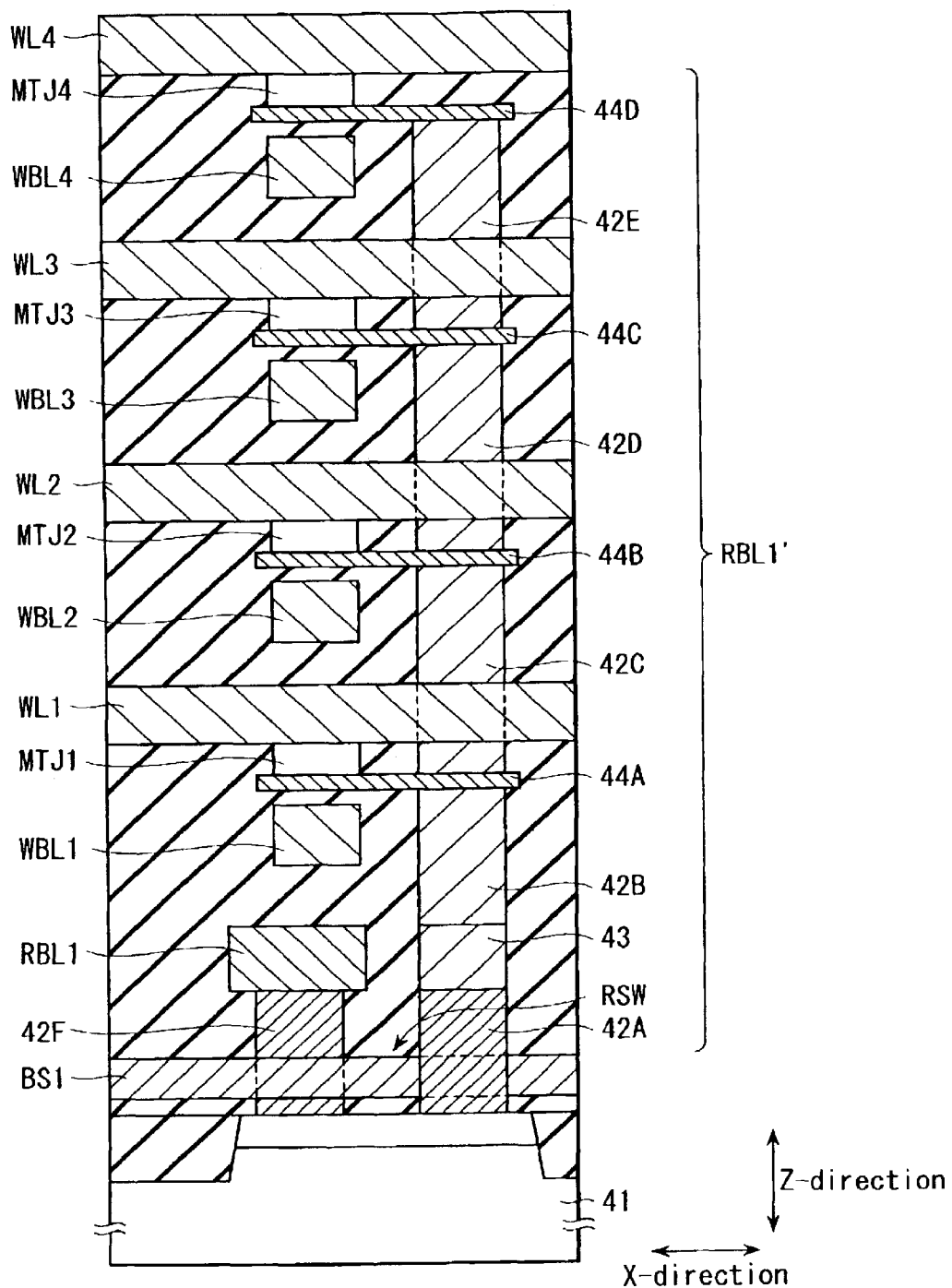
FIG. 13 is a sectional view showing Structural Example 1 of the magnetic random access memory according to the first embodiment of the present invention in the X-direction.
Figure 14:
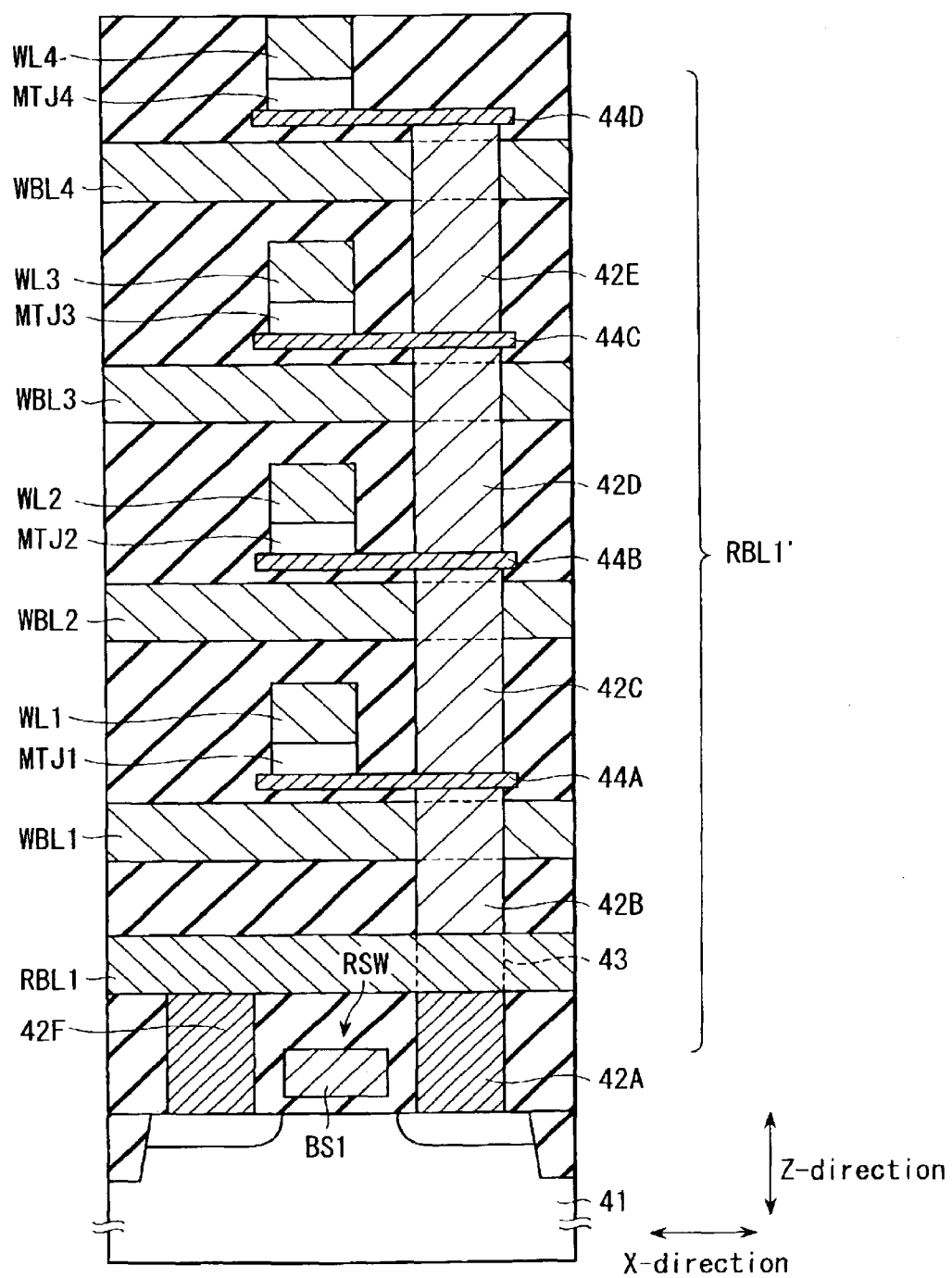
FIG. 14 is a sectional view showing Structural Example 1 of the magnetic random access memory according to the first embodiment of the present invention in the Y-direction.
Figure 15:
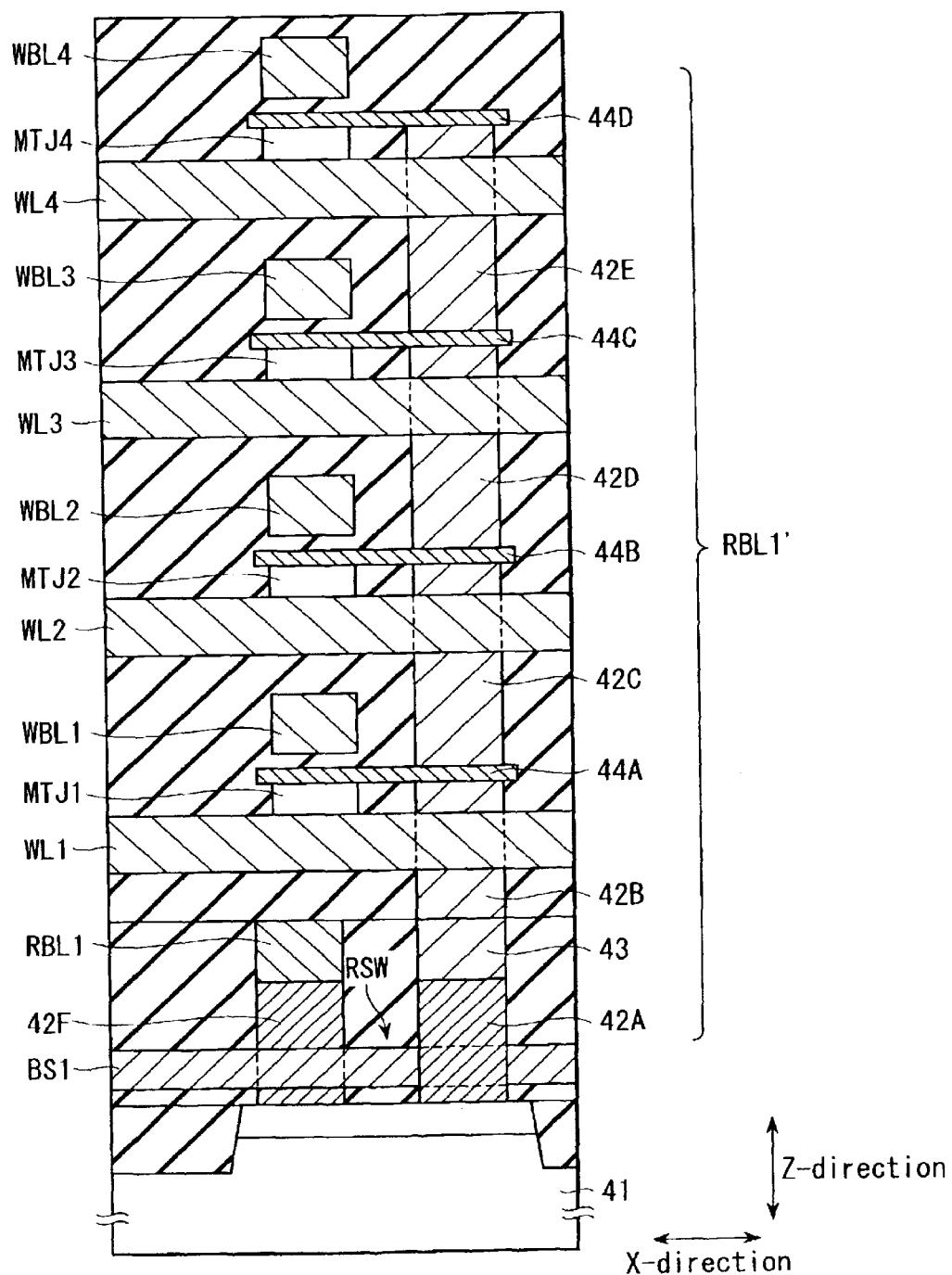
FIG. 15 is a sectional view showing Structural Example 2 of the magnetic random access memory according to the first embodiment of the present invention in the X-direction.
Figure 16:
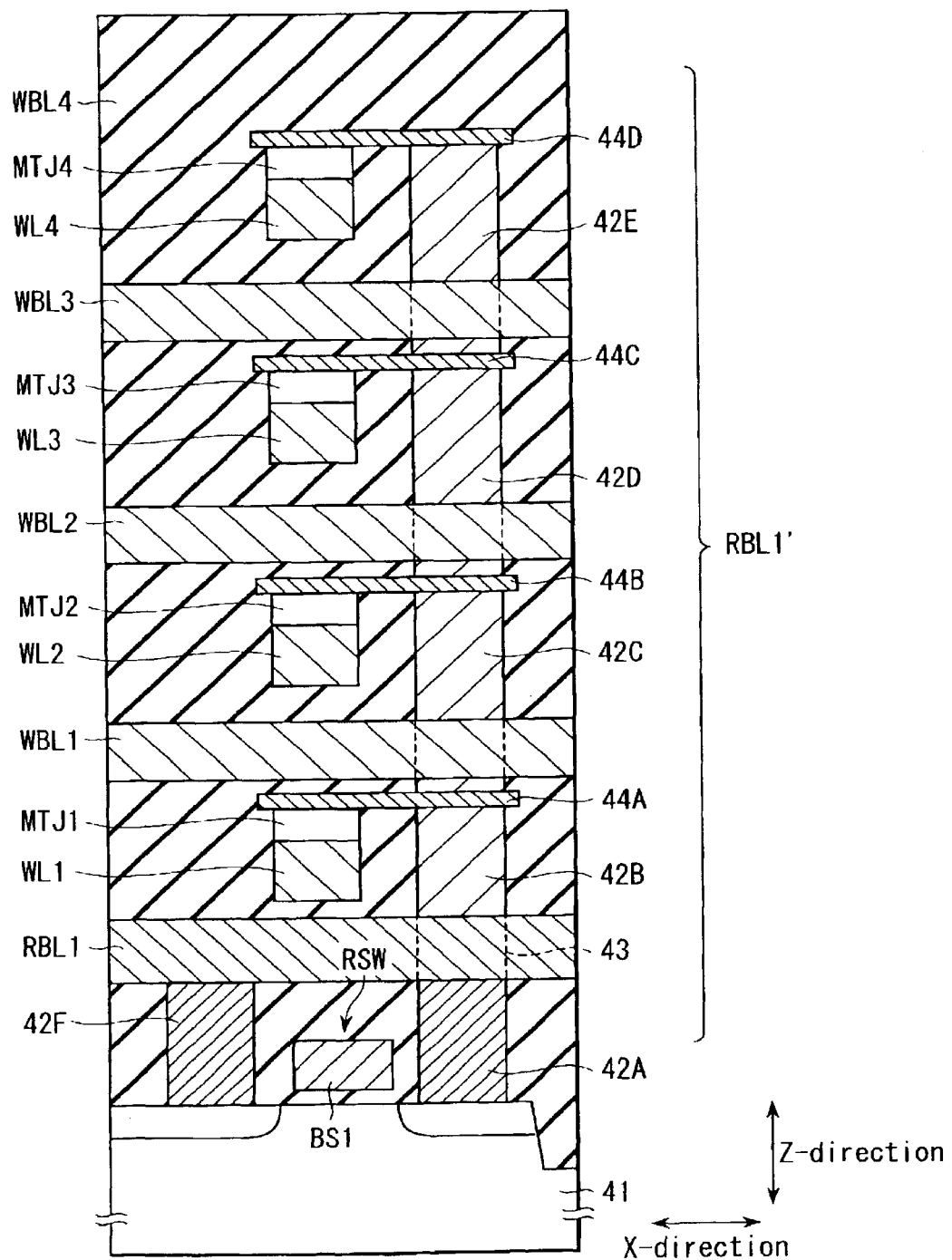
FIG. 16 is a sectional view showing Structural Example 2 of the magnetic random access memory according to the first embodiment of the present invention in the Y-direction.
Figure 17:
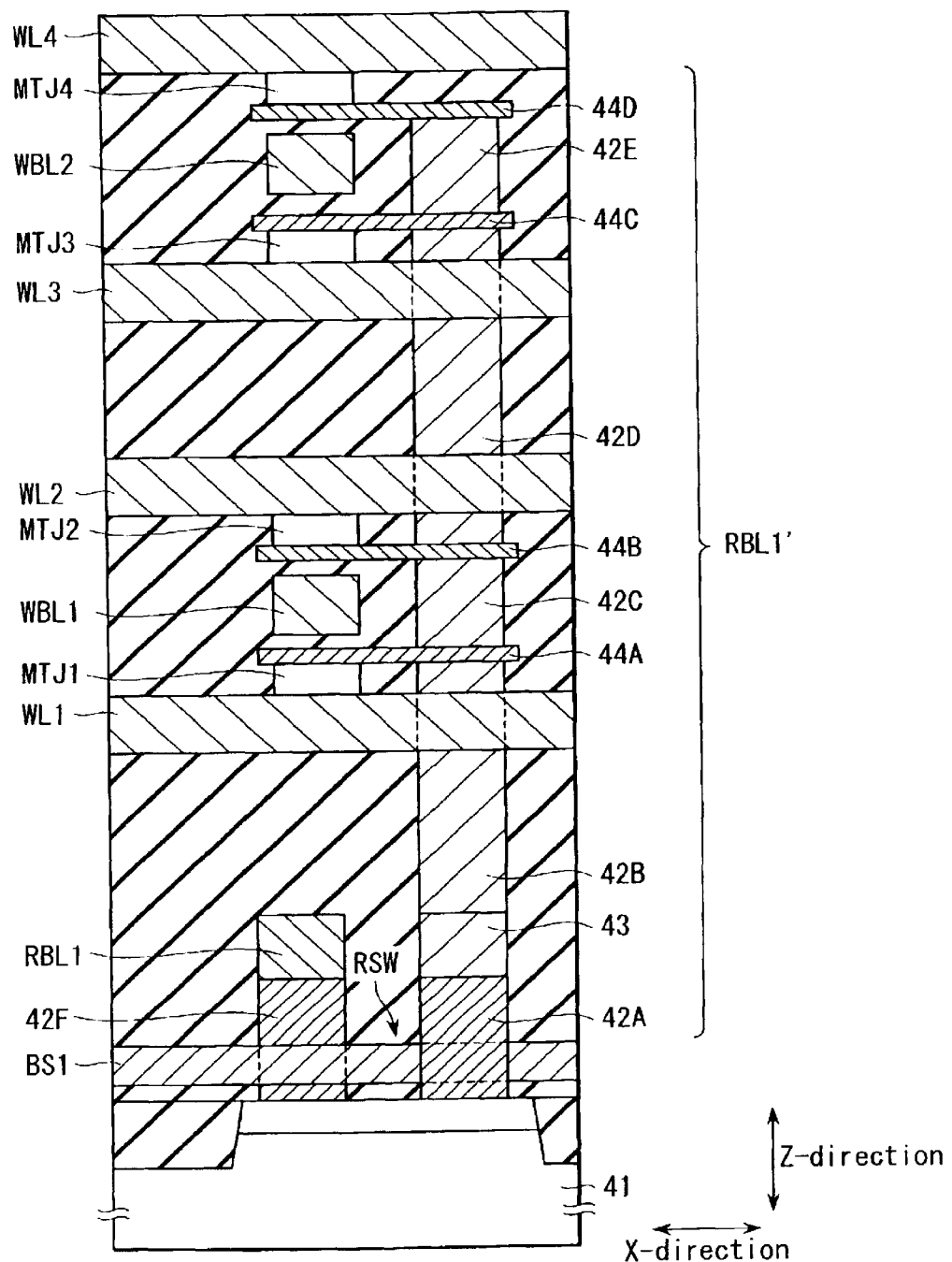
FIG. 17 is a sectional view showing Structural Example 3 of the magnetic random access memory according to the first embodiment of the present invention in the X-direction.
Figure 18:
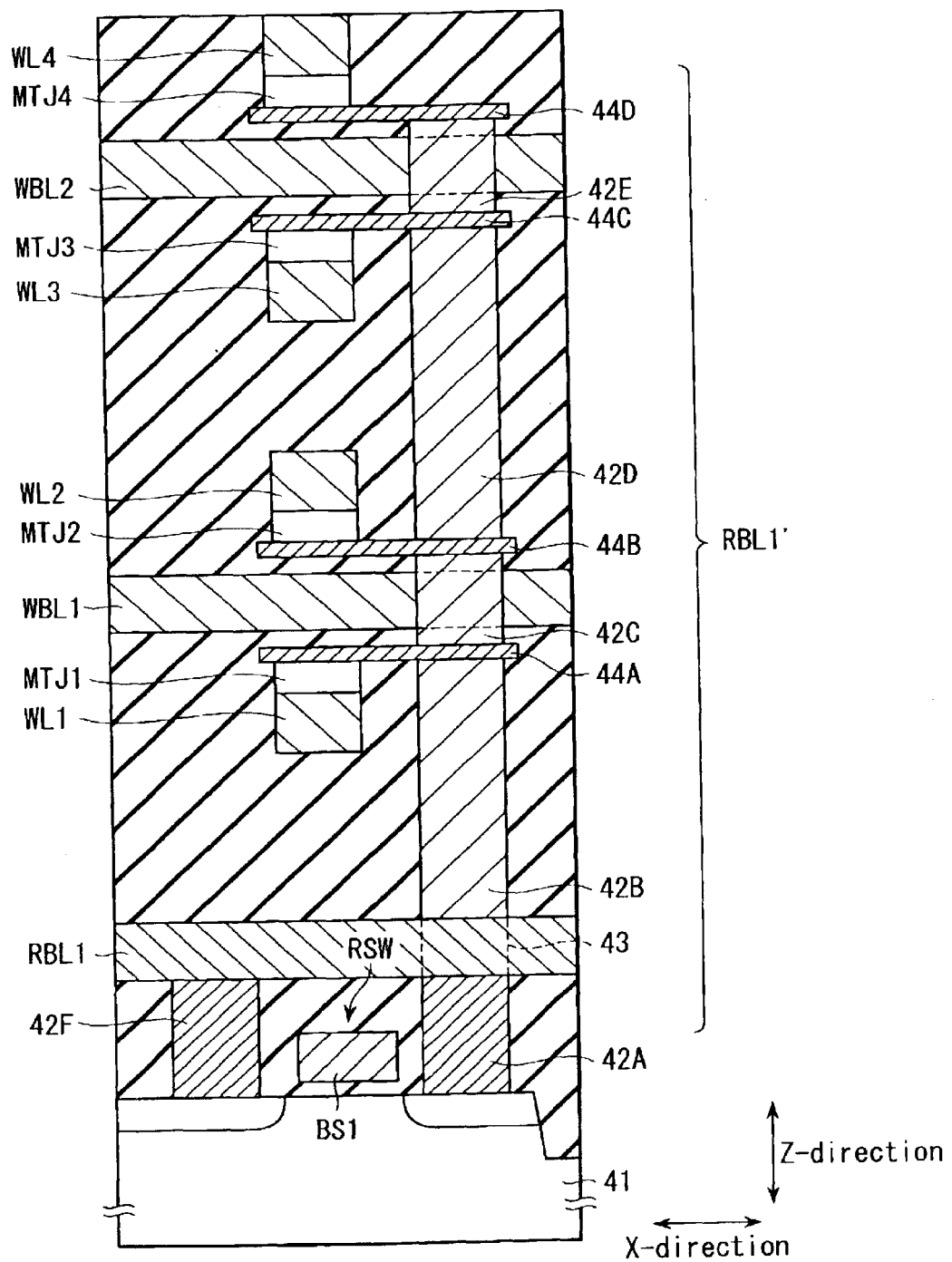
FIG. 18 is a sectional view showing Structural Example 3 of the magnetic random access memory according to the first embodiment of the present invention in the Y-direction.

FIGS. 13, 15, and 17 show the X-direction section of one block of the magnetic random access memory. FIGS. 14, 16, and 18 show the Y-direction section of one block of the magnetic random access memory. The same reference numerals as in FIG. 1 denote the same elements in FIGS. 13 to 18 to show the correspondence between them.

(1) Structure of Memory Cell Portion
① STRUCTURAL Example 1

FIGS. 13 and 14 are sectional views showing Structural Example 1 of the magnetic random access memory according to the first embodiment of the present invention.

The read select switch (MOS transistor) RSW is arranged in the surface region of a semiconductor substrate 41.

The source of the read select switch RSW is connected to the read bit line RBL1 through a contact plug 42F. The read bit line RBL1 runs straight in, e.g., the Y-direction (column direction) and is connected to the sense amplifier 15 through the bias circuit 13-1 and column select switch 14-1 formed around the memory cell array region.

The gate of the read select switch (MOS transistor) RSW serves as the block select line BS1. The block select line BS1 runs in the X-direction.

The four MTJ elements MTJ1, MTJ2, MTJ3, and MTJ4 are stacked in a plurality of stages on the read select switch RSW. That is, the read select switch RSW is arranged immediately under the MTJ elements MTJ1, MTJ2, MTJ3, and MTJ4.

One terminal (lower end in FIG. 13) of each of the MTJ elements MTJ1, MTJ2, MTJ3, and MTJ4 is connected to a corresponding one of lower electrodes 44A, 44B, 44C, and 44D. Contact plugs 42A, 42B, 42C, 42D, and 42E and intermediate layer 43 electrically connect the lower electrodes 44A, 44B, 44C, and 44D to each other and also electrically connect the lower electrodes 44A, 44B, 44C, and 44D to the drain of the read select switch RSW.

The lower electrodes 44A, 44B, 44C, and 44D, contact plugs 42A, 42B, 42C, 42D, and 42E, and intermediate layer 43 form the read sub bit line RBLi'. Hence, the read sub bit line RBLi' is formed from the contact plugs 42A, 42B, 42C, 42D, and 42E and the like, which extend perpendicularly to the surface of the semiconductor substrate 41 while overlapping each other.

The other terminal (upper end in FIG. 13) of the MTJ elements MTJ1, MTJ2, MTJ3, and MTJ4 is electrically connected to a corresponding one of read/write word lines WL1, WL2, WL3, and WL4. The word lines WL1, WL2, WL3, and WL4 run in the X-direction (row direction).

The MTJ elements MTJ1, MTJ2, MTJ3, and MTJ4 are independently connected to the word lines WL1, WL2, WL3, and WL4. That is, the four word lines WL1, WL2, WL3, and WL4 are arranged in correspondence with the four MTJ elements MTJ1, MTJ2, MTJ3, and MTJ4.

Write bit lines WBL1, WBL2, WBL3, and WBL4 are arranged near and immediately under the MTJ elements MTJ1, MTJ2, MTJ3, and MTJ4, respectively, while being separated from them. The write bit lines WBL1, WBL2, WBL3, and WBL4 run in the Y-direction (column direction). In this embodiment, the four write bit lines WBL1, WBL2, WBL3, and WBL4 are arranged in correspondence with the four MTJ elements MTJ1, MTJ2, MTJ3, and MTJ4.

In Structural Example 1, the lower electrodes 44A, 44B, 44C, and 44D, write bit lines WBL1, WBL2, WBL3, and WBL4, and read/write word lines WL1, WL2, WL3, and WL4 are arranged in the plurality of stages of stacked MTJ elements MTJ1, MTJ2, MTJ3, and MTJ4, respectively.

These elements are laid out at the same positions in, e.g., the stages of MTJ elements MTJ1, MTJ2, MTJ3, and MTJ4.

Each of the lower electrodes 44A, 44B, 44C, and 44D has, e.g., a rectangular pattern. Contact regions for the contact plugs 42A to 42E are formed at part of the lower electrodes. The MTJ elements MTJ1, MTJ2, MTJ3, and MTJ4 are arranged at portions other than the contact region of the lower electrodes 44A, 44B, 44C, and 44D.

The MTJ elements MTJ1, MTJ2, MTJ3, and MTJ4 are arranged at the intersections between the write bit lines WBL1, WBL2, WBL3, and WBL4 and the read/write word lines WL1, WL2, WL3, and WL4.

According to Structural Example 1, the plurality of MTJ elements MTJ1, MTJ2, MTJ3, and MTJ4 in a block are stacked in a plurality of stages on the semiconductor substrate 41. The plurality of MTJ elements MTJ1, MTJ2, MTJ3, and MTJ4 share one read select switch RSW. For this reason, the capacity can be increased while suppressing any increase in cell area.

② STRUCTURAL Example 2

FIGS. 15 and 16 are sectional views showing Structural Example 2 of the magnetic random access memory according to the first embodiment of the present invention. A portion different from Structural Example 1 will be described.

Structural Example 2 is different from Structural Example 1 in that the read/write word lines WL1, WL2, WL3, and WL4 which run in the X-direction are respectively arranged under the MTJ elements MTJ1, MTJ2, MTJ3, and MTJ4, and the write bit lines WBL1, WBL2, WBL3, and WBL4 which run in the Y-direction are respectively arranged on the MTJ elements MTJ1, MTJ2, MTJ3, and MTJ4.

That is, in Structural Example 1, the write bit lines WBL1, WBL2, WBL3, and WBL4 are arranged on the semiconductor substrate 41 sides (lower sides of the MTJ elements in FIGS. 13 and 14), where the read select switch RSW is present, of the MTJ elements MTJ1, MTJ2, MTJ3, and MTJ4. In addition, the word lines WL1, WL2, WL3, and WL4 are arranged on the opposite sides (upper sides of the MTJ elements in FIGS. 13 and 14).

In Structural Example 2, however, the word lines WL1, WL2, WL3, and WL4 are arranged on the semiconductor substrate 41 sides (lower sides of the MTJ elements in FIGS. 15 and 16), where the read select switch RSW is present, of the MTJ elements MTJ1, MTJ2, MTJ3, and MTJ4. In addition, the write bit lines WBL1, WBL2, WBL3, and WBL4 are arranged on the opposite sides (upper sides of the MTJ elements in FIGS. 15 and 16).

According to Structural Example 2, the same effect as that of Structural Example 1 can be obtained.

③ STRUCTURAL Example 3

FIGS. 17 and 18 are sectional views showing Structural Example 3 of the magnetic random access memory according to the first embodiment of the present invention. A portion different from Structural Example 1 will be described.

Structural Example 3 is different from Structural Example 1 in that a plurality of MTJ elements (upper MTJ element and lower MTJ element) share one write bit line. That is, the write bit line WBL1 is arranged between the MTJ elements MTJ1 and MTJ2. The MTJ element MTJ1 and MTJ2 share the write bit line WBL1. In addition, the write bit line WBL2 is arranged between the MTJ elements MTJ3 and MTJ4. The MTJ element MTJ3 and MTJ4 share the write bit line WBL2.

According to Structural Example 3, the same effect as that of Structural Example 1 can be obtained.

In addition, since the plurality of MTJ elements (upper MTJ element and lower MTJ element) share one write bit line, the volume of the memory cell in the stacking direction (Z-direction) can be reduced.

(2) Structure of MTJ Element

The structure of the MTJ element will be described next.

The MTJ element 12 has a three-layered structure formed from a magnetized fixed layer (magnetic layer) 31, tunneling barrier layer (nonmagnetic layer) 32, and magnetic recording layer (magnetic layer) 33.

The MTJ element 12 has, e.g., a rectangular shape. The longitudinal direction of the rectangle is the axis of easy magnetization, and the direction perpendicular to the longitudinal direction is the axis of hard magnetization. The axis of easy magnetization of the MTJ element 12 is aligned to the direction perpendicular to the running direction of the write lines through which a current flows in both directions such that the direction of the current can be changed in accordance with write data.

In this embodiment, the write line through which the write current can be supplied in both directions is the write bit line WBL. For this reason, the axis of easy magnetization of the MTJ element 12 is aligned to the direction perpendicular to the running direction of the write bit line WBL, i.e., in the running direction of the word line (row direction).

The magnetized fixed layer 31 and magnetic recording layer 33 may be replaced. The MTJ element 12 may have either a single tunnel junction structure having one tunneling barrier layer 32 or a double tunnel junction structure having two tunneling barrier layers 32.

Examples of the MTJ elements 12 having single and double tunnel junction structures will be described below.

① Single Tunnel Junction Structure

Figure 19A:
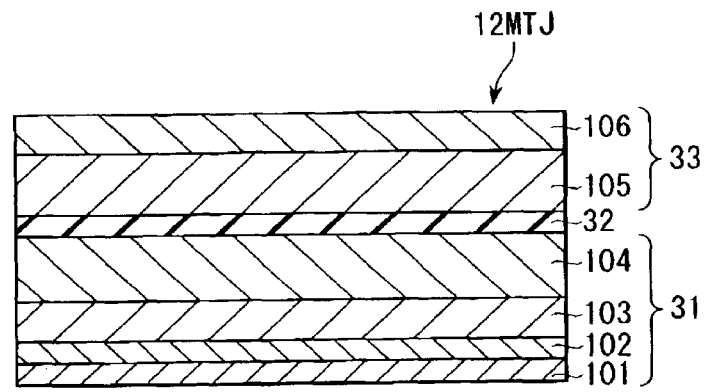
FIGS. 19A and 19B are sectional views showing an MTJ element having a single tunnel junction structure according to the first embodiment of the present invention.

The MTJ element 12 having a single tunnel junction structure shown in FIG. 19A is formed from the magnetized fixed layer 31 in which an underlying contact layer (underlying electrode layer) 101, buffer layer (e.g., a ferromagnetic layer) 102, antiferromagnetic layer 103, and ferromagnetic layer 104 are sequentially stacked, the tunneling barrier layer 32 formed on the magnetized fixed layer 31, and the magnetic recording layer 33 in which a free ferromagnetic layer 105 and contact layer 106 are sequentially stacked on the tunneling barrier layer 32.

Figure 19B:
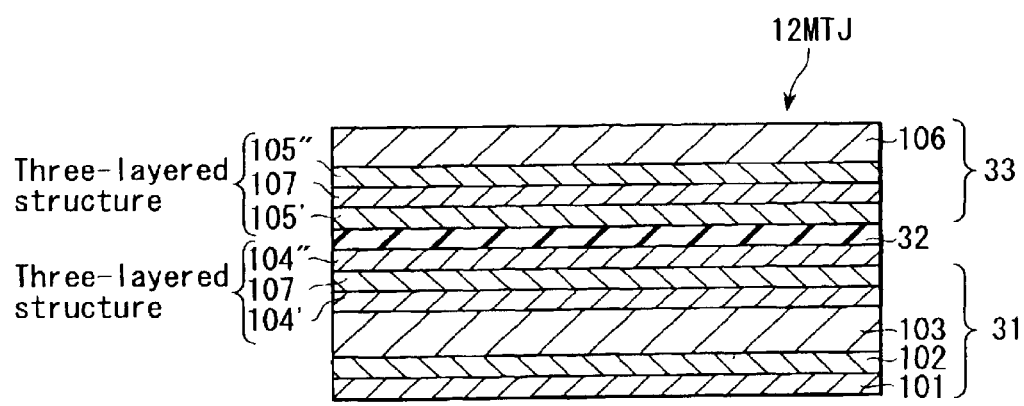

The MTJ element 12 having a single tunnel junction structure shown in FIG. 19B is formed from the magnetized fixed layer 31 in which the underlying contact layer 101, the buffer layer 102, the antiferromagnetic layer 103, a ferromagnetic layer 104', a nonmagnetic layer 107, and a ferromagnetic layer 104" are sequentially stacked, the tunneling barrier layer 32 formed on the magnetized fixed layer 31, and the magnetic recording layer 33 in which a ferromagnetic layer 105', the nonmagnetic layer 107, a ferromagnetic layer 105", and the contact layer 106 are sequentially stacked on the tunneling barrier layer 32.

In the MTJ element 12 shown in FIG. 19B, the three-layered structure of the ferromagnetic layer 104', nonmagnetic layer 107, and ferromagnetic layer 104" in the magnetized fixed layer 31 and the three-layered structure of the ferromagnetic layer 105', nonmagnetic layer 107, and ferromagnetic layer 105" in the magnetic recording layer 33 are formed. In this case, a cell structure which can suppress any magnetic pole generation in the ferromagnetic material and is therefore more suitable for micropatterning can be provided, as compared to the MTJ element 12 shown in FIG. 19A.

② Double Tunnel Junction Structure

Figure 20A:
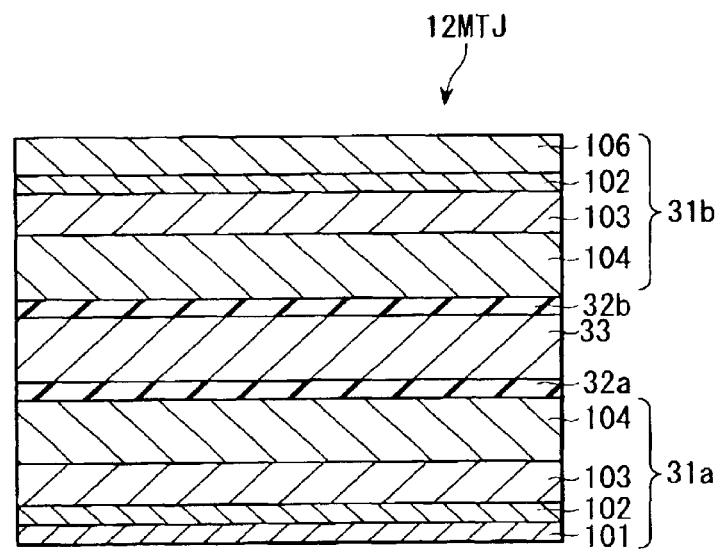
FIGS. 20A and 20B are sectional views showing an MTJ element having a double tunnel junction structure according to the first embodiment of the present invention.

The MTJ element 12 having a double tunnel junction structure shown in FIG. 20A is formed from a first magnetized fixed layer 31a in which the underlying contact layer 101, buffer layer 102, antiferromagnetic layer 103, and ferromagnetic layer 104 are sequentially stacked, a first tunneling barrier layer 32a formed on the first magnetized fixed layer 31a, the magnetic recording layer 33 formed on the first tunneling barrier layer 32a, a second tunneling barrier layer 32b formed on the magnetic recording layer 33, and a second magnetized fixed layer 31b in which the ferromagnetic layer 104, antiferromagnetic layer 103, buffer layer 102, and contact layer 106 are sequentially stacked on the second tunneling barrier layer 32b.

Figure 20B:
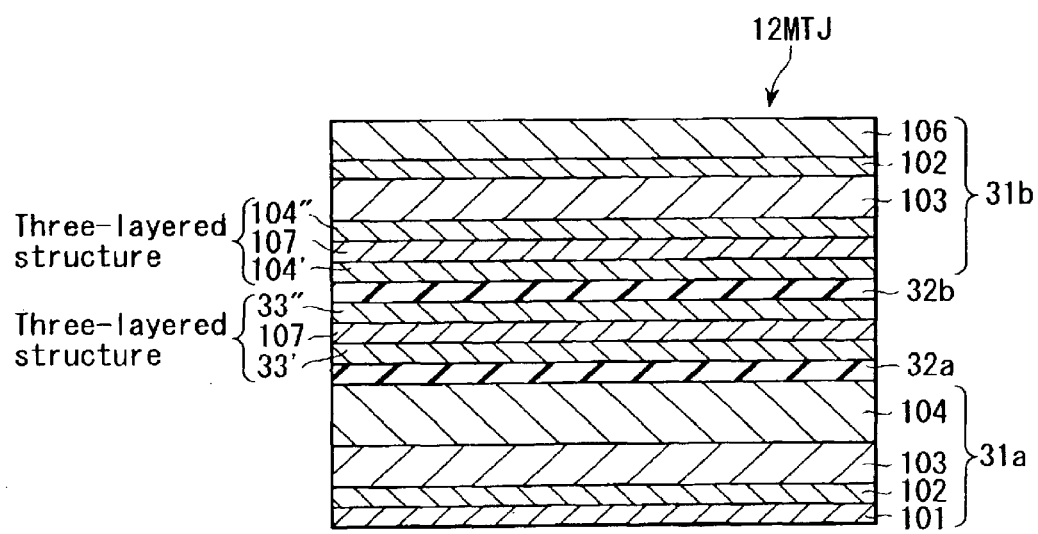

The MTJ element 12 having a double tunnel junction structure shown in FIG. 20B is formed from the first magnetized fixed layer 31a in which the underlying contact layer 101, buffer layer 102 antiferromagnetic layer 103, and ferromagnetic layer 104 are sequentially stacked, the first tunneling barrier layer 32a formed on the first magnetized fixed layer 31a, the magnetic recording layer 33 having a three-layered structure of a ferromagnetic layer 33', the nonmagnetic layer 107, and a ferromagnetic layer 33" which are sequentially stacked on the first tunneling barrier layer 32a, the second tunneling barrier layer 32b formed on the magnetic recording layer 33, and the second magnetized fixed layer 31b in which the ferromagnetic layer 104', nonmagnetic layer 107, ferromagnetic layer 104", antiferromagnetic layer 103, buffer layer 102, and contact layer 106 are sequentially stacked on the second tunneling barrier layer 32b.

In the MTJ element 12 shown in FIG. 20B, the three-layered structure of the ferromagnetic layer 33', nonmagnetic layer 107, and ferromagnetic layer 33" which construct the magnetic recording layer 33 and the three-layered structure of the ferromagnetic layer 104', nonmagnetic layer 107, and ferromagnetic layer 104" in the second magnetized fixed layer 31b are formed. In this case, a cell structure which can suppress any magnetic pole generation in the ferromagnetic material and is therefore more suitable for micropatterning can be provided, as compared to the MTJ element 12 shown in FIG. 20A.

In the MTJ element 12 having the double tunnel junction structure, the decrease of MR (Magneto Resistive) ratio (the ratio of the resistance difference between the antiparallel state and the parallel state to the parallel state resistance value) when the same external bias is applied is smaller than that in the MTJ element 12 having the single tunnel junction structure. Hence, the MTJ element 12 with the double tunnel junction structure can operate at a higher bias. That is, the double tunnel junction structure is advantageous in reading out information from cells.

③ Materials of MTJ Element

The MTJ element 12 having the single tunnel junction structure or double tunnel junction structure is formed using, e.g., the following materials.

For the magnetized fixed layers 31, 31a, and 31b and magnetic recording layer 33, for example, Fe, Co, Ni, or an alloy thereof, magnetite having a high spin polarizability, an oxide such as $CrO_2$ or $RxMnO_{3-y}$ (R: rare earth, X: Ca, Ba, or Sr), or a Heusler alloy such as NiMnSb or PtMnSb is preferably used. These magnetic materials may contain small amounts of nonmagnetic elements such as Ag, Cu, Au, Al, Mg, Si, Bi, Ta, B, C, O, N, Pd, Pt, Zr, Ir, W, Mo, and Nb as long as the ferromagnetism is not lost.

For the antiferromagnetic layer 103 which forms part of the magnetized fixed layer 31, 31a, or 31b, Fe—Mn, Pt—Mn, Pt—Cr—Mn, Ni—Mn, Ir—Mn, NiO, $Fe_2O_3$, or the like is preferably used.

For the tunneling barrier layers 32, 32a, and 32b, various dielectric materials such as $Al_2O_3$, $SiO_2$, MgO, AlN, $Bi_2O_3$, $MgF_2$, $CaF_2$, $SrTiO_2$, and $AlLaO_3$ can be used. These dielectric materials may contain oxygen, nitrogen, or fluorine deficiency.

E. Effects

First, in this embodiment, one read switch element is shared by a plurality of MTJ elements connected in parallel. The plurality of MTJ elements are stacked in a plurality of stages in a direction (vertical direction) perpendicular to the surface of a semiconductor substrate to form one block.

As compared to a structure having a read switch element arranged for each MTJ element, the cell area per bit can be reduced. For this reason, the capacity can be increased without increasing the cell area.

Second, in this embodiment, in the block arrangement, a word line is independently connected to one terminal of each of the plurality of MTJ elements. A read sub bit line is commonly connected to the other terminal of each of the plurality of MTJ elements. The read sub bit line is connected to the read main bit line through the read select switch.

In the read mode, a read current is supplied to all MTJ elements connected to the selected word line. An equipotential is applied from the bias circuit to the read main bit lines on the same row as that of the read block. In the read block, the selected word line is set to the ground potential, and unselected word lines are set in the floating state. With this arrangement, a roundabout read current can be prevented in the blocks on the same row, and any read error can be suppressed.

One read main bit line is arranged for each column. Each read main bit line is shared by the blocks on the same column. Each block has a read select switch. In the read mode, the read select switch of the read block BK is turned on, and the read select switches of unselected blocks BK' on the same column as that of the read block BK are turned off. With this arrangement, even when the read current is supplied to the read main bit line, the read current can be prevented from flowing to the unselected blocks BK'.

The selected word line connected to the selected MTJ element is also connected to unselected MTJ elements on the same row. However, when the selected word line is set to the ground potential, the bias current flowing to the unselected MTJ elements flows not to the selected MTJ element, but the ground point.

As described above, in this embodiment, the number of MTJ elements connected to the read bit line can be substantially reduced. Since a roundabout read current can be suppressed, any read error can be prevented.

[1–2: Second Embodiment]

In the second embodiment, a stacked cell structure is formed by stacking MTJ elements, and a MOS transistor is used as a read switching element, as in the first embodiment. In the second embodiment, however, the read current flowing direction is reversed to that of the first embodiment.

A. Overall Circuit Structure

Figure 21:
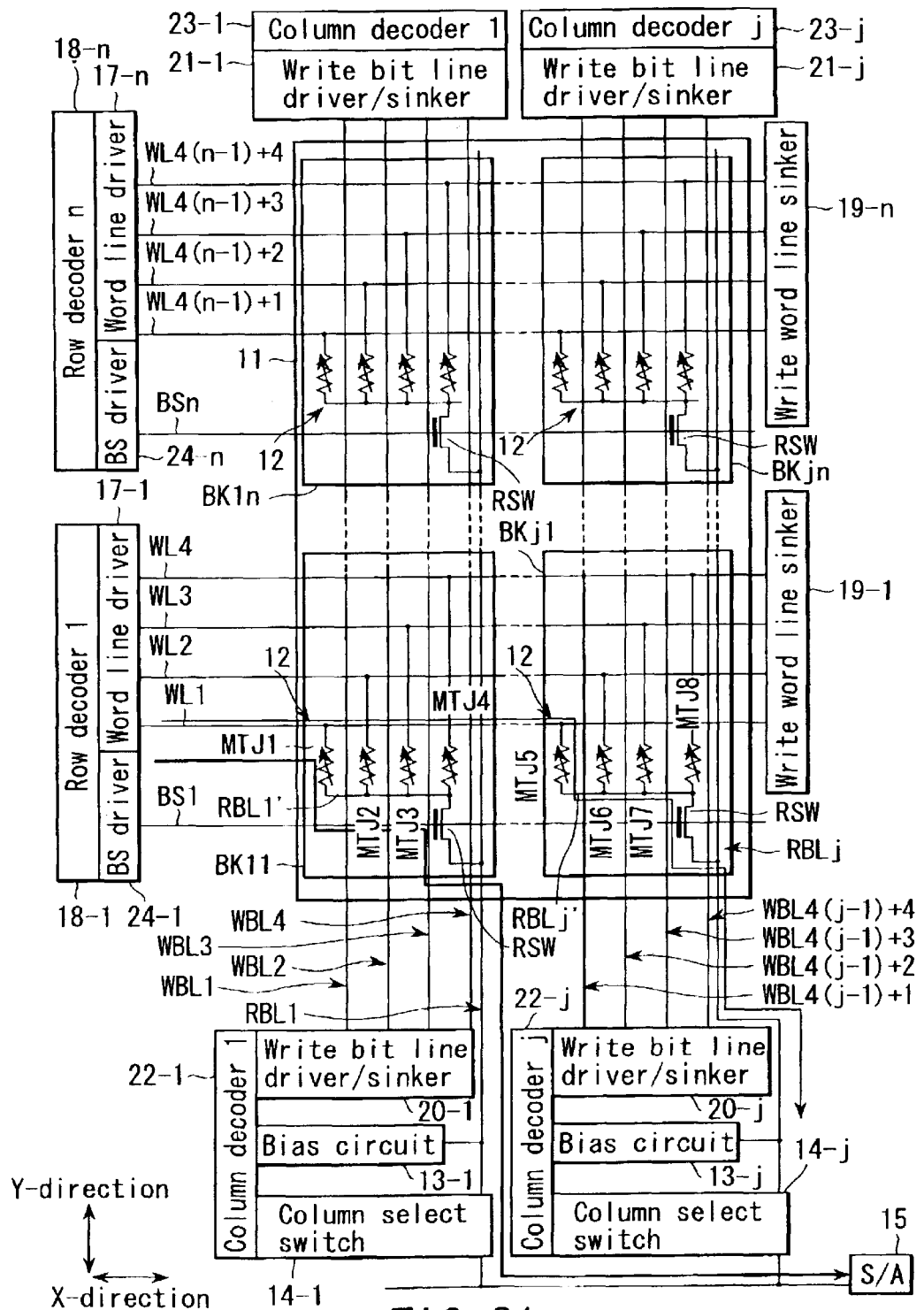
FIG. 21 is a view showing the schematic arrangement of a magnetic random access memory according to the second embodiment of the present invention.

FIG. 21 is a view showing the schematic arrangement of a magnetic random access memory according to the second embodiment of the present invention. A description of the same components as in the first embodiment will be omitted.

The second embodiment is different from the first embodiment in that a word line driver 17-n and word line sinker 19 are replaced. In the first embodiment, the ground potential is supplied to the selected word line. In the second embodiment, however, the power supply potential is supplied to the selected word line.

That is, in the second embodiment, the direction of the read current is reversed to that in the first embodiment.

B. Write/Read Operation Principle

Data write/read operation in the second embodiment of the present invention will be described next.

(1) Write Operation Principle

The write method of the second embodiment is the same as that of the first embodiment, and a description thereof will be omitted.

(2) Read Operation Principle

Assume that the data of an MTJ element MTJ1 in a lower left block BK11 should be read out. In this embodiment, the read current flows from a selected word line WL1 to a selected read bit line RBL1.

First, the read bit line RBL1 selected by a column address signal is connected to a sense amplifier 15 by a column select switch 14-1 selected by a column decoder 22-1. A current is biased from the sense amplifier 15. The voltage of the read bit line RBL1 is set to a predetermined voltage (Vconst) by the feedback circuit of the sense amplifier 15 (to be described later).

Unselected read bit lines RBLj are not connected to the sense amplifier 15 because column select switches 14-j are OFF. However, the unselected read bit lines RBLj are set to a predetermined voltage (Vconst) by bias circuits 13-j.

In addition, a block select line BS1 is driven by a row address signal (in this case, address signal bits except two bits) necessary for selecting the block BK11, and a MOS transistor RSW for selecting the block BK11 is turned on.

In the block BK11, the word line WL1 selected by the row address signal is set to a power supply potential VDD, and unselected word lines WL2, WL3, and WL4 are set in the floating state.

With this operation, for the MTJ element MTJ1 selected by the row address signal and column address signal, a current flows from the word line WL1 to the sense amplifier 15.

C. Circuit Structure of Peripheral Circuit Portion

The detailed arrangement of the peripheral circuit portion will be described next. Only a peripheral circuit portion corresponding to the MTJ element MTJ1 in the block BK11 will be illustrated and described.

In the peripheral circuit of the second embodiment, the write bit line driver/sinker and block select driver can be the same as those of the first embodiment, and a description thereof will be omitted.

(1) Word Line Driver/Sinker

① CIRCUIT Example 1

Figure 22:
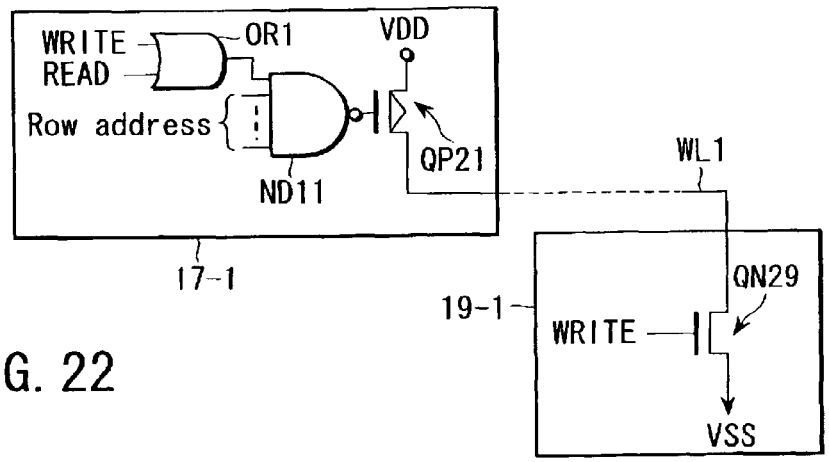
FIG. 22 is a view showing Circuit Example 1 of a word line driver/sinker according to the second embodiment of the present invention.

FIG. 22 shows Circuit Example 1 of the word line driver/sinker according to the second embodiment of the present invention.

A write word line driver 17-1 has a PMOS transistor QP21, NAND circuit ND11, and an OR circuit OR1. A word line sinker 19-1 has an NMOS transistor QN29.

The PMOS transistor QP21 is connected between the power supply terminal VDD and one end of the word line WL1. The output signal from the NAND circuit ND11 is supplied to the gate of the PMOS transistor QP21.

The row address signal and the output signal from the OR circuit OR1 are input to the NAND circuit ND11.

A write signal WRITE and read signal READ are input to the OR circuit OR1.

The NMOS transistor QN29 is connected between the other end of the word line WL1 and the ground terminal VSS. The write signal WRITE is input to the gate of the NMOS transistor QN29.

In Circuit Example 1, a data write/read is executed in the following way.

In the write mode, the PMOS transistor QP21 serving as the driver and the NMOS transistor QN29 serving as the sinker of the selected row address signal are turned on by the row decoder to supply a current to the selected word line WL1.

In the write mode, since PMOS transistors serving as the drivers and NMOS transistors serving as the sinkers of unselected word lines WL are OFF, no currents flow to the unselected word lines WL. That is, both the drivers and the sinkers need not be fully decoded.

In the read mode, the PMOS transistor QP21 serving as the driver of the selected row address signal is turned on by the row decoder to bias the selected word line WL1 to the power supply potential VDD. The read signal READ determines the read operation period.

In the read mode, since PMOS transistors serving as the drivers and NMOS transistors serving as the sinkers of unselected word lines WL are OFF, the unselected word lines WL are set in the floating state in this circuit.

② CIRCUIT Example 2

Figure 23:
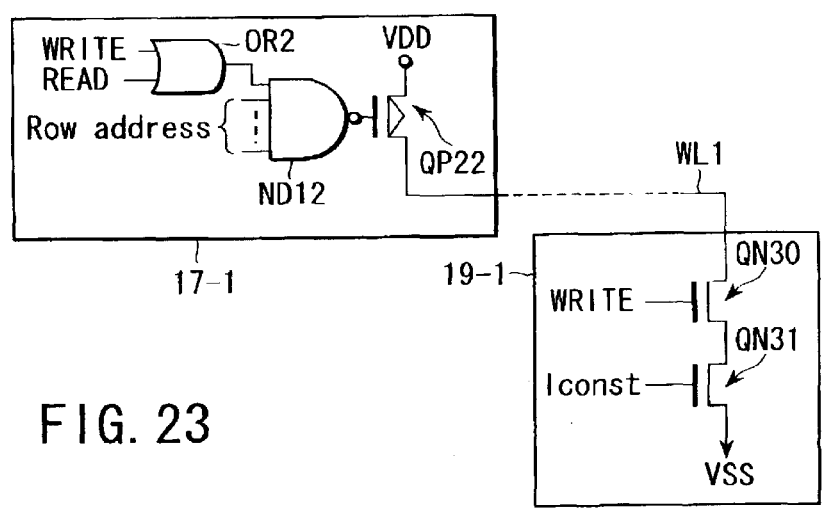
FIG. 23 is a view showing Circuit Example 2 of the word line driver/sinker according to the second embodiment of the present invention.

FIG. 23 shows Circuit Example 2 of the word line driver/sinker according to the second embodiment of the present invention.

In Circuit Example 2, only one of the sinker and driver needs to have address selectivity. For this reason, the circuit scale is reduced by omitting the decoder on the sinker side. In addition, the dependence on the power supply voltage is eliminated, and the dependence on the temperature is eliminated. Alternatively, a current source circuit is arranged to supply a current in the write mode such that dependence on the temperature can be obtained in correspondence with the switching characteristics of MTJ elements. The output (Iconst) from the current supply circuit is input to the gate to operate in the saturation condition, thereby forming a current mirror for the current output from the current source. In this case, an NMOS transistor sinker for the read mode must be particularly arranged, unlike the Circuit Example 1 shown in FIG. 22.

Since Circuit Example 2 is different from Circuit Example 1 in the arrangement of the word line sinker 19-1, the write word line driver 17-1 will be only briefly described.

The write word line driver 17-1 has a PMOS transistor QP22, NAND circuit ND12, and OR circuit OR2, as in Circuit Example 1. The word line sinker 19-1 has NMOS transistors QN30 and QN31.

The NMOS transistors QN30 and QN31 are connected between the other end of the word line WL1 and the ground terminal VSS. The write signal WRITE is input to the gate of the NMOS transistor QN30. A predetermined voltage (Iconst) is supplied to the gate of the NMOS transistor QN31.

In Circuit Example 2, a data write/read is executed in the following way.

In the write mode, the PMOS transistor QP22 serving as the driver and the NMOS transistors QN30 (turned on by the write signal WRITE) and QN31 (turned on by Iconst) serving as the sinkers of the selected row address signal are turned on by the row decoder to supply a current to the selected word line WL1.

In the write mode, since PMOS transistors serving as the drivers of unselected word lines WL are OFF, no currents flow to the unselected word lines WL.

In the read mode, the PMOS transistor QP22 serving as the driver of the selected row address signal is turned on by the row decoder to bias the selected word line WL1 to the power supply potential VDD.

In the read mode, since PMOS transistors serving as the drivers and NMOS transistors serving as the sinkers of unselected word lines WL are OFF, the unselected word lines WL are set in the floating state.

(2) Bias Circuit, Column Select Switch, and Sense Amplifier

Figure 24:
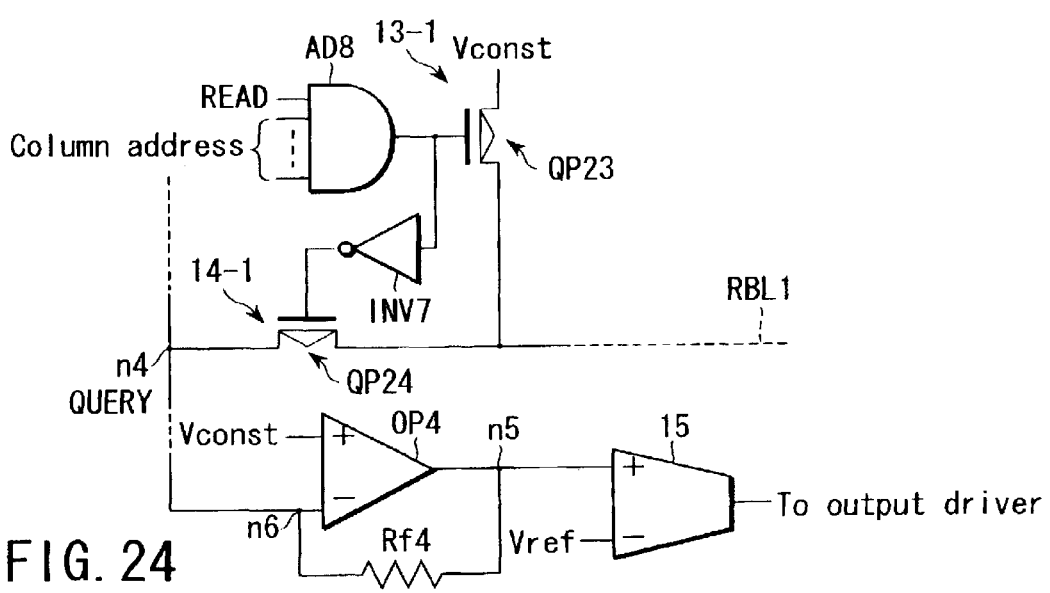
FIG. 24 is a view showing a circuit example of a bias circuit, column select switch, and sense amplifier according to the second embodiment of the present invention.

FIG. 24 shows a circuit example of the bias circuit, column select switch, and sense amplifier according to the second embodiment of the present invention.

A bias circuit 13-1, the column select switch 14-1, and the sense amplifier 15 have PMOS transistors QP23 and QP24, the AND circuit AD8, an inverter INV7, an operational amplifier OP4, a feedback resistor Rf4, and the sense amplifier (differential amplifier in FIG. 24) 15.

The PMOS transistor QP24 serving as the column select switch 14-1 is connected between a node n4 and one end of the read bit line RBL1. The output signal from the inverter INV7 is input to the gate of the PMOS transistor QP24. The output signal from the AND circuit AD8 is input to the inverter INV7. The read signal READ and column address signal are input to the AND circuit AD8.

One terminal of the PMOS transistor QP23 is connected to one end of the read bit line RBL1. The other terminal of the PMOS transistor QP23 is biased to a predetermined potential (Vconst). The output signal from the AND circuit AD8 is supplied to the gate of the PMOS transistor QP23.

The negative input terminal of the operational amplifier OP4 is connected to the node n4. The output terminal of the operational amplifier OP4 is connected to a node n5. A predetermined potential (Vconst) is supplied to the positive input terminal. The feedback resistor Rf4 is connected between the node n5 and a node n6. The arrangement of the operational amplifier OP4 will be described later.

The positive input terminal of the sense amplifier (differential amplifier) 15 is connected to the node n5. The output terminal of the sense amplifier 15 is connected to the output driver. A reference potential Vref is supplied to the negative input terminal. The reference potential Vref is an intermediate potential generated in the device such that it has a value between the output potential of the operational amplifier OP4 for "1"-data and the output potential of the operational amplifier OP4 for "0"-data. The arrangement of the sense amplifier (differential amplifier) 15 will be described later.

In this circuit example, a data read is executed in the following way.

In the read mode, the PMOS transistor QP24 serving as the column select switch of the selected column address signal is turned on by the column decoder to connect the selected read bit line RBL1 to the sense amplifier 15. The selected bit line BL1 is biased to the predetermined potential (Vconst) by feedback of the operational amplifier OP4. The output signal from the operational amplifier OP4 is amplified by the sense amplifier (differential amplifier) 15 on the output side and sent to the output driver.

Unselected read bit lines RBL are biased to the predetermined potential (Vconst) by the bias circuits 13-$j$. Hence, when the selected bit line BL and unselected bit lines BL are biased to an equipotential, the roundabout current can be eliminated.

The voltage applied to the MTJ element is limited because the MR has a dependence on the bias voltage. More specifically, when the voltage difference between the terminals of the MTJ element increases, the MR becomes low. Hence, the potential difference between the terminals of the MTJ element is preferably small. The predetermined voltage (Vconst) in the second embodiment is closer to the power supply potential VDD than the ground potential VSS. For this reason, unlike the first embodiment, the column select switch and bias MOS transistor are formed from PMOS transistors.

Figure 25:
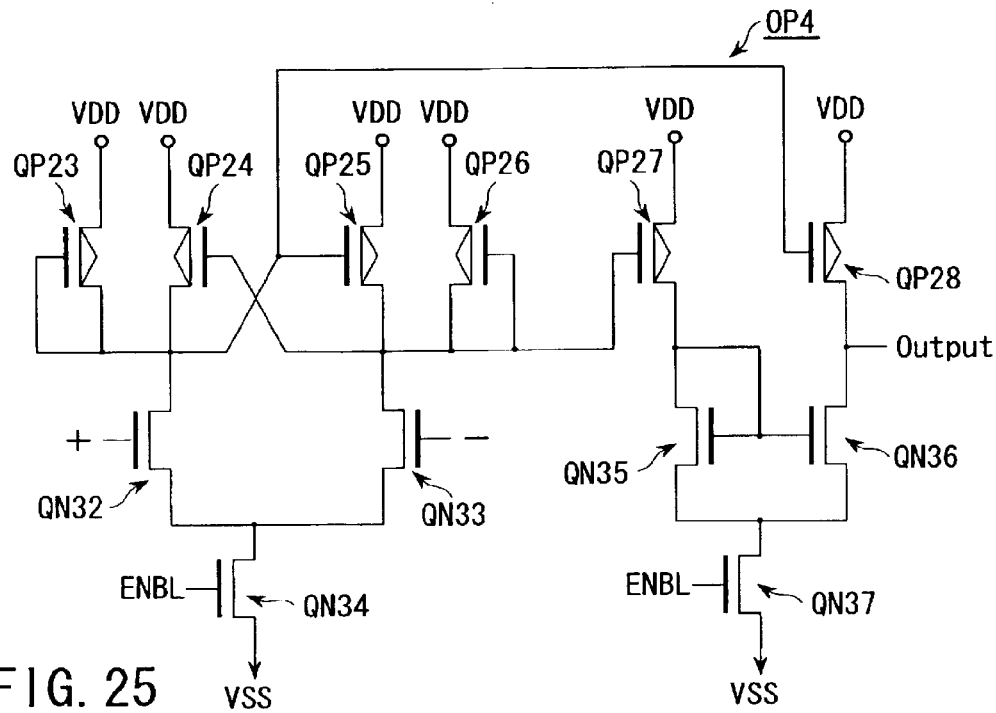
FIG. 25 is a view showing a circuit example of an operational amplifier according to the second embodiment of the present invention.

FIG. 25 shows a circuit example of the operational amplifier according to the second embodiment of the present invention. In FIG. 25, the PMOS transistors and NMOS transistors in FIG. 11 are replaced for the convenience of the input signal potentials.

The operational amplifier OP4 has PMOS transistors QP23, QP24, QP25, QP26, QP27, and QP28 and NMOS transistors QN32, QN33, QN34, QN35, QN36, and QN37.

In this circuit example, when an enable signal ENBL changes to "H" level, the operational amplifier OP4 is set in an operative state. Before and after the word line WL and column select switch are activated, the enable signal ENBL is changed to "H" level to set the operational amplifier OP4 in the operative state.

Figure 26:
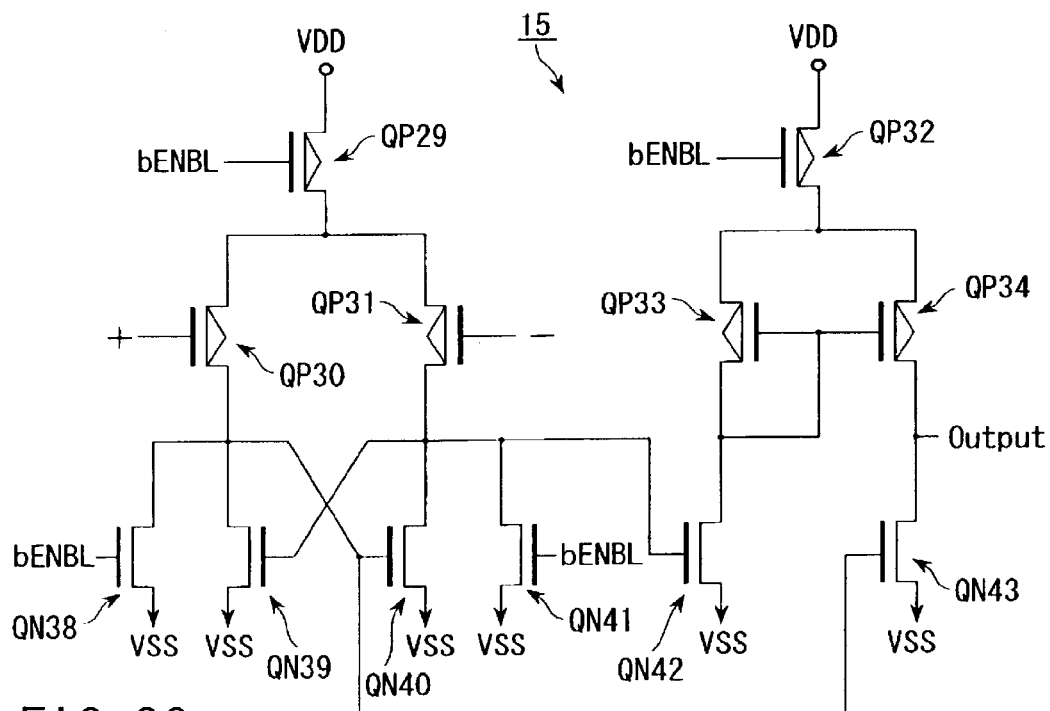
FIG. 26 is a view showing a circuit example of a differential amplifier according to the second embodiment of the present invention.

FIG. 26 is a view showing a circuit example of the differential amplifier according to the second embodiment of the present invention. In FIG. 26, the PMOS transistors and NMOS transistors in FIG. 12 are replaced for the convenience of the input signal potentials.

The differential amplifier 15 has PMOS transistors QP29, QP30, QP31, QP32, QP33, and QP34 and NMOS transistors QN38, QN39, QN40, QN41, QN42, and QN43.

In this circuit example, when an inverted signal bENBL of the enable signal ENBL changes to "L" level, the differential amplifier 15 is set in an operative state. After the word line WL, column select switch, and operational amplifier OP4 are activated, and the output from the operational amplifier OP4 stabilizes, the enable signal ENBL is changed to "H" level.

D. Device Structure of Memory Cell Portion

The device structure of the memory cell portion according to the second embodiment is almost the same as in the first embodiment, and a description thereof will be omitted.

E. Effects

According to this embodiment, as in the first embodiment, the cell area per bit can be reduced as compared to a structure having a read switch element arranged for each MTJ element. For this reason, the capacity can be increased without increasing the cell area.

In addition, as in the first embodiment, the number of MTJ elements connected to the read bit line can substantially be reduced. Since a roundabout read current can be suppressed, any read error can be prevented.

[1-3: Third Embodiment]

In the third embodiment, a stacked cell structure is formed by stacking MTJ elements, and a diode is used as a read switching element. Hence, in the third embodiment, since a read switching element of different type is used, the peripheral circuit portion and read operation related to the read switching element also change.

A. Overall Circuit Structure

Figure 27:
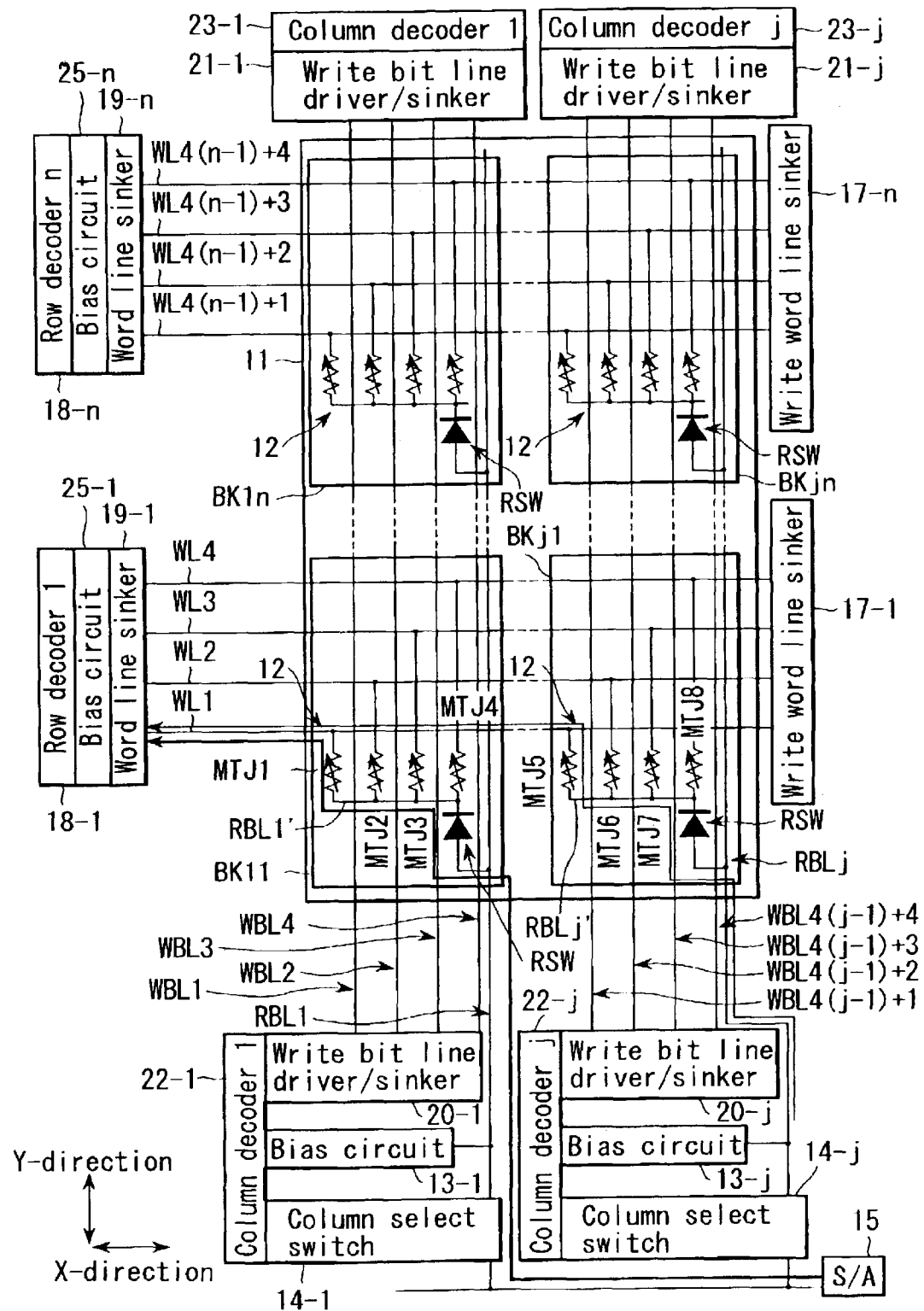
FIG. 27 is a view showing the schematic arrangement of a magnetic random access memory according to the third embodiment of the present invention.

FIG. 27 is a view showing the schematic arrangement of a magnetic random access memory according to the third embodiment of the present invention. A description of the same components as in the first embodiment will be omitted.

The third embodiment is different from the first embodiment in that the read switching element is changed from a MOS transistor to a diode. Accordingly, in the third embodiment, the block select driver 24-$n$ of the first embodiment can be omitted. Instead, a bias circuit 25-$n$ must be arranged on a row decoder 18-$n$ side.

B. Write/Read Operation Principle

Data write/read operation in the third embodiment of the present invention will be described next.

(1) Write Operation Principle

The write method of the third embodiment is the same as that of the first embodiment, and a description thereof will be omitted.

(2) Read Operation Principle

Assume that the data of an MTJ element MTJ1 in a lower left block BK11 should be read out.

In the third embodiment, since a diode RSW used as a read switching element is a 2-terminal element, the block BK11 is selected using the potential of a word line WL1. More specifically, the potential of word lines WL4($n$−1)+1, WL4($n$−1)+2, WL4($n$−1)+3, and WL4($n$−1)+4 of unselected blocks BKl$n$ and BKj$n$ are set to be equal to or higher than the potential of a read bit line RBL1. In the circuit example of the peripheral circuit to be described below, the potential is set to a higher potential.

In a read, the read bit line RBL1 selected by a column address signal is connected to a sense amplifier 15 by a column select switch 14-1 selected by a column decoder 22-1. A current is biased from the sense amplifier 15. The voltage of the read bit line RBL1 is set to a predetermined voltage (Vconst) by the feedback circuit of the sense amplifier 15 (to be described later).

Unselected read bit lines RBL$j$ are not connected to the sense amplifier 15 because column select switches 14-$j$ are OFF. However, the unselected read bit lines RBL$j$ are set to a predetermined voltage (Vconst) by bias circuits 13-$j$.

In the selected block BK11, the word line WL1 selected by word line drivers/sinkers 17-1 and 19-1 is connected to a ground potential VSS, and unselected word lines WL2, WL3, and WL4 are set in the floating state.

With this operation, a bias current from the sense amplifier 15 flows to the MTJ element MTJ1 selected by the row address signal and column address signal.

Since word lines WL in the unselected blocks BKl$n$ and BKj$n$ are biased to a power supply potential VDD, no currents flow to MTJ elements 12 in the unselected blocks BKl$n$ and BKj$n$.

A current from the bias circuit 13-$j$ flows to the MTJ elements 12 in a block BKj1 which is selected by the row address signal and not selected by the column address signal. The current flowing to an MTJ element MTJ5 which is connected to the word line WL1 selected in the unselected block BKj1 flows to the ground potential VSS. For this reason, the current does not reflux to the MTJ element MTJ1 in the block BK11 selected by the row address signal and column address signal.

C. Circuit Structure of Peripheral Circuit Portion

The detailed arrangement of the peripheral circuit portion will be described next. Only a peripheral circuit portion corresponding to the MTJ element MTJ1 in the block BK11 will be illustrated and described.

In the peripheral circuit of the third embodiment, the write bit line driver/sinker, block select driver, sense amplifier, bias circuit, and column select switch can be the same as those of the first embodiment, and a description thereof will be omitted.

(1) Word Line Driver/Sinker

① CIRCUIT Example 1

Figure 28:
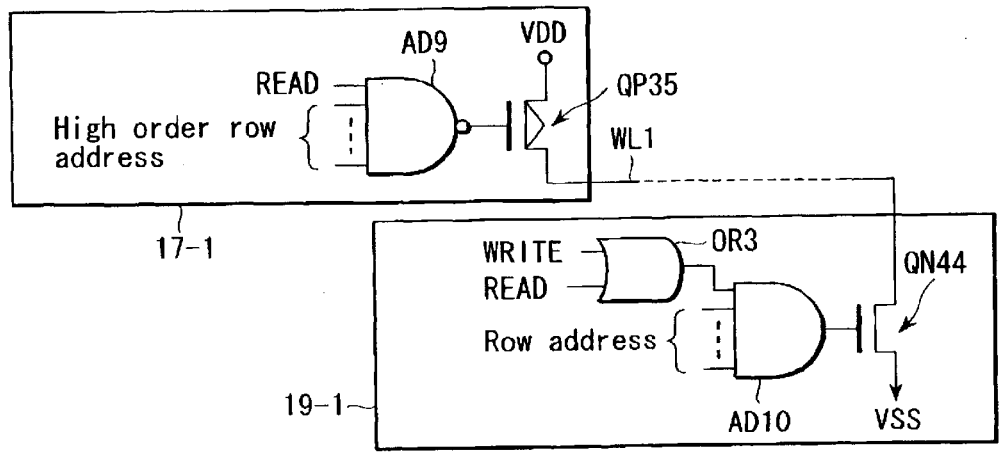
FIG. 28 is a view showing Circuit Example 1 of a word line driver/sinker according to the third embodiment of the present invention.

FIG. 28 shows Circuit Example 1 of the word line driver/sinker according to the third embodiment of the present invention.

The write word line driver 17-1 has a PMOS transistor QP35 and AND circuit AD9. The word line sinker 19-1 has an NMOS transistor QN44, AND circuit AD10, and OR circuit OR3.

The PMOS transistor QP35 is connected between the power supply terminal VDD and one end of the word line WL1. The output signal from the AND circuit AD9 is supplied to the gate of the PMOS transistor QP35.

A read signal READ and the row address signal are input to the AND circuit AD9.

The NMOS transistor QN44 is connected between the other end of the word line WL1 and the ground terminal VSS. The output signal from the OR circuit OR3 is supplied to the AND circuit AD10. The output signal from the AND circuit AD10 is supplied to the gate of the NMOS transistor QN44.

The write signal WRITE and read signal READ are input to the OR circuit OR3. The row address signal is input to the AND circuit AD10.

In Circuit Example 1, a data write/read is executed in the following way.

In the write mode, the PMOS transistor QP35 serving as the driver and the NMOS transistor QN44 serving as the sinker of the row address signal selected by the row decoder are turned on to supply a current to the selected word line WL1.

In the write mode, since NMOS transistors serving as the sinkers of unselected word lines are OFF, no currents flow to the unselected word lines WL even when the PMOS transistors serving as the drivers are ON. That is, both the drivers and the sinkers need not be fully decoded.

In the read mode, the PMOS transistor QP35 serving as the driver is turned on, and the NMOS transistor QN44 serving as the sinker of the selected row address signal is turned on by the row decoder to set the selected word line WL1 to the ground potential VSS.

In the read mode, since PMOS transistors serving as the drivers and NMOS transistors serving as the sinkers of unselected word lines WL2, WL3, and WL4 in the selected block BL11 are OFF, the unselected word lines WL2, WL3, and WL4 are set in the floating state in this circuit.

In the unselected blocks Bk1$n$ and BKj$n$, since the PMOS transistors serving as drivers are turned on, and NMOS transistors serving as sinkers are turned off by the decoder, and word lines are biased to the power supply potential VDD.

② CIRCUIT Example 2

Figure 29:
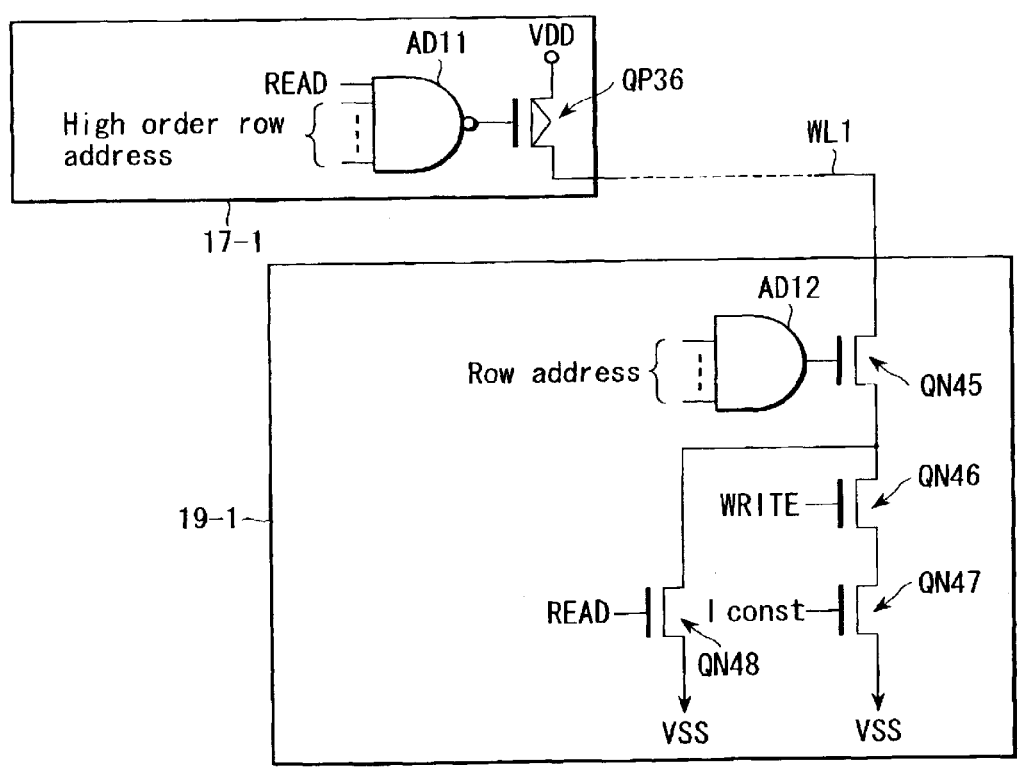
FIG. 29 is a view showing Circuit Example 2 of the word line driver/sinker according to the third embodiment of the present invention.

FIG. 29 shows Circuit Example 2 of the word line driver/sinker according to the third embodiment of the present invention.

In Circuit Example 2, the dependence on the power supply voltage is eliminated, and the dependence on the temperature is eliminated. Alternatively, a current source circuit is arranged to supply a current in the write mode such that dependence on the temperature can be obtained in correspondence with the switching characteristics of MTJ elements. The output (Iconst) from the current supply circuit is input to the gate to operate in the saturation condition, thereby forming a current mirror for the current output from the current source. In this case, an NMOS transistor sinker for the read mode must be particularly arranged, unlike the Circuit Example 1 shown in FIG. 28.

Since Circuit Example 2 is different from Circuit Example 1 in the arrangement of the word line sinker 19-1, the write word line driver 17-1 will be only briefly described.

The write word line driver 17-1 has a PMOS transistor QP36 and the AND circuit AD11, as in Circuit Example 1. The word line sinker 19-1 has NMOS transistors QN45, QN46, QN47, and QN48 and an AND circuit AD12.

The NMOS transistors QN45, QN46, and QN47 are connected between the other end of the word line WL1 and the ground terminal VSS. The output signal from the AND circuit AD12 is input to the gate of the NMOS transistor QN45. The write signal WRITE is input to the gate of the NMOS transistor QN46. The read signal READ is input to the gate of the NMOS transistor QN47. The row address signal is input to the AND circuit AD12.

The NMOS transistor QN48 is connected between the NMOS transistor QN45 and the ground terminal VSS. The read signal READ is input to the gate of the NMOS transistor QN48.

In Circuit Example 2, a data write/read is executed in the following way.

In the write mode, the PMOS transistor QP36 serving as the driver, and the NMOS transistors QN45 (turned on by the row address signal), QN46 (turned on by the write signal WRITE), and QN47 (turned on by Iconst) serving as the sinkers of the selected row address signal are turned on by the row decoder to supply a current to the selected word line WL1.

In the write mode, since PMOS transistors serving as the drivers of unselected word lines WL are OFF, no currents flow to the unselected word lines WL.

In the read mode, the NMOS transistors QN44 and QN48 serving as the sinkers of the selected row address signal are turned on by the row decoder to set the selected word line WL1 to the ground potential VSS.

In the read mode, since PMOS transistors serving as the drivers and NMOS transistors serving as the sinkers of unselected word lines WL are OFF, the unselected word lines WL are set in the floating state.

D. Device Structure of Memory Cell Portion

The device structure of the memory cell portion will be described next. The device structure of the block BK11 shown in FIG. 1 will be exemplified.

Figure 30:
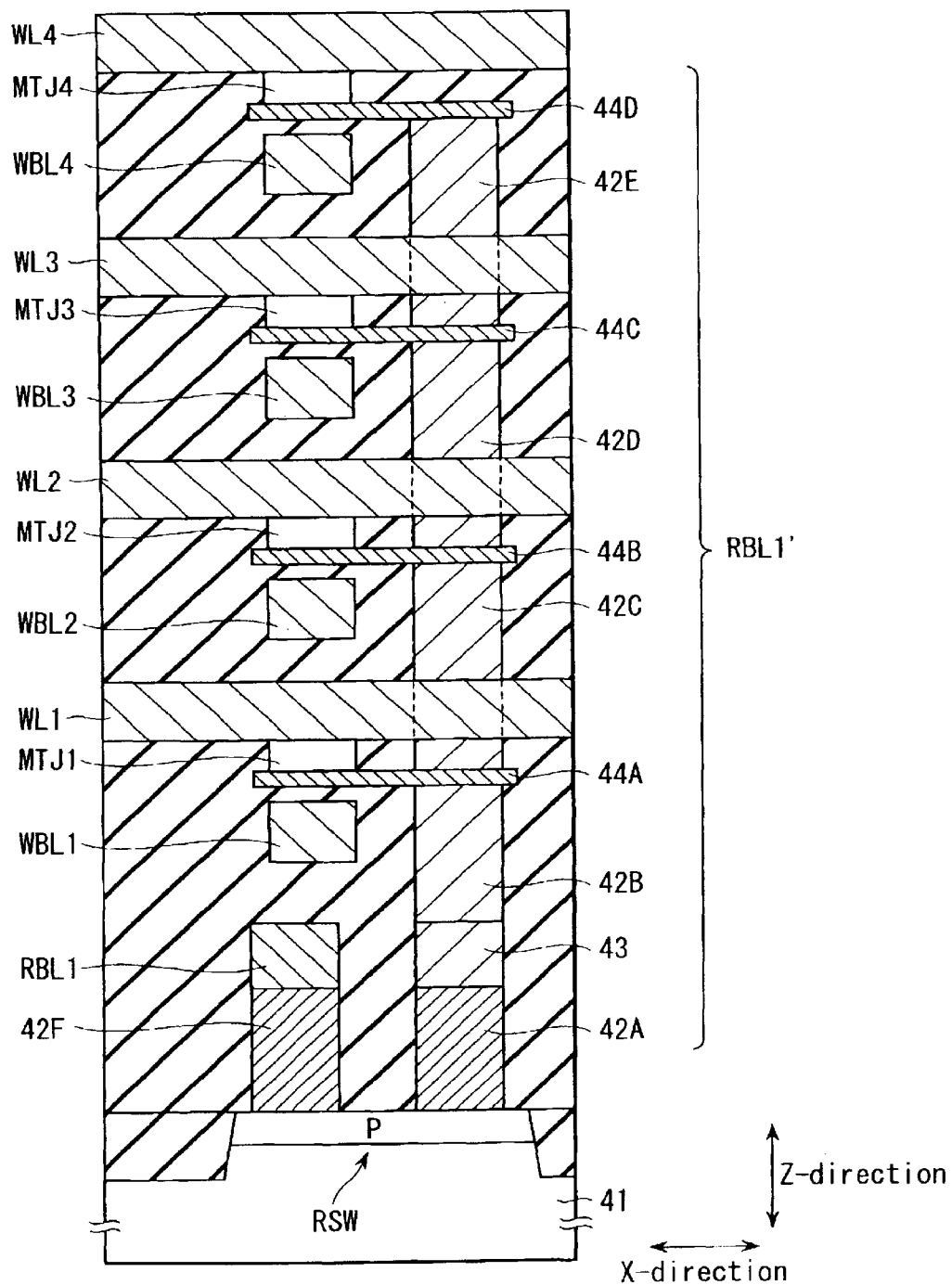
FIG. 30 is a sectional view showing a structural example of the magnetic random access memory according to the third embodiment of the present invention in the X-direction.
Figure 31:
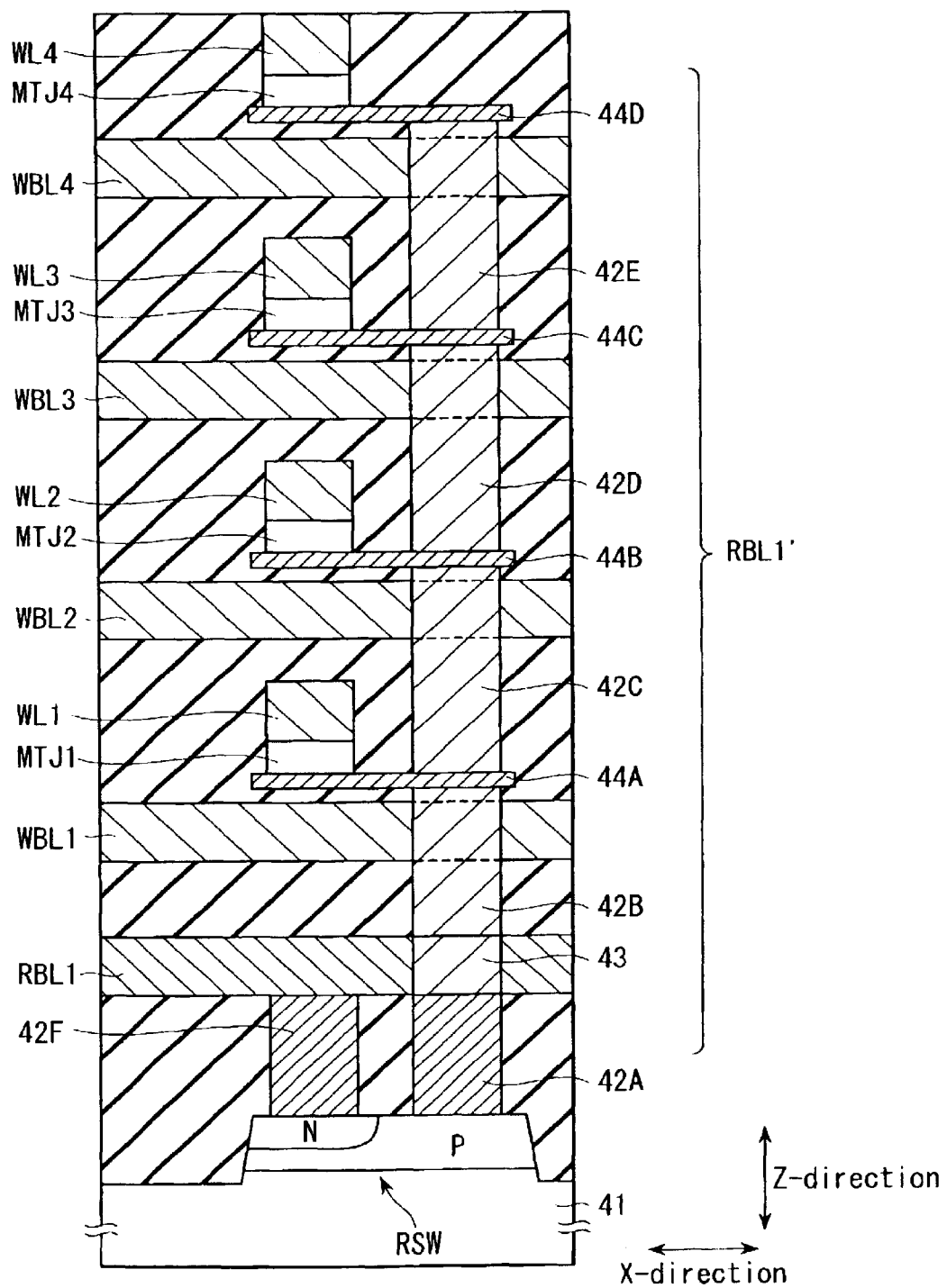
FIG. 31 is a sectional view showing a structural example of the magnetic random access memory according to the third embodiment of the present invention in the Y-direction.

FIG. 30 shows the X-direction section of one block of the magnetic random access memory. FIG. 31 shows the Y-direction section of one block of the magnetic random access memory. The same reference numerals as in FIG. 1 denote the same elements in FIGS. 30 and 31 to show the correspondence between them.

(1) Structure of Memory Cell Portion

FIGS. 30 and 31 are sectional views showing the structural example of the magnetic random access memory according to the third embodiment of the present invention. A description of the same components as in the first embodiment will be omitted.

The memory cell portion of the third embodiment is different from that of the first embodiment in the read switching portion. In the third embodiment, the pn-junction diode RSW is formed in a semiconductor substrate 41. A read sub bit line RBL' commonly connected to one terminal of each of the MTJ elements MTJ1, MTJ2, MTJ3, and MTJ4 is connected to the p-type diffusion layer of the diode RSW. A read main bit line RBL is connected to the n-type diffusion layer. The read main bit line RBL runs in the Y-direction.

(2) Structure of MTJ Element

The MTJ element of the third embodiment has the same structure as that of the first embodiment, and a description thereof will be omitted.

E. Effects

According to this embodiment, as in the first embodiment, the cell area per bit can be reduced as compared to a structure having a read switch element arranged for each MTJ element. For this reason, the capacity can be increased without increasing the cell area.

In addition, as in the first embodiment, the number of MTJ elements connected to the read bit line can substantially be reduced. Since a roundabout read current can be suppressed, any read error can be prevented.

Furthermore, in this embodiment, since a diode is used as the read switching element. Hence, since the block select line or block select driver in the first and second embodiments can be omitted, the area of the peripheral circuit portion can be reduced as compared to the structure using a transistor as the read switching element.

[1–4: Fourth Embodiment]

In the fourth embodiment, a stacked cell structure is formed by stacking MTJ elements, and a diode is used as a read switching element, as in the third embodiment. In the fourth embodiment, however, the read current flowing direction is reversed to that of the third embodiment.

A. Overall Circuit Structure

Figure 32:
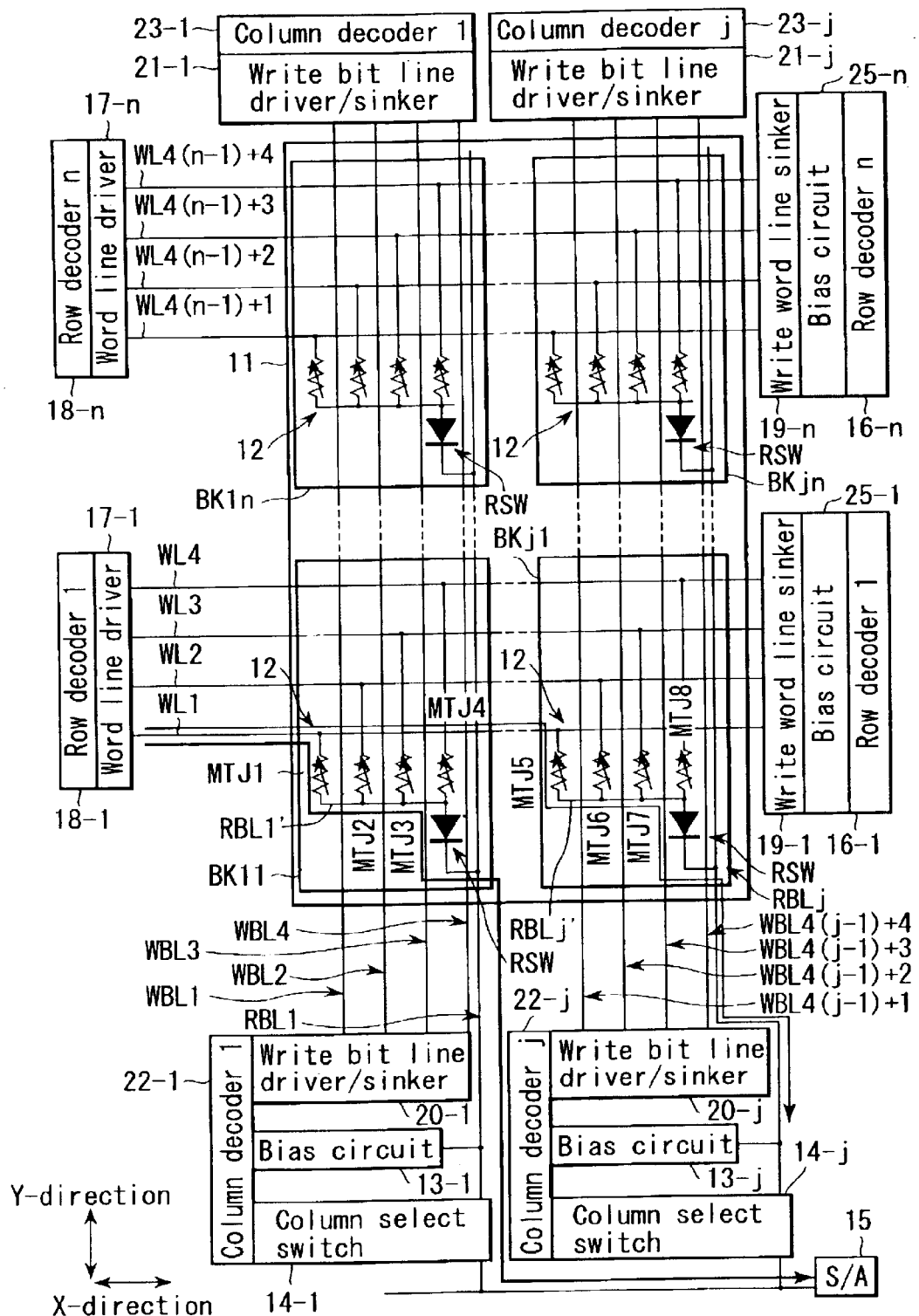
FIG. 32 is a view showing the schematic arrangement of a magnetic random access memory according to the fourth embodiment of the present invention.

FIG. 32 is a view showing the schematic arrangement of a magnetic random access memory according to the fourth embodiment of the present invention. A description of the same components as in the third embodiment will be omitted.

The fourth embodiment is different from the third embodiment in that a word line driver 17-$n$ and word line sinker 19 are replaced. In the third embodiment, the ground potential is supplied to the selected word line. In the fourth embodiment, however, the power supply potential is supplied to the selected word line. In addition, a bias circuit 25-$n$ is arranged on the side of the word line sinker 19-$n$.

That is, in the fourth embodiment, the direction of the read current is reversed to that in the third embodiment.

B. Write/Read Operation Principle

Data write/read operation in the fourth embodiment of the present invention will be described next.

(1) Write Operation Principle

The write method of the fourth embodiment is the same as that of the first embodiment, and a description thereof will be omitted.

(2) Read Operation Principle

Assume that the data of an MTJ element MTJ1 in a lower left block BK11 should be read out.

In the fourth embodiment, since a diode RSW used as a read switching element is a 2-terminal element, the block BK11 is selected using the potential of a word line WL1. More specifically, as in the third embodiment, the potential of word lines WL4($n$−1)+1, WL4($n$−1)+2, WL4($n$−1)+3, and WL4($n$−1)+4 of unselected blocks BKln and BKjn are set to be equal to or lower than the potential of a read bit line RBL1. In the circuit example of the peripheral circuit to be described below, the potential is set to a lower potential.

A read current flows from the selected word line WL1 to the selected read bit line RBL1.

The read bit line RBL1 selected by a column address signal is connected to a sense amplifier 15 by a column select switch 14-1 selected by a column decoder 22-1. A current is biased from the sense amplifier 15. The voltage of the read bit line RBL1 is set to a predetermined voltage (Vconst) by the feedback circuit of the sense amplifier 15 (to be described later).

Unselected read bit lines RBLj are not connected to the sense amplifier 15 because column select switches 14-j are OFF. However, the unselected read bit lines RBLj are set to a predetermined voltage (Vconst) by bias circuits 13-j.

In the selected block BK11, the word line WL1 selected by word line drivers/sinkers 17-1 and 19-1 is connected to a power supply potential VDD, and unselected word lines WL2, WL3, and WL4 are set in the floating state.

With this operation, for the MTJ element MTJ1 selected by the row address signal and column address signal, a bias current flows from the word line WL1 to the sense amplifier 15.

Since word lines WL4(n−1)+1, WL4(n−1)+2, WL4(n−1)+3, and WL4(n−1)+4 in the unselected blocks BKln and BKjn are biased to a ground potential VSS, no currents flow to MTJ elements 12 in the unselected blocks BKln and BKjn.

A current from the bias circuit 13-j flows to the MTJ elements 12 in a block BKj1 which is selected by the row address signal and not selected by the column address signal. The current flowing to an MTJ element MTJ5 which is connected to the word line WL1 selected in the unselected block BKj1 flows to the ground potential VSS. For this reason, the current does not reflux to the MTJ element MTJ1 in the block BK11 selected by the row address signal and column address signal.

C. Circuit Structure of Peripheral Circuit Portion

The detailed arrangement of the peripheral circuit portion will be described next. Only a peripheral circuit portion corresponding to the MTJ element MTJ1 in the block BK11 will be illustrated and described.

In the peripheral circuit of the fourth embodiment, the write bit line driver/sinker, block select driver, sense amplifier, bias circuit, and column select switch can be the same as those of the first embodiment, and a description thereof will be omitted.

(1) Word Line Driver/Sinker

Figure 33:
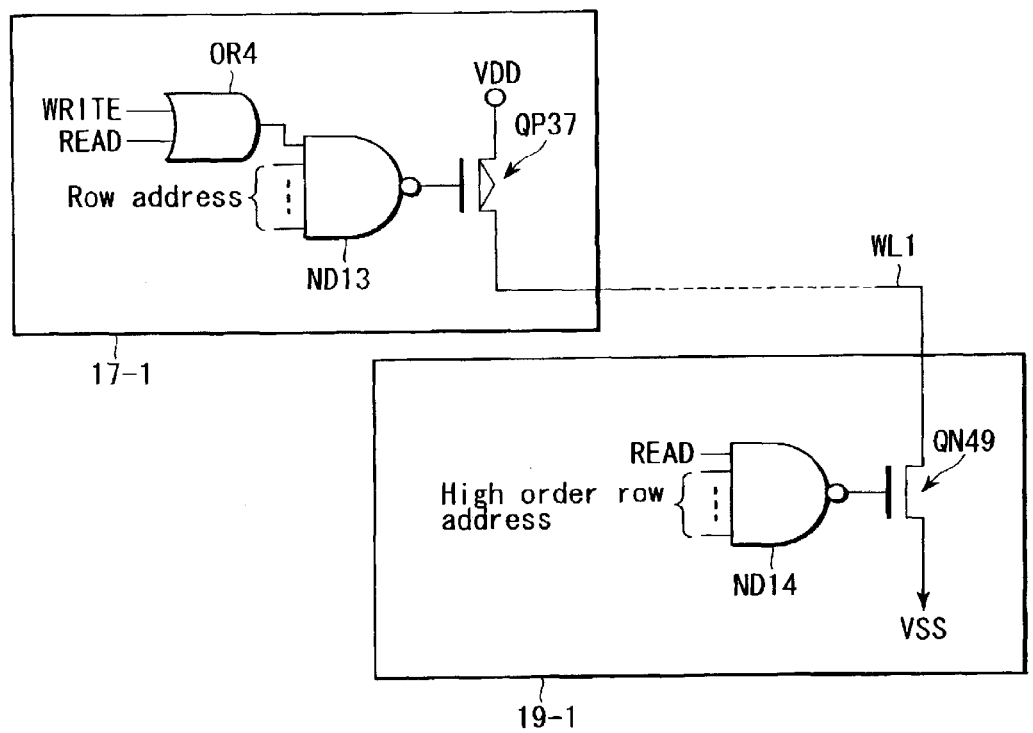
FIG. 33 is a view showing a circuit example of a word line driver/sinker according to the fourth embodiment of the present invention.

FIG. 33 shows a circuit example of the word line driver/sinker according to the fourth embodiment of the present invention.

The write word line driver 17-1 has a PMOS transistor QP37, NAND circuit ND13, and OR circuit OR4. The word line sinker 19-1 has an NMOS transistor QN49 and NAND circuit ND14.

The PMOS transistor QP37 is connected between the power supply terminal VDD and one end of the word line WL1. The output signal from the NAND circuit ND13 is supplied to the gate of the PMOS transistor QP37.

The row address signal and output signal from the OR circuit OR4 are input to the NAND circuit ND13.

The write signal WRITE and read signal READ are input to the OR circuit OR4.

The NMOS transistor QN49 is connected between the other end of the word line WL1 and the ground terminal VSS. The output signal from the NAND circuit ND14 is supplied to the gate of the NMOS transistor QN49.

The read signal READ and row address signal are input to the NAND circuit ND14.

In this circuit example, a data write/read is executed in the following way.

In the write mode, the NMOS transistor QN49 serving as the sinker and the PMOS transistor QP37 serving as the driver of the row address signal selected by the row decoder are turned on to supply a current to the selected word line WL1.

In the write mode, since PMOS transistors serving as the drivers of unselected word lines are OFF, no currents flow to the unselected word lines WL even when the NMOS transistors serving as the sinkers are ON. That is, both the drivers and the sinkers need not be fully decoded.

In the read mode, the NMOS transistor QN49 serving as the sinker is turned off, and the PMOS transistor QP37 serving as the driver of the selected row address signal is turned on by the row decoder to set the selected word line WL1 to the power supply potential VDD.

In the read mode, since PMOS transistors serving as the drivers and NMOS transistors serving as the sinkers of unselected word lines WL2, WL3, and WL4 in the selected block BL11 are OFF, the unselected word lines WL2, WL3, and WL4 are set in the floating state in this circuit.

In the unselected blocks Bk1n and BKjn, since the PMOS transistors serving as drivers are turned off, and NMOS transistors serving as sinkers are turned on by the decoder, and word lines are biased to the ground potential VSS.

D. Device Structure of Memory Cell Portion

The device structure of the memory cell portion according to the fourth embodiment is almost the same as that of the third embodiment, and a description thereof will be omitted.

E. Effects

According to this embodiment, as in the first embodiment, the cell area per bit can be reduced as compared to a structure having a read switch element arranged for each MTJ element. For this reason, the capacity can be increased without increasing the cell area.

In addition, as in the first embodiment, the number of MTJ elements connected to the read bit line can substantially be reduced. Since a roundabout read current can be suppressed, any read error can be prevented.

Furthermore, as in the third embodiment, since a diode is used as the read switching element. Hence, since the block select line or block select driver in the first and second embodiments can be omitted, the area of the peripheral circuit portion can be reduced as compared to the structure using a transistor as the read switching element.

[2] Horizontal Cell Structure

In the fifth and sixth embodiments, a plurality of MTJ elements are arranged horizontally in a direction (write bit line running direction) parallel to the surface of a semiconductor substrate. One terminal of each of the plurality of MTJ elements is commonly connected while the other terminal of each of the plurality of MTJ elements is independently connected to a word line to form one block.

In the fifth and sixth embodiments, four MTJ elements are arranged horizontally in one block. However, the number of MTJ elements is not limited to this.

[2-1: Fifth Embodiment]

In the fifth embodiment, a horizontal cell structure is formed by arranging MTJ elements horizontally on a semiconductor substrate.

A. Overall Circuit Structure

Figure 34:
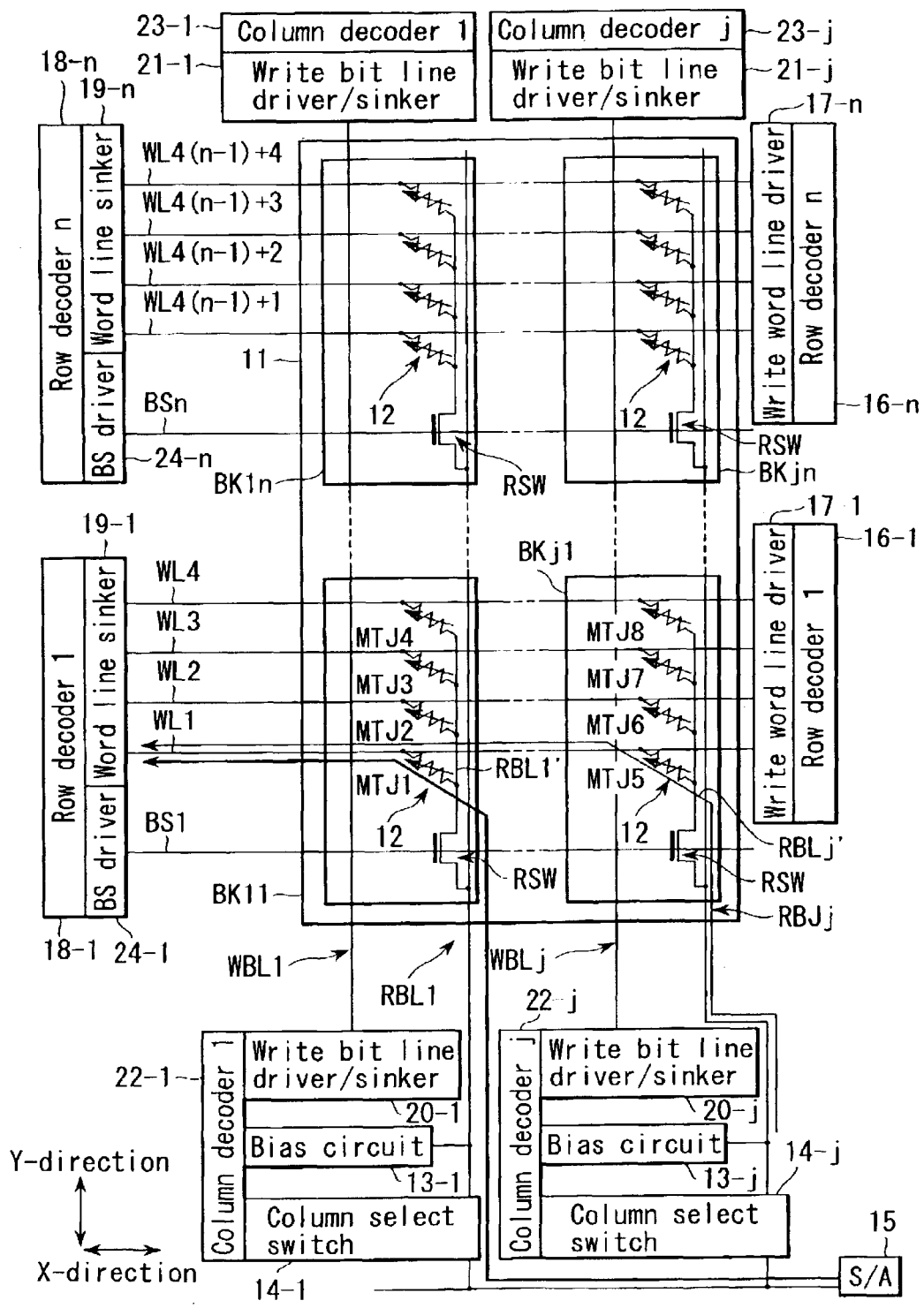
FIG. 34 is a view showing the schematic arrangement of a magnetic random access memory according to the fifth embodiment of the present invention.

FIG. 34 is a view showing the schematic arrangement of a magnetic random access memory according to the fifth embodiment of the present invention.

The fifth embodiment is different from the first embodiment in that since MTJ elements 12 which construct a block are not stacked, one write bit line WBLj suffices for each column.

That is, in the fifth embodiment, the write bit line WBLj is shared by the plurality of MTJ elements 12 independently of the number of MTJ elements 12 in one block BKjn. For example, a write bit line WBL1 is shared by the MTJ elements 12 in blocks BK11 and BL1n on the same column.

B. Write/Read Operation Principle

Data write/read operation in the fifth embodiment of the present invention will be described next.

(1) Write Operation Principle

Assume that data should be written in an MTJ element MTJ1 in the lower left block BK11.

First, currents are supplied to a selected word line WL1 and write bit line WBL1 to generate a synthesized magnetic field. The magnetization of the MTJ element MTJ1 at the intersection between the selected word line WL1 and the write bit line WBL1 is inverted or not inverted by the synthesized magnetic field to write data in the MTJ element MTJ1.

In the fifth embodiment, when data should be written in each of the plurality of MTJ elements 12 located on the same column, the same write bit line WBLj is used.

Hence, to write data in an MTJ element MTJ2 of the block BK11, a word line WL2 and the write bit line WBL1 are used. To write data in an MTJ element MTJ3 of the block BK11, a word line WL3 and the write bit line WBL1 are used. To write data in an MTJ element MTJ4 of the block BK11, a word line WL4 and write bit line WBL1 are used.

(2) Read Operation Principle

Assume that the data of the MTJ element MTJ1 in the lower left block BK11 should be read out.

First, a column select switch 14-1 selected by a column decoder 22-1 is turned on to connect a read bit line RBL1 selected by a column address signal to a sense amplifier 15. A bias current is supplied from the sense amplifier 15. The voltage of the read bit line RBL1 is set to a predetermined voltage (Vconst) by the feedback circuit of the sense amplifier 15.

Unselected read bit lines RBLj are not connected to the sense amplifier 15 because column select switches 14-j are OFF, though the read bit lines RBLj are set to the predetermined voltage (Vconst) by bias circuits 13-j.

In addition, a block select line BS1 is driven by a row address signal necessary for selecting the block BK11, and the MOS transistor RSW for selecting the block BK11 is turned on.

In the block BK11, the word line WL1 selected by the row address signal is set to a ground potential VSS, and the unselected word lines WL2, WL3, and WL4 are set in the floating state.

With this operation, a bias current from the sense amplifier 15 flows to the MTJ element MTJ1 selected by the row address signal and column address signal.

No currents flow to the MTJ elements 12 in blocks BKln and BKjn in which the block select MOS transistors RSW are OFF.

A current from the bias circuit 13-j is supplied to the MTJ elements 12 in a block BKj1 which is not selected by the column address signal and whose block select MOS transistor RSW is ON. The current flowing to an MTJ element MTJ5 which is connected to the word line WL1 in the unselected block BKj1 flows to the ground potential VSS. Hence, the current does not reflux to the MTJ element MTJ1 in the block BK11 selected by the row address signal and column address signal.

C. Circuit Structure of Peripheral Circuit Portion

The detailed arrangement of the peripheral circuit portion will be described next. Only a peripheral circuit portion corresponding to the MTJ element MTJ1 in the block BK11 will be illustrated and described.

In the peripheral circuit of the fifth embodiment, the word line driver/sinker, block select driver, sense amplifier, bias circuit, and column select switch can be the same as those of the first embodiment, and a description thereof will be omitted.

(1) Write Bit Line Driver

① CIRCUIT Example 1

Figure 35:
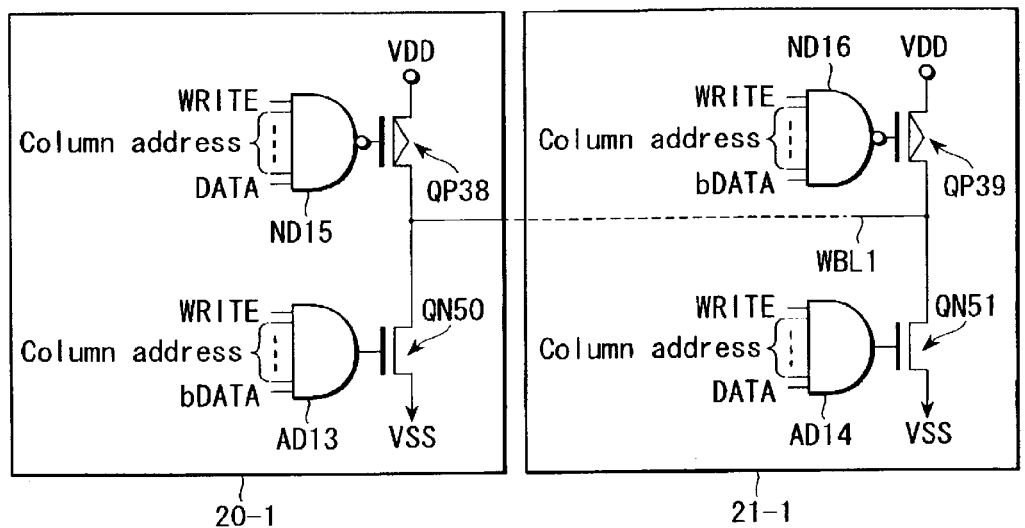
FIG. 35 is a view showing Circuit Example 1 of a write bit line driver/sinker according to the fifth embodiment of the present invention.

FIG. 35 shows Circuit Example 1 of the write bit line driver according to the fifth embodiment of the present invention.

In the structure of the fifth embodiment, the write bit line WBLj is shared by all the MTJ elements 12 in the block BKjn in the write mode. For this reason, in Circuit Example 1 of the write bit line driver of the fifth embodiment, the row address signal for selecting an MTJ element 12 in a block need not be input, unlike Circuit Example 1 of the first embodiment.

A write bit line driver/sinker 20-1 has a PMOS transistor QP38, NMOS transistor QN50, NAND circuit ND15, and AND circuit AD13.

The PMOS transistor QP38 is connected between the power supply terminal VDD and one end of the write bit line WBL1. The output signal from the NAND circuit ND15 is supplied to the gate of the PMOS transistor QP38.

The NMOS transistor QN50 is connected between one end of the write bit line WBL1 and the ground terminal VSS. The output signal from the AND circuit AD13 is supplied to the gate of the NMOS transistor QN50.

A write signal WRITE, the column address signal, and a data signal DATA are input to the NAND circuit ND15. The write signal WRITE, the column address signal, and an inverted signal bDATA of the data signal DATA are input to the AND circuit AD13.

A write bit line driver/sinker 21-1 has a PMOS transistor QP39, NMOS transistor QN51, NAND circuit ND16, and AND circuit AD14.

The PMOS transistor QP39 is connected between the power supply terminal VDD and one end of the write bit line WBL1. The output signal from the NAND circuit ND16 is supplied to the gate of the PMOS transistor QP39.

The NMOS transistor QN51 is connected between one end of the write bit line WBL1 and the ground terminal VSS. The output signal from the AND circuit AD14 is supplied to the gate of the NMOS transistor QN51.

The write signal WRITE, column address signal, and inverted signal bDATA are input to the NAND circuit ND16. The write signal WRITE, column address signal, and data signal DATA are input to the AND circuit AD14.

Since the direction of the current to be supplied to the write bit line WBL1 must be changed in accordance with write data, the data signal DATA and its inverted signal bDATA are used.

In Circuit Example 1, a data write is executed in the following way.

In the write mode, the PMOS transistor QP38 serving as the driver and the NMOS transistor QN51 serving as the sinker of the selected column address signal are turned on by the column decoder to supply a current to the selected write bit line WBL1. Alternatively, the PMOS transistor QP39 serving as the driver and the NMOS transistor QN50 serving as the sinker of the selected column address signal are turned on by the column decoder to supply a current to the selected write bit line WBL1.

In the write mode, since PMOS transistors serving as the drivers and NMOS transistors serving as the sinkers of unselected write bit lines WBL are OFF, no currents flow to the unselected write bit lines WBL.

② CIRCUIT Example 2

Figure 36:
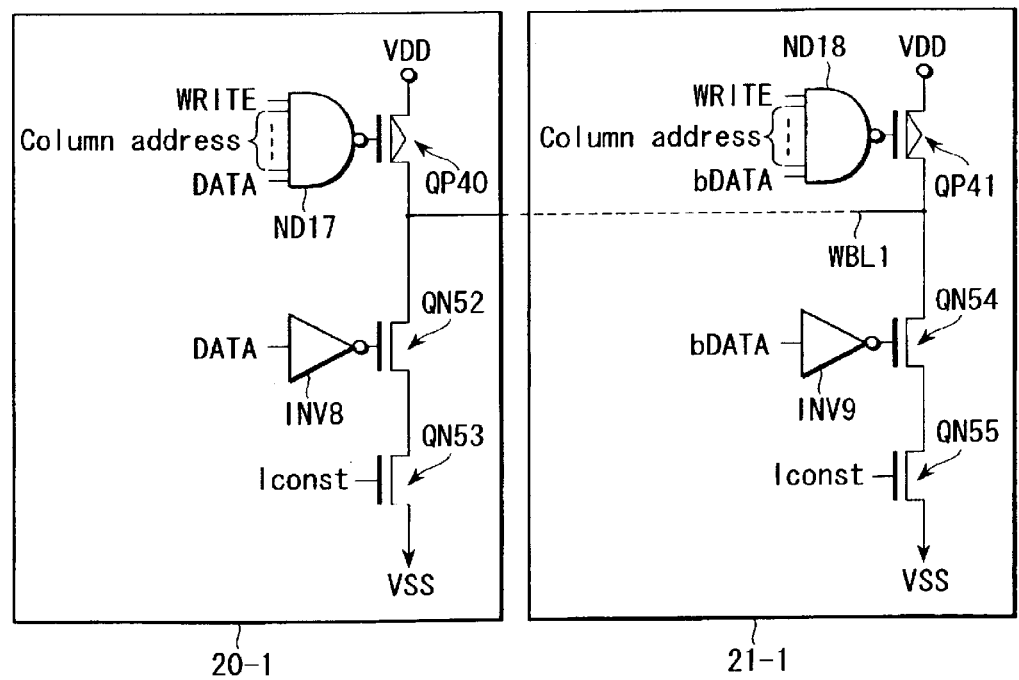
FIG. 36 is a view showing Circuit Example 2 of the write bit line driver/sinker according to the fifth embodiment of the present invention.

FIG. 36 shows Circuit Example 2 of the write bit line driver/sinker according to the fifth embodiment of the present invention.

In the structure of the fifth embodiment, the write bit line WBLj is shared by the MTJ elements 12 in the block BKjn in the write mode. For this reason, in Circuit Example 2 of the write bit line driver of the fifth embodiment, the row address signal for selecting an MTJ element in a block need not be input, unlike Circuit Example 3 of the first embodiment.

In Circuit Example 2, only one of the sinker and driver needs to have address selectivity. For this reason, the circuit scale is reduced by omitting the decoder on the sinker side. In addition, the dependence on the power supply voltage is eliminated, and the dependence on the temperature is eliminated. Alternatively, a current source circuit is arranged to supply a current in the write mode such that dependence on the temperature can be obtained in correspondence with the switching characteristics of MTJ elements. The output (Iconst) from the current supply circuit is input to the gate to implement pentode operation, thereby forming a current mirror for the current output from the current source.

Since Circuit Example 2 is different from Circuit Example 1 in the arrangement on the sinker side, the arrangement on the driver side will be only briefly described.

The write bit line driver/sinker 20-1 has a PMOS transistor QP40, NMOS transistors QN52 and QN53, NAND circuit ND17, and inverter INV8.

The NMOS transistors QN52 and QN53 are connected between one end of the write bit line WBL1 and the ground terminal VSS. The output signal from the inverter INV8 is supplied to the gate of the NMOS transistor QN52. The data signal DATA is input to the inverter INV8. A predetermined voltage (Iconst) is supplied to the gate of the NMOS transistor QN53.

The write bit line driver/sinker 21-1 has a PMOS transistor QP41, NMOS transistors QN54 and QN55, NAND circuit ND18, and inverter INV9.

The NMOS transistors QN54 and QN55 are connected between one end of the write bit line WBL1 and the ground terminal VSS. The output signal from the inverter INV9 is supplied to the gate of the NMOS transistor QN54. The inverted signal bDATA is input to the inverter INV9. A predetermined voltage (Iconst) is supplied to the gate of the NMOS transistor QN55.

In Circuit Example 2, a data write is executed in the following way.

In the write mode, the PMOS transistor QP40 serving as the driver and the NMOS transistors QN54 and QN55 serving as the sinkers of the selected column address signal are turned on by the column decoder to supply a current to the selected write bit line WBL1. Alternatively, the PMOS transistor QP41 serving as the driver and the NMOS transistors QN52 and QN53 serving as the sinkers of the selected column address signal are turned on to supply a current to the selected write bit line WBL1.

In the write mode, since PMOS transistors serving as the drivers and NMOS transistors serving as the sinkers of unselected write bit lines WBL are OFF, no currents flow to the unselected write bit lines WBL.

D. Device Structure of Memory Cell Portion

The device structure of the memory cell portion will be described next. The device structure of the block BK11 shown in FIG. 34 will be exemplified.

Figure 37:
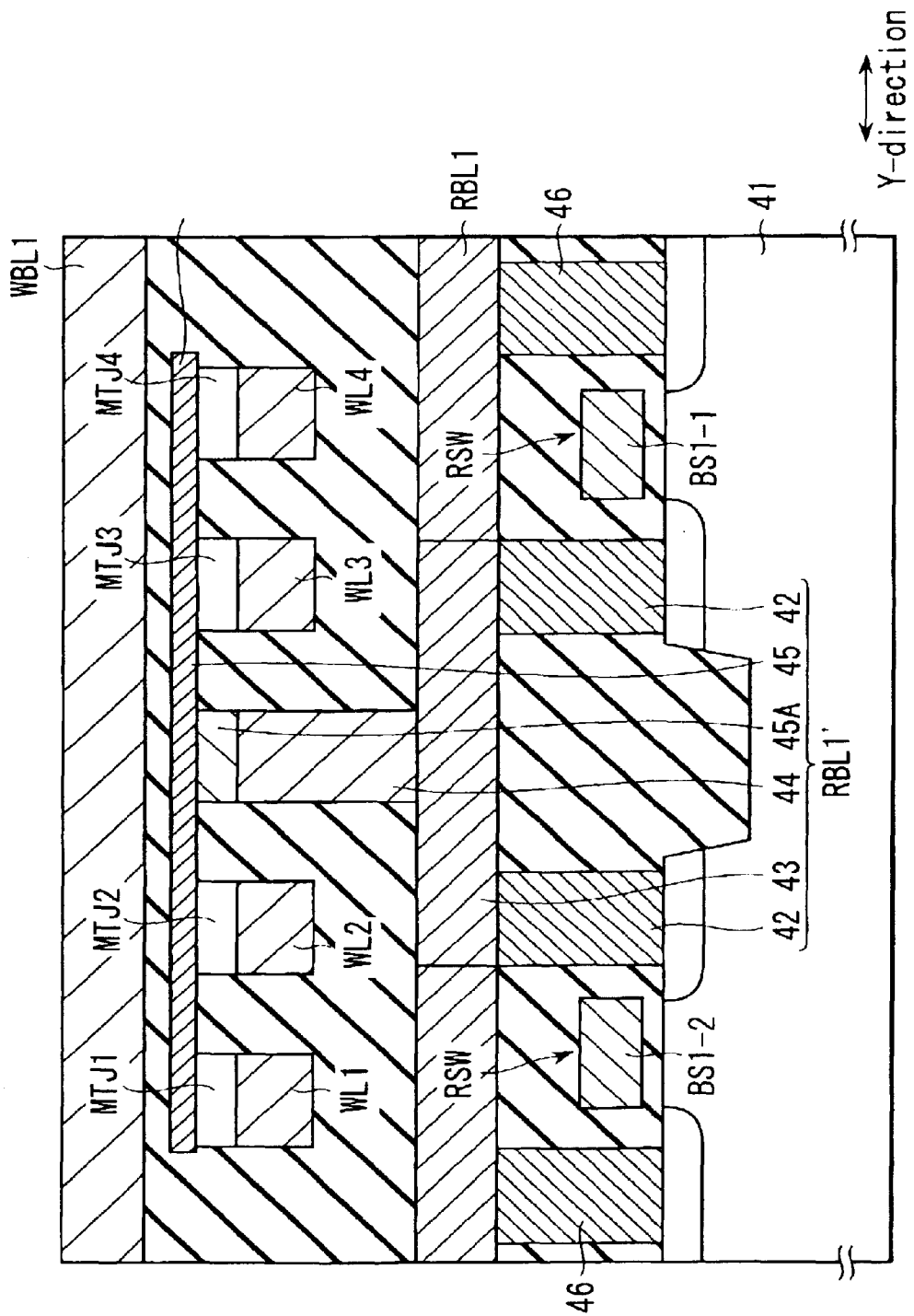
FIG. 37 is a sectional view showing Structural Example 1 of the magnetic random access memory according to the fifth embodiment of the present invention in the Y-direction.
Figure 38:
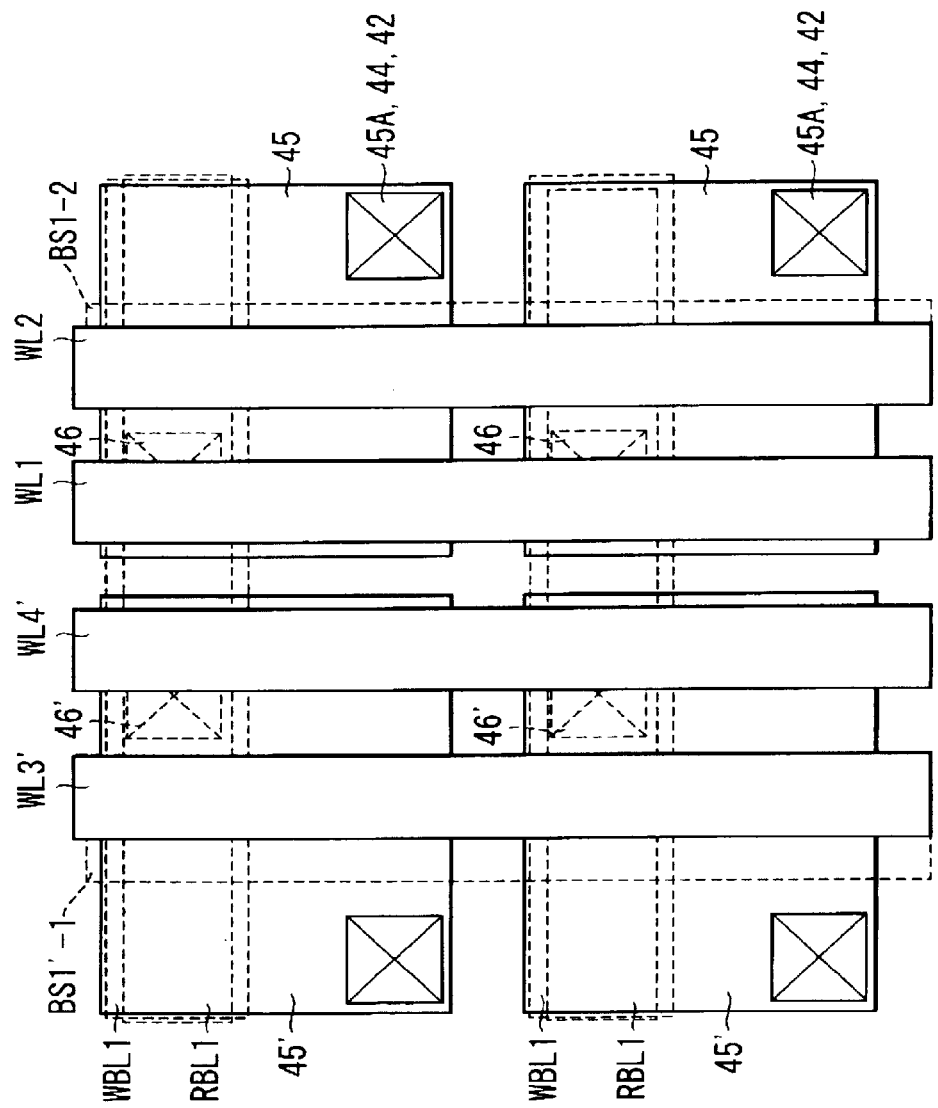
FIG. 38 is a plan view showing Structural Example 2 of the magnetic random access memory according to the fifth embodiment of the present invention.
Figure 39:
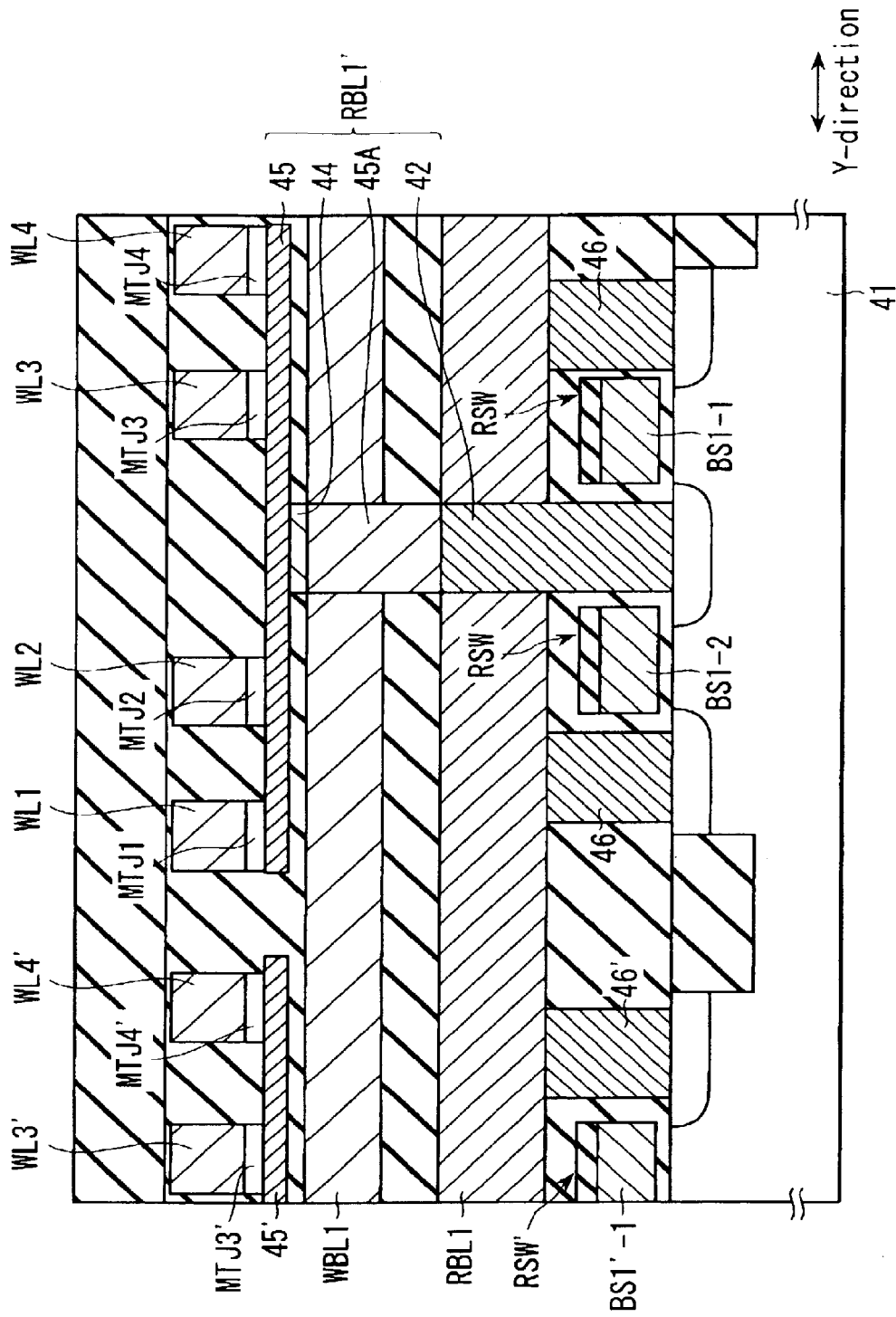
FIG. 39 is a sectional view showing Structural Example 2 of the magnetic random access memory according to the fifth embodiment of the present invention in the Y-direction.
Figure 40:
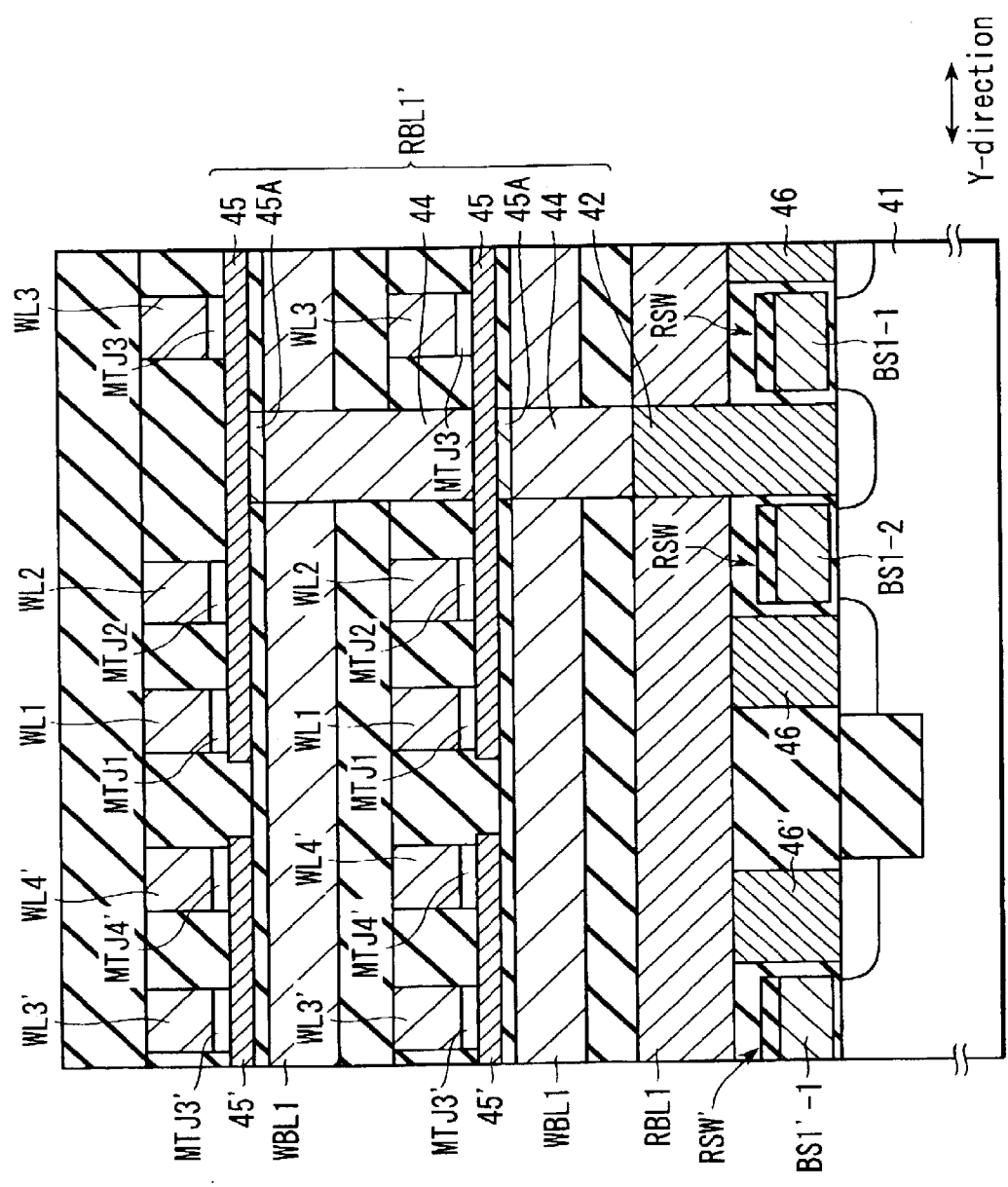
FIG. 40 is a sectional view showing a modification of the magnetic random access memory according to the fifth embodiment of the present invention in the Y-direction.

FIGS. 37 and 39 show the Y-direction section of one block of the magnetic random access memory. FIG. 38 shows the plane of one block of the magnetic random access memory. FIG. 40 shows a modification of the structure shown in FIGS. 38 and 39.

(1) Structure of Memory Cell Portion

① STRUCTURAL Example 1

FIG. 37 is a sectional view showing Structural Example 1 of the magnetic random access memory according to the fifth embodiment of the present invention.

The read select switches (e.g., MOS transistors) RSW are arranged in the surface region of a semiconductor substrate 41.

The source of each read select switch RSW is connected to the read bit line RBL1 through a contact plug 46. The read bit line RBL1 runs straight in, e.g., the Y-direction (column direction) and is connected to the sense amplifier 15 through the bias circuit 13-1 and column select switch 14-1 around the memory cell array region.

The gates of the read select switches RSW serve as block select lines BS1-1 and BS1-2. The block select lines BS1-1 and BS1-2 run in the X-direction.

The drain of each read select switch RSW is electrically connected to an upper electrode 45 through contact plugs 42 and 44 and intermediate layers 43 and 45A. The upper electrode 45, contact plugs 42 and 44, and intermediate layers 43 and 45A form a read sub bit line RBL1'.

The four MTJ elements MTJ1, MTJ2, MTJ3, and MTJ4 are arranged in the Y-direction on the read select switches RSW. The MTJ elements MTJ1, MTJ2, MTJ3, and MTJ4 are arranged on the same plane. The read select switches RSW are arranged immediately under the MTJ elements MTJ1, MTJ2, MTJ3, and MTJ4.

One terminal (upper end in this embodiment) of each of the MTJ elements MTJ1, MTJ2, MTJ3, and MTJ4 is commonly connected to the upper electrode 45.

The other terminal (lower end in this embodiment) of each of the MTJ elements MTJ1, MTJ2, MTJ3, and MTJ4 is independently electrically connected to a corresponding one of the word lines WL1, WL2, WL3, and WL4. That is, the four word lines WL1, WL2, WL3, and WL4 are arranged in correspondence with the four MTJ elements MTJ1, MTJ2, MTJ3, and MTJ4. The word lines WL1, WL2, WL3, and WL4 run in the X-direction (row direction).

The write bit line WBL1 is arranged near and immediately above the MTJ elements MTJ1, MTJ2, MTJ3, and MTJ4 while being separated from them. The write bit line WBL1 runs in the Y-direction (column direction).

As described above, in this embodiment, one write bit line WBL1 is arranged in correspondence with the four MTJ elements MTJ1, MTJ2, MTJ3, and MTJ4 that construct a block.

② STRUCTURAL Example 2

FIGS. 38 and 39 are plan and sectional views, respectively, showing Structural Example 2 of the magnetic random access memory according to the fifth embodiment of the present invention.

Structural Example 2 is different from Structural Example 1 in that the write bit line WBL1 and the word lines WL1, WL2, WL3, and WL4 are replaced.

More specifically, in Structural Example 1, the word lines WL1, WL2, WL3, and WL4 are arranged on the semiconductor substrate 41 side (under the MTJ elements in FIG. 37) of the MTJ elements MTJ1, MTJ2, MTJ3, and MTJ4, where the read select switches RSW are present, and the write bit line WBL1 is arranged on the opposite side (above the MTJ elements in FIG. 37).

To the contrary, in Structural Example 2, the write bit line WBL1 is arranged on the semiconductor substrate 41 side (under the MTJ elements in FIG. 37) of the MTJ elements MTJ1, MTJ2, MTJ3, and MTJ4, where the read select switches RSW are present, and the word lines WL1, WL2, WL3, and WL4 are arranged on the opposite side (above the MTJ elements in FIG. 37).

③ Modification

FIG. 40 shows a modification of Structural Example 2 of the magnetic random access memory according to the fifth embodiment of the present invention.

This modification is different from Structural Example 2 in that the MTJ elements MTJ1, MTJ2, MTJ3, and MTJ4 of Structural Example 2 are stacked, and the number of MTJ elements in one block is increased.

More specifically, in the modification, the drain of each read select switch RSW is electrically connected to the upper electrode 45 of the first stage through the contact plugs 42 and 44 and intermediate layer 45A and then electrically connected to the upper electrode 45 of the second stage through the contact plug 44 and intermediate layer 45A. Hence, the four MTJ elements of the first stage and the four MTJ elements of the second stage, which are arrayed in the Y-direction, are arranged on the read select switches RSW.

The MTJ elements of the second stage are independently electrically connected to the word lines WL1, WL2, WL3, and WL4, like the MTJ elements of the first stage. The four MTJ elements of the second stage share one write bit line WBL1.

(2) Structure of MTJ Element

The MTJ element of the fifth embodiment has the same structure as that of the first embodiment, and a description thereof will be omitted.

E. Effects

According to this embodiment, as in the first embodiment, the cell area per bit can be reduced as compared to a structure having a read switch element arranged for each MTJ element. For this reason, the capacity can be increased without increasing the cell area.

In addition, as in the first embodiment, the number of MTJ elements connected to the read bit line can substantially be reduced. Since a roundabout read current can be suppressed, any read error can be prevented.

Furthermore, in this embodiment, one write bit line is shared by the plurality of MTJ elements in one block. Hence, the area of the memory cell portion can be reduced as compared to the structure in which a write bit line is arranged for each MTJ element, like the first to fourth embodiments.

[2-2: Sixth Embodiment]

In the sixth embodiment, a horizontal cell structure is formed by arranging MTJ elements horizontally on a semiconductor substrate, as in the fifth embodiment. In the sixth embodiment, however, the read current flowing direction is reversed to that of the fifth embodiment.

A. Overall Circuit Structure

Figure 41:
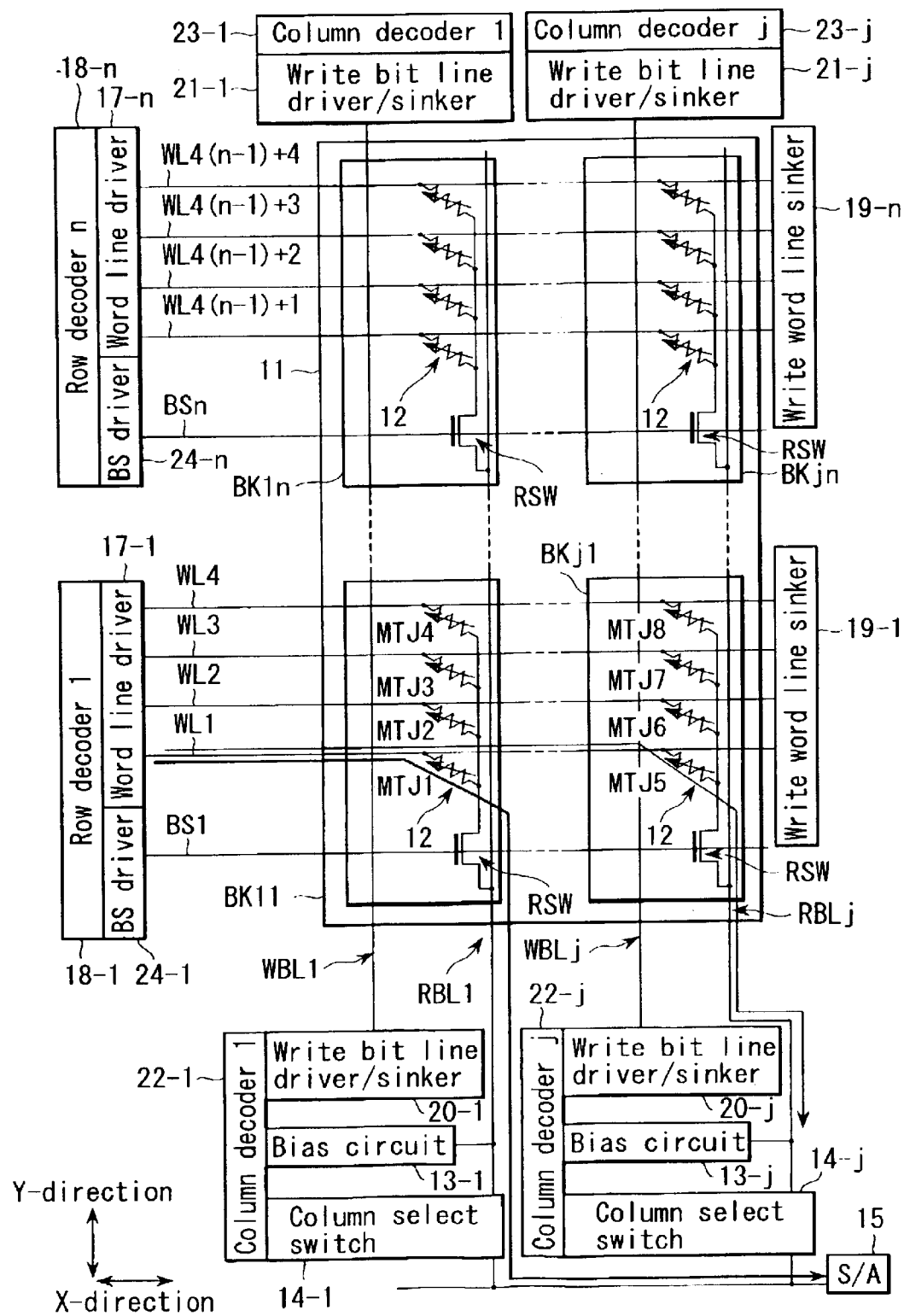
FIG. 41 is a view showing the schematic arrangement of a magnetic random access memory according to the sixth embodiment of the present invention.

FIG. 41 is a view showing the schematic arrangement of a magnetic random access memory according to the sixth embodiment of the present invention. A description of the same components as in the fifth embodiment will be omitted.

The sixth embodiment is different from the fifth embodiment in that a word line driver 17-$n$ and word line sinker 19 are replaced. In the fifth embodiment, the ground potential is supplied to the selected word line. In the sixth embodiment, however, the power supply potential is supplied to the selected word line.

That is, in the sixth embodiment, the direction of the read current is reversed to that in the fifth embodiment.

B. Write/Read Operation Principle

Data write/read operation in the sixth embodiment of the present invention will be described next.

(1) Write Operation Principle

The write method of the sixth embodiment is the same as that of the fifth embodiment, and a description thereof will be omitted.

(2) Read Operation Principle

Assume that the data of an MTJ element MTJ1 in a lower left block BK11 should be read out.

The read current flows from a selected word line WL1 to a selected read bit line RBL1. The read bit line RBL1 selected by a column address signal is connected to a sense amplifier 15 by a column select switch 14-1 selected by a column decoder 22-1. A current is biased from the sense amplifier 15. The voltage of the read bit line RBL1 is set to a predetermined voltage (Vconst) by the feedback circuit of the sense amplifier 15 (to be described later).

Unselected read bit lines RBLj are not connected to the sense amplifier 15 because column select switches 14-$j$ are OFF. However, the unselected read bit lines RBLj are set to a predetermined voltage (Vconst) by bias circuits 13-$j$.

In addition, a block select line BS1 is driven by a row address signal necessary for selecting the block BK11, and a MOS transistor RSW for selecting the block BK11 is turned on.

In the block BK11, the word line WL1 selected by the row address signal is set to a power supply potential VDD, and unselected word lines WL2, WL3, and WL4 are set in the floating state.

With this operation, for the MTJ element MTJ1 selected by the row address signal and column address signal, a current flows from the word line WL1 to the sense amplifier 15.

C. Circuit Structure of Peripheral Circuit Portion

In the peripheral circuit of the sixth embodiment, the block select driver can be the same as that of the first embodiment, and a description thereof will be omitted.

In the sixth embodiment, the read current flowing direction is reversed to that of the fifth embodiment. Hence, in the peripheral circuit of the sixth embodiment, the word line driver/sinker, sense amplifier, bias circuit, and column select switch can be the same as those of the second embodiment, and a description thereof will be omitted.

In the sixth embodiment, as in the fifth embodiment, since the write bit line WBLj is shared by the MTJ elements 12 in the block BKjn, the row address signal for selecting an MTJ element in the block need not be input. Hence, in the peripheral circuit of the sixth embodiment, the write bit line driver can be the same as that of the fifth embodiment, and a description thereof will be omitted.

D. Device Structure of Memory Cell Portion

The device structure of the memory cell portion of the sixth embodiment is almost the same as that of the fifth embodiment, and a description thereof will be omitted.

E. Effects

According to this embodiment, as in the first embodiment, the cell area per bit can be reduced as compared to a structure having a read switch element arranged for each MTJ element. For this reason, the capacity can be increased without increasing the cell area.

In addition, as in the first embodiment, the number of MTJ elements connected to the read bit line can substantially be reduced. Since a roundabout read current can be suppressed, any read error can be prevented.

Furthermore, as in the fifth embodiment, one write bit line is shared by the plurality of MTJ elements in one block.

Hence, the area of the memory cell portion can be reduced as compared to the structure in which a write bit line is arranged for each MTJ element, like the first to fourth embodiments.

[3] Cross-Point Cell Structure

A cross-point cell structure here is a modification of a normal cross-point cell array structure having MTJ elements arranged at the intersections between word lines and bit lines, in which a bit line is divided, and two block select switches are arranged.

That is, in the seventh embodiment, a plurality of MTJ elements are arranged horizontally in a direction (bit line running direction) parallel to the surface of a semiconductor substrate. One terminal of each of the plurality of MTJ elements is commonly connected while the other terminal of each of the plurality of MTJ elements is independently connected to word lines to form one block. In this structure, a bit line is divided into two lines, and two block select switches are arranged.

In the seventh embodiment, four MTJ elements are arranged horizontally in one block. However, the number of MTJ elements is not limited to this.

[3-1: Seventh Embodiment]

In the seventh embodiment, a cross-point cell structure having two bit lines and two block select switches in one block formed from a plurality of MTJ elements is formed.

A. Overall Circuit Structure

Figure 42:
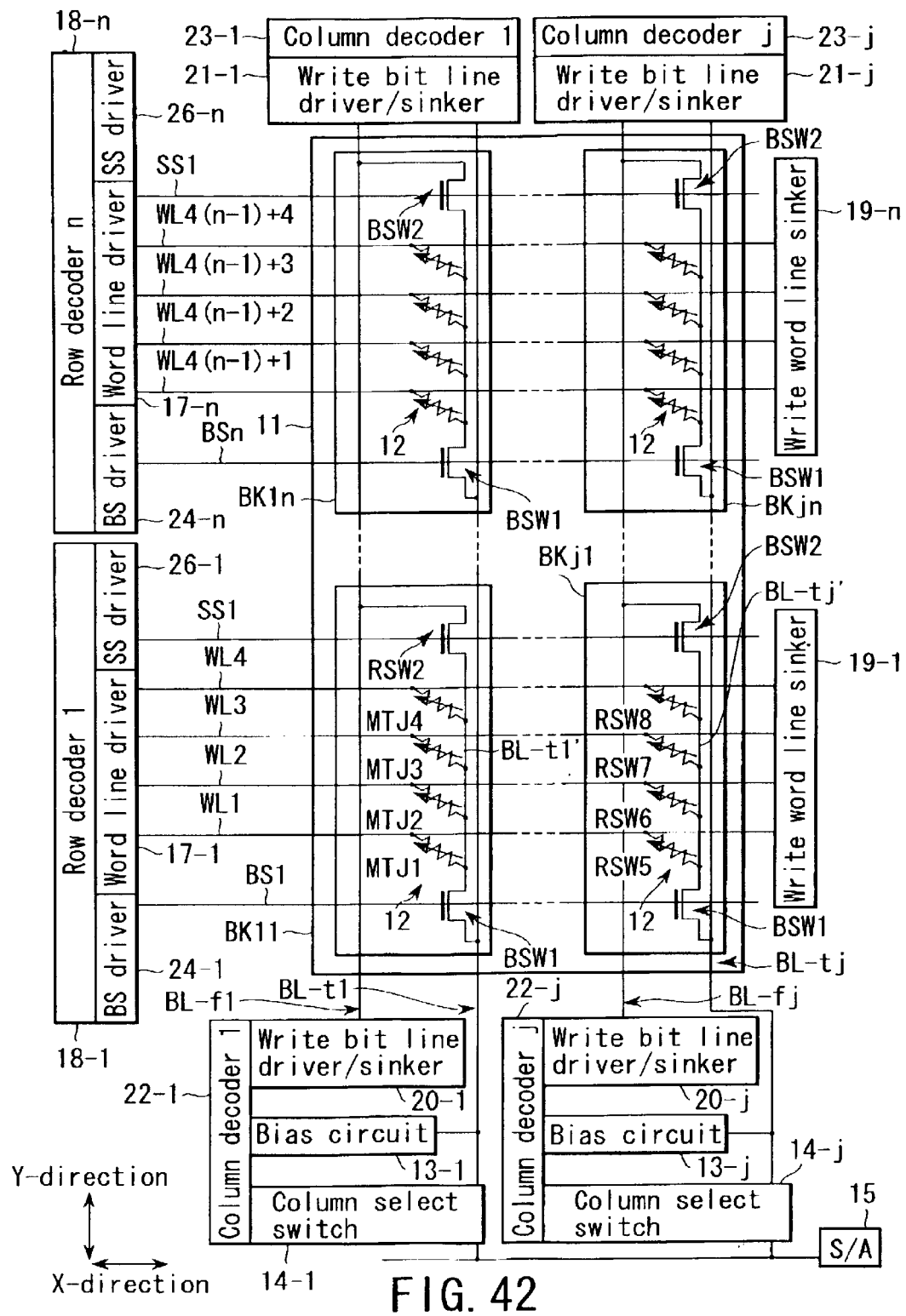
FIG. 42 is a view showing the schematic arrangement of a magnetic random access memory according to the seventh embodiment of the present invention.

FIG. 42 is a view showing the schematic arrangement of a magnetic random access memory according to the seventh embodiment of the present invention.

The seventh embodiment is different from the first embodiment in that since MTJ elements 12 which construct a block are not stacked, one write bit line BL-fj suffices for each column.

That is, in the seventh embodiment, as in the fifth embodiment, the write bit line BL-fj is shared by the plurality of MTJ elements 12 independently of the number of MTJ elements 12 in one block BKjn. For example, a write bit line BL-f1 is shared by the MTJ elements 12 in blocks BK11 and BL1n on the same column.

The seventh embodiment is different from the first embodiment in that two block select switch elements (BSW1 and BSW2) are arranged for each block BKjn.

That is, in the seventh embodiment, the block select switch elements (MOS transistors) BSW1 and BSW2 are arranged at two ends of an interconnection that is commonly connected to one terminal of each of the plurality of MTJ elements 12 in one block BKjn. The direction of the write current can be changed by the two block select switch elements BSW1 and BSW2 in accordance with data.

B. Write/Read Operation Principle

Data write/read operation in the seventh embodiment of the present invention will be described next.

(1) Write Operation Principle

Assume that data should be written in an MTJ element MTJ1 in a lower left block BK11.

First, the two block select switch elements BSW1 and BSW2 are turned on by block select drivers (BS driver and SS driver) 24-1 and 26-1 to select the block BK11 to be write-accessed.

Currents are supplied to a selected word line WL1, the write bit line BL-f1, and a bit line BL-t1 to generate a synthesized magnetic field.

The magnetization of the MTJ element MTJ1 at the intersection between the selected word line WL1 and the common node (sub bit line BL-t1') in the selected block BK11 is inverted or not inverted by the synthesized magnetic field to write data in the MTJ element MTJ1.

As in the first to sixth embodiments, when the roles of write bit line drivers/sinkers 20-1 and 21-1 are replaced, write data ("0"-data or "1"-data) can be changed. That is, in accordance with the write data, a current flows through bit line BL-t1→sub bit line BL-t1'→bit line BL-f1 or through bit line BL-f1→sub bit line BL-t1'→bit line BL-t1.

According to this write operation, a current flows from the write bit lines BL-f1 and BL-t1 to the MTJ common node (sub bit line BL-t1') in the selected block BK11 through the block select switch elements BSW1 and BSW2. For this reason, the write current can be supplied closer to the MTJ element, unlike the first to sixth embodiments. Since a large magnetic field can be generated, the write current can be reduced.

In the seventh embodiment, when data should be written in each of the plurality of MTJ elements 12 located on the same column, the same write bit lines BL-fj and BL-tj are used.

Hence, to write data in an MTJ element MTJ2 of the block BK11, a word line WL2 is used while the write bit lines BL-f1 and BL-t1 and sub bit line BL-t1' are also used as in the above-described case. To write data in an MTJ element MTJ3 of the block BK11, a word line WL3 is used while the write bit lines BL-f1 and BL-t1 and sub bit line BL-t1' are also used as in the above-described case. To write data in an MTJ element MTJ4 of the block BK11, a word line WL4 is used while the write bit lines BL-f1 and BL-t1 and sub bit line BL-t1' are also used as in the above-described case.

For the remaining blocks BLjn as well, a write is executed by the same operation as described above.

(2) Read Operation Principle

Assume that the data of the MTJ element MTJ1 in the lower left block BK11 should be read out.

First, a column select switch 14-1 selected by a column decoder 22-1 is turned on to connect the read bit line BL-t1 selected by a column address signal to a sense amplifier 15. A bias current is supplied from the sense amplifier 15. The voltage of the read bit line BL-t1 is set to a predetermined voltage (Vconst) by the feedback circuit of the sense amplifier 15.

Unselected read bit lines BL-tj are not connected to the sense amplifier 15 because column select switches 14-j are OFF, though the read bit lines BL-tj are set to the predetermined voltage (Vconst) by bias circuits 13-j.

In addition, a block select line BS1 is driven by a row address signal necessary for selecting the block BK11, and the MOS transistor BSW1 for selecting the block BK11 is turned on.

In the block BK11, the word line WL1 selected by the row address signal is set to a ground potential VSS, and the unselected word lines WL2, WL3, and WL4 are set in the floating state.

With this operation, a bias current from the sense amplifier 15 flows to the MTJ element MTJ1 selected by the row address signal and column address signal.

No currents flow to the MTJ elements 12 in blocks BKln and BKjn in which the block select MOS transistors BSW1 are OFF.

A current from the bias circuit 13-j is supplied to the MTJ elements 12 in a block BKj1 which is not selected by the column address signal and whose block select MOS transistor BSW1 is ON. The current flowing to an MTJ element MTJ5 which is connected to the word line WL1 in the unselected block BKj1 flows to the ground potential VSS. Hence, the current does not reflux to the MTJ element MTJ1 in the block BK11 selected by the row address signal and column address signal.

C. Circuit Structure of Peripheral Circuit Portion

In the peripheral circuit of the seventh embodiment, the word line driver/sinker, write bit line driver, block select driver, sense amplifier, bias circuit, and column select switch can be the same as those of the first to sixth embodiments, and a description thereof will be omitted.

D. Device Structure of Memory Cell Portion

The device structure of the memory cell portion will be described next. The device structure of the block BK11 shown in FIG. 42 will be exemplified.

Figure 43:
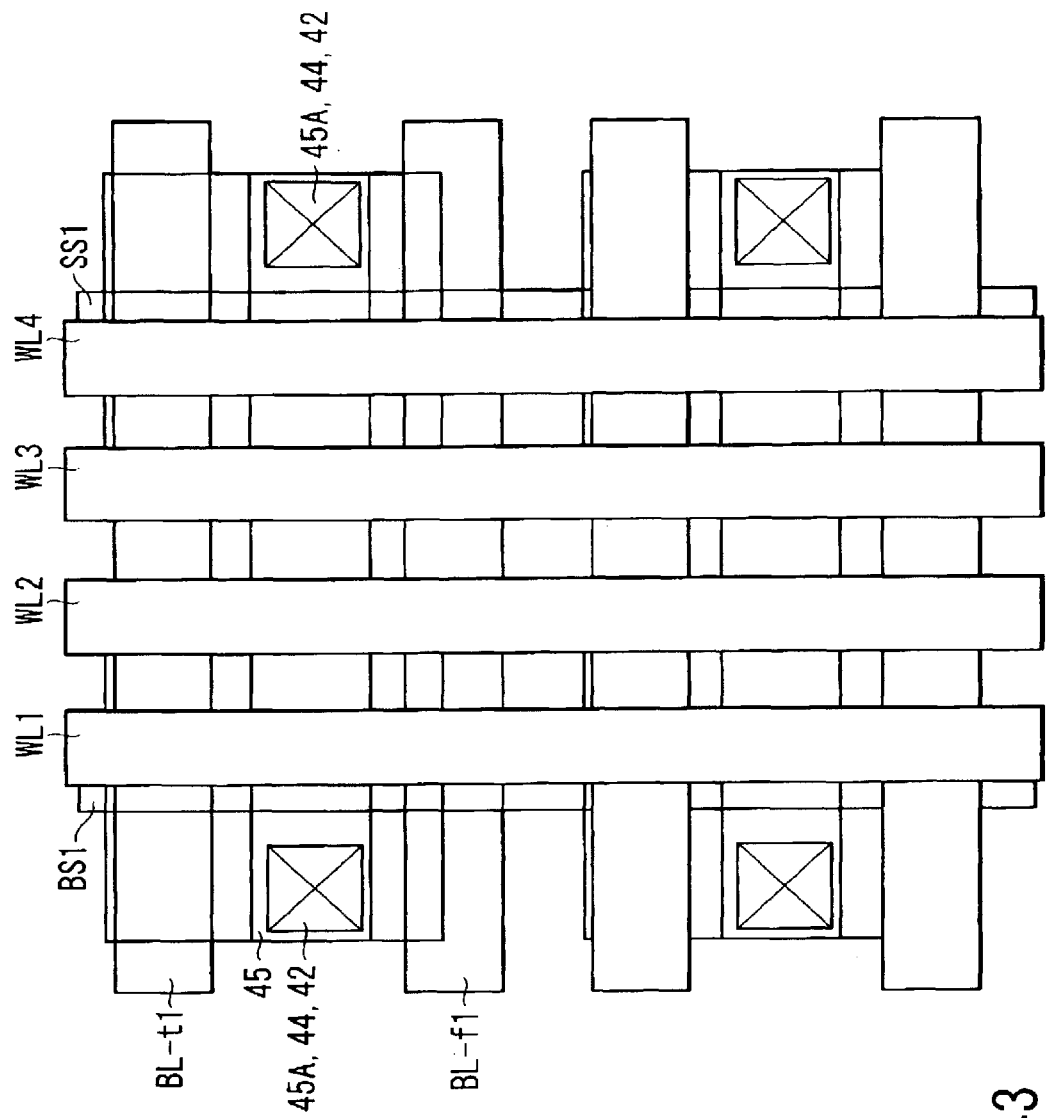
FIG. 43 is a plan view showing a structural example of the magnetic random access memory according to the seventh embodiment of the present invention.
Figure 44:
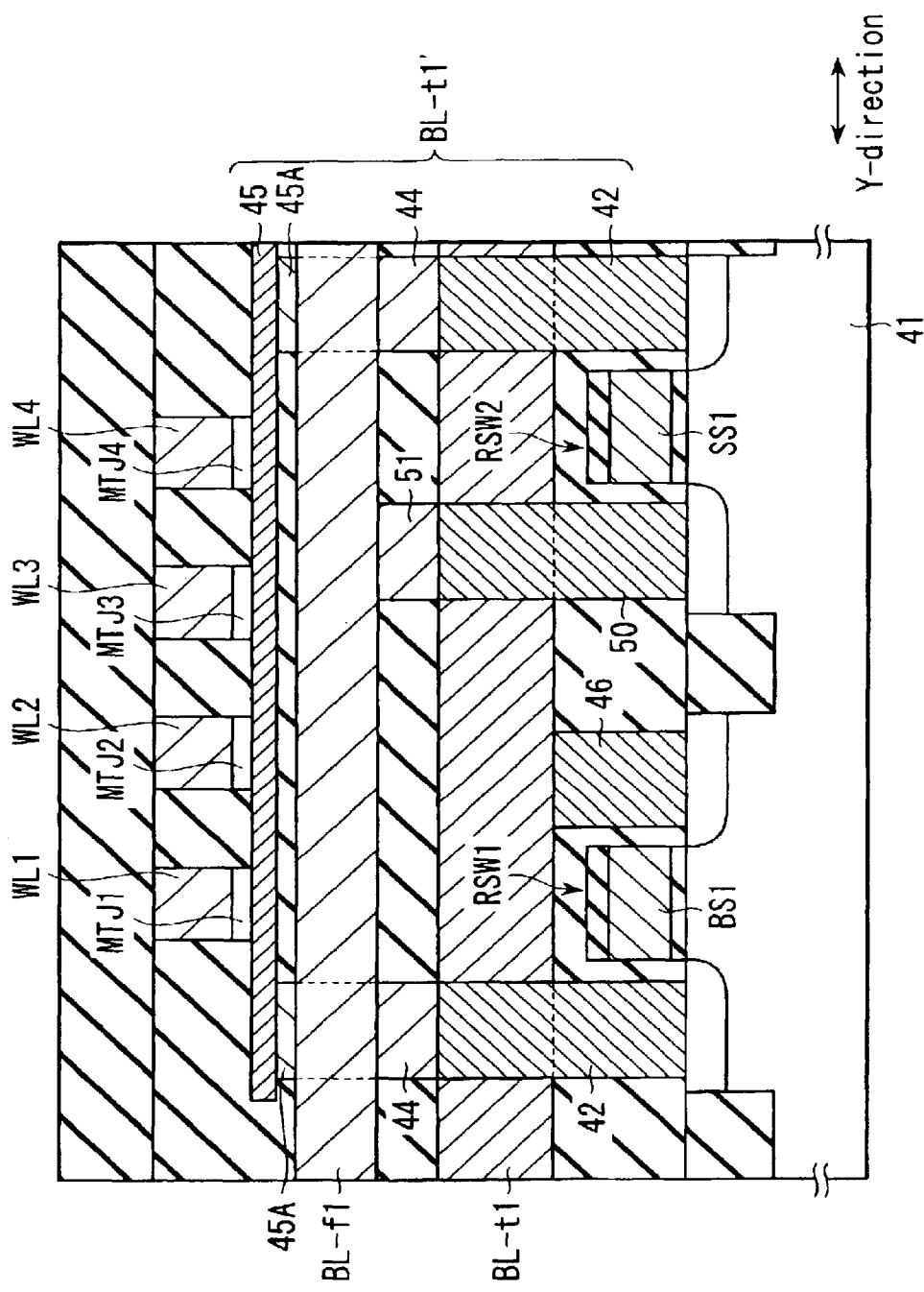
FIG. 44 is a sectional view showing a structural example of the magnetic random access memory according to the seventh embodiment of the present invention in the Y-direction.

FIG. 43 shows the plane of one block of the magnetic random access memory. FIG. 44 shows a Y-direction section of one block of the magnetic random access memory.

(1) Structure of Memory Cell Portion

FIGS. 43 and 44 are a plan and sectional views respectively showing a structural example of the magnetic random access memory according to the seventh embodiment of the present invention.

The block select switches (e.g., MOS transistors) BSW1 and BSW2 are arranged in the surface region of a semiconductor substrate 41.

The source of the block select switch BSW1 is connected to the read bit line BL-t1 through a contact plug 46. The read bit line BL-t1 runs straight in, e.g., the Y-direction (column direction) and is connected to the sense amplifier 15 through the bias circuit 13-1 and column select switch 14-1 around the memory cell array region.

The gate of the block select switch BSW1 serves as the block select line BS1. The block select line BS1 runs in the X-direction.

The drain of each of the block select switches BSW1 and BSW2 is electrically connected to a lower electrode 45 through contact plugs 42 and 44 and intermediate layer 45A. The lower electrode 45, contact plugs 42 and 44, and intermediate layer 45A form a read sub bit line RBL1'.

The source of the block select switch BSW2 is connected to the write bit line BL-f1 through contact plugs 50 and 51. The write bit line BL-f1 runs straight in, e.g., the Y-direction (column direction) and is connected to the write bit line drivers/sinkers 20-1 and 21-1 around the memory cell array region.

The gate of the block select switch BSW2 serves as the block select line SS1. The block select line SS1 runs in the X-direction.

The four MTJ elements MTJ1, MTJ2, MTJ3, and MTJ4 are arranged in the Y-direction on the block select switches BSW1 and BSW2.

One terminal (lower end in this embodiment) of each of the MTJ elements MTJ1, MTJ2, MTJ3, and MTJ4 is commonly connected to the lower electrode 45.

The other terminal (upper end in this embodiment) of each of the MTJ elements MTJ1, MTJ2, MTJ3, and MTJ4 is independently electrically connected to a corresponding one of the word lines WL1, WL2, WL3, and WL4. That is, the four word lines WL1, WL2, WL3, and WL4 are arranged in correspondence with the four MTJ elements MTJ1, MTJ2, MTJ3, and MTJ4. The word lines WL1, WL2, WL3, and WL4 run in the X-direction (row direction).

The write bit line BL-f1 is arranged near and immediately under the MTJ elements MTJ1, MTJ2, MTJ3, and MTJ4. The write bit line BL-f1 runs in the Y-direction (column direction).

As described above, in this embodiment, one write bit line BL-f1, one read bit line BL-t1, and two block select switches BSW1 and BSW2 are arranged in correspondence with the four MTJ elements MTJ1, MTJ2, MTJ3, and MTJ4 that construct a block.

(2) Structure of MTJ Element

The MTJ element of the seventh embodiment has the same structure as that of the first embodiment, and a description thereof will be omitted.

E. Effects

According to this embodiment, as in the first embodiment, the cell area per bit can be reduced as compared to a structure having a read switch element arranged for each MTJ element. For this reason, the capacity can be increased without increasing the cell area.

In addition, as in the first embodiment, the number of MTJ elements connected to the read bit line can substantially be reduced. Since a roundabout read current can be suppressed, any read error can be prevented.

Furthermore, as in the fifth embodiment, one write bit line is shared by the plurality of MTJ elements in one block. Hence, the area of the memory cell portion can be reduced as compared to the structure in which a write bit line is arranged for each MTJ element, like the first to fourth embodiments.

[4] Others

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

For example, the embodiments may be changed to the following structures.

(1) In the embodiments, the bias circuit 13-j is arranged for each column. However, the present invention is not limited to this.

Figure 45:
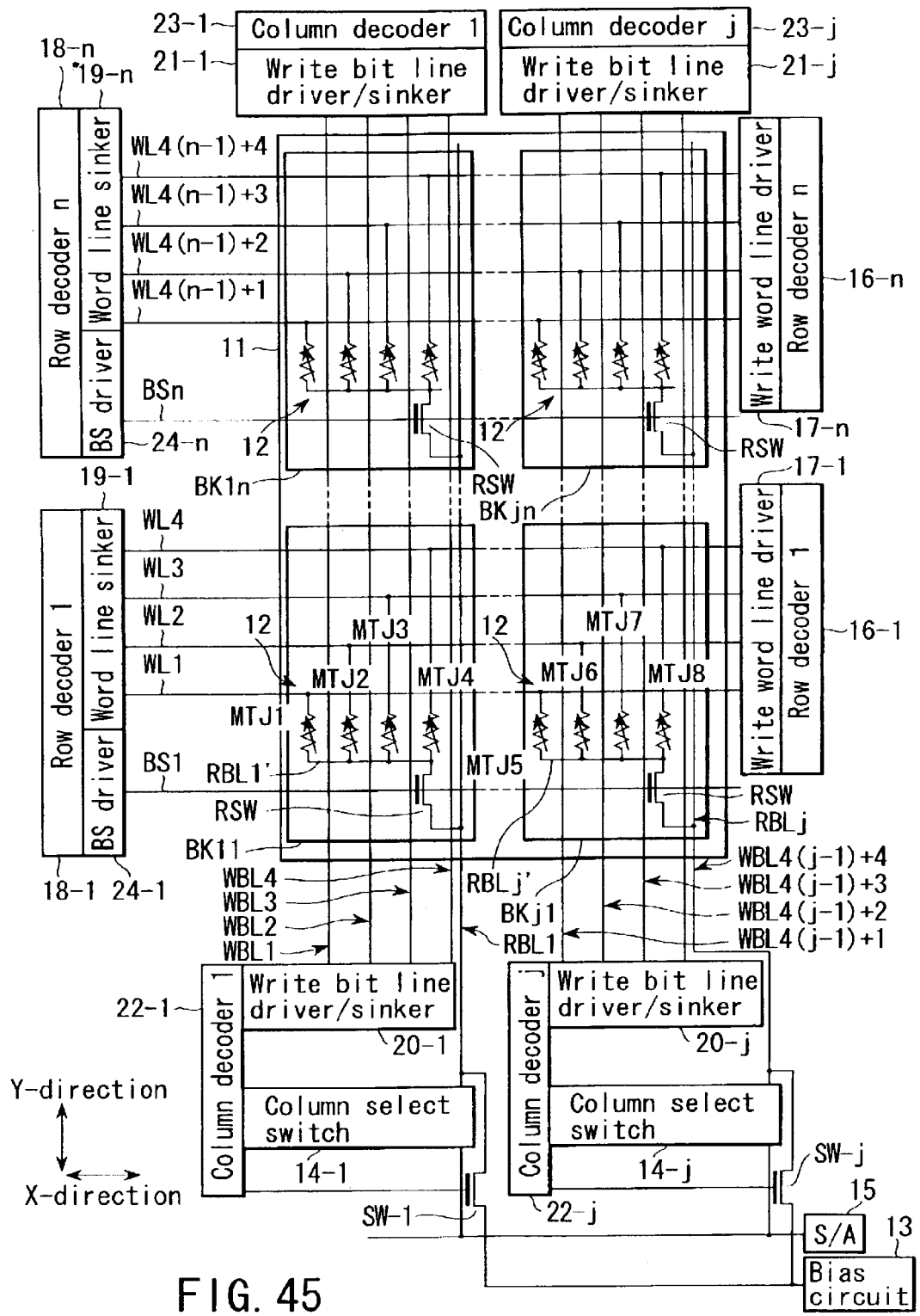
FIG. 45 is a schematic view showing a modification of the magnetic random access memory according to the seventh embodiment of the present invention.

More specifically, as shown in FIG. 45, the bias circuit 13 may be shared by a plurality of columns. A switch SW-j may be arranged for each column, and the bias circuit 13 may be arranged outside the read main bit lines RBLj.

(2) In the embodiments, the read select switch RSW or block select switch BSW are a MOS transistor or pn-junction diode. However, the present invention is not limited to this.

More specifically, the read select switch RSW or block select switch BSW may be a MIS (Metal Insulator Semiconductor) transistor (including a MOS transistor), MES (Metal Semiconductor) transistor, junction transistor, bipolar transistor, or a diode.

(3) In the seventh embodiment, the write bit line BL-f1 and the word lines WL1, WL2, WL3, and WL4 may be replaced.

More specifically, referring to FIG. 44, the write bit line BL-f1 is arranged on the semiconductor substrate 41 side (under the MTJ elements in FIG. 44) of the MTJ elements MTJ1, MTJ2, MTJ3, and MTJ4, where the read select switches RSW1 and RSW2 are present, and the word lines WL1, WL2, WL3, and WL4 are arranged on the opposite side (above the MTJ elements in FIG. 44).

Instead, for example, the word lines WL1, WL2, WL3, and WL4 may be arranged on the semiconductor substrate 41 side of the MTJ elements MTJ1, MTJ2, MTJ3, and MTJ4, where the read select switches RSW1 and RSW2 are present, and the write bit line BL-f1 may be arranged on the opposite side.

(4) The embodiments are based on the premise that an MTJ element is used as a magnetoresistive element. However, the present invention is not limited to this.

Instead, a GMR (Giant Magneto-Resistance) element formed from two magnetic layers and a conductive layer sandwiched between the magnetic layers, or a CMR (Colossal Magnet-Resistance) element formed from perovskite Mn oxide may be used as a magnetoresistive element. In this case, the magnetoresistive element can be applied to the embodiments by appropriately changing the cell array structure, read operation principle, and read circuit.

What is claimed is:

1. A data reading method of a magnetic random access memory comprising a first block, the first block comprising a plurality of first magnetoresistive elements which read data using a magnetoresistive effect, a plurality of first word lines each of which is independently connected to one terminal of a corresponding one of the plurality of first magnetoresistive elements, a first read sub bit line commonly connected to the other terminal of each of the plurality of first magnetoresistive elements, a first block select switch whose first current path has one end connected to the first read sub bit line, and a first read main bit line connected to the other end of the first current path, a second block arranged on the same row as that of the first block and on a different column, the second block comprising a plurality of second magnetoresistive elements which read data using the magnetoresistive effect, the plurality of first word lines each of which is independently connected to one terminal of a corresponding one of the plurality of second magnetoresistive elements, a second read sub bit line commonly connected to the other terminal of each of the plurality of second magnetoresistive elements, a second block select switch whose second current path has one end connected to the second read sub bit line, and a second read main bit line connected to the other end of the second current path, a third block arranged on the same column as that of the first block and on a different row, the third block comprising a plurality of third magnetoresistive elements which read data using the magnetoresistive effect, a plurality of second word lines each of which is independently connected to one terminal of a corresponding one of the plurality of third magnetoresistive elements, a third read sub bit line commonly connected to the other terminal of each of the plurality of third magnetoresistive elements, a third block select switch whose third current path has one end connected to the third read sub bit line, and the first read main bit line connected to the other end of the third current path, a first bias circuit which is arranged around the first to third blocks and connected to the first read main bit line, a second bias circuit which is arranged around the first to third blocks and connected to the second read main bit line, and a sense amplifier which is arranged around the first to third blocks and connected to the first and second read main bit lines, comprising:

in reading data of a first selected magnetoresistive element in the plurality of first magnetoresistive elements in the first block, connecting the first read main bit line to the sense amplifier;

selecting, from the plurality of first word lines, a selected word line to be connected to the first selected magnetoresistive element; and supplying a first read current to the first selected magnetoresistive element and supplying a second read current to a second selected magnetoresistive element to be connected to the selected word line in the plurality of second magnetoresistive elements in the second block to cause the sense amplifier to read out data of the first selected magnetoresistive element.

2. The memory according to claim 1, further comprising a bias circuit connected to the first read main bit line.

3. The memory according to claim 2, wherein the bias circuit is arranged for each column.

4. The memory according to claim 2, wherein the bias circuit is shared by a plurality of columns.

5. The memory according to claim 1, further comprising a sense amplifier which is present in a current path of the first read main bit line.

6. The memory according to claim 1, wherein the first block select switch is one of a MIS transistor, a MES transistor, a junction transistor, a bipolar transistor, and a diode.

7. The memory according to claim 1, wherein the plurality of first magnetoresistive elements are MTJ elements, and each of the MTJ elements includes a magnetized fixed layer having a fixed magnetizing direction, a magnetic recording layer having a magnetizing direction that changes in accordance with write data, and a tunneling barrier layer arranged between the magnetized fixed layer and the magnetic recording layer.

8. The memory according to claim 7, wherein an axis of easy magnetization of each of the MTJ elements is aligned in the row direction.

9. The memory according to claim 7, wherein each of the MTJ elements has one of a single tunnel junction structure and a double tunnel junction structure.

10. The memory according to claim 1, wherein in the first block is formed by stacking the plurality of first magnetoresistive elements in a plurality of stages in a direction perpendicular to a surface of a semiconductor substrate.

11. The memory according to claim 10, wherein in the first block, the plurality of first magnetoresistive elements overlap each other in the direction perpendicular to the surface of the semiconductor substrate.

12. The memory according to claim 10, further comprising a plurality of first write bit lines each of which is paired with a corresponding one of the plurality of first word lines, arranged on a side of the other terminal of a corresponding one of the plurality of first magnetoresistive elements, and runs in the column direction.

13. The memory according to claim 12, wherein the plurality of first write bit lines are separated from the plurality of first magnetoresistive elements.

14. The memory according to claim 12, wherein a side of the one terminal of each of the plurality of first magnetoresistive elements is a side on which the first block select switch is arranged.

15. The memory according to claim 12, wherein a side of the other terminal of each of the plurality of first magnetoresistive elements is a side on which the first block select switch is arranged.

16. The memory according to claim 10, further comprising a plurality of first write bit lines each of which is shared by two, upper and lower adjacent magnetoresistive elements of the plurality of first magnetoresistive elements, separated from the two magnetoresistive elements, and runs in the column direction.

17. The memory according to claim 12, further comprising write bit line drivers/sinkers which are connected to two ends of each of the plurality of first write bit lines to supply a write current having a direction corresponding to write data to the plurality of first write bit lines.

18. The memory according to claim 12, wherein a value of data to be written in the plurality of first magnetoresistive elements is determined by a direction of a write current supplied to the plurality of first write bit lines.

19. The memory according to claim 10, wherein the first block select switch is arranged immediately under the plurality of first magnetoresistive elements.

20. The memory according to claim 10, wherein the first read sub bit line is formed from a plurality of contact plugs extending in a direction perpendicular to the surface of the semiconductor substrate, the plurality of contact plugs overlapping each other.

21. The memory according to claim 1, wherein the first block is formed by arranging the plurality of first magnetoresistive elements in a direction parallel to a surface of a semiconductor substrate.

22. The memory according to claim 21, wherein the plurality of first magnetoresistive elements are arranged on the same plane.

23. The memory according to claim 21, further comprising a first write bit line which is shared by the plurality of first magnetoresistive elements, arranged on a side of the other terminal of each of the plurality of first magnetoresistive elements, and runs in the column direction.

24. The memory according to claim 23, wherein the first write bit line is separated from the plurality of first magnetoresistive elements.

25. The memory according to claim 23, wherein a side of the one terminal of each of the plurality of first magnetoresistive elements is a side on which the first block select switch is arranged.

26. The memory according to claim 23, wherein a side of the other terminal of each of the plurality of first magnetoresistive elements is a side on which the first block select switch is arranged.

27. The memory according to claim 21, wherein the first blocks are stacked in a direction perpendicular to the surface of the semiconductor substrate, and the stacked blocks are connected to the first block select switch.

28. The memory according to claim 23, further comprising write bit line drivers/sinkers which are connected to two ends of the first write bit line to supply a write current having a direction corresponding to write data to the first write bit line.

29. The memory according to claim 23, wherein a value of data to be written in the plurality of first magnetoresistive elements is determined by a direction of a write current supplied to the plurality of first write bit lines.

30. The memory according to claim 1, wherein
the first block is formed by arranging the plurality of first magnetoresistive elements in a direction parallel to a surface of a semiconductor substrate, and
the memory further comprises a fourth block select switch whose fourth current path has one end connected to the other end of the first read sub bit line.

31. The memory according to claim 30, wherein the plurality of first magnetoresistive elements are arranged on the same plane.

32. The memory according to claim 30, further comprising a first write bit line which is shared by the plurality of first magnetoresistive elements, arranged on a side of the other terminal of each of the plurality of first magnetoresistive elements, runs in the column direction, and is connected to the other end of the fourth current path.

33. The memory according to claim 32, wherein the first write bit line is separated from the plurality of first magnetoresistive elements.

34. The memory according to claim 32, wherein a side of the other terminal of each of the plurality of first magnetoresistive elements is a side on which the first and fourth block select switches are arranged.

35. The memory according to claim 32, wherein a side of the one terminal of each of the plurality of first magnetoresistive elements is a side on which the first and fourth block select switches are arranged.

36. The memory according to claim 32, wherein a value of data to be written in the plurality of first magnetoresistive elements is determined by a direction of a write current supplied to the first write bit line.

37. The memory according to claim 36, wherein the direction of the write current is controlled by the first and fourth block select switches.

38. The memory according to claim 32, further comprising write bit line drivers/sinkers which are connected to two ends of the first write bit line to supply a write current having a direction corresponding to write data to the first write bit line.

39. The method according to claim 1, wherein the same potential is applied form the first and second bias circuits to the first and second read main bit lines.

40. The method according to claim 1, wherein of the plurality of first word lines, an unselected word line is in a floating state.

41. The method according to claim 1, wherein the first read current is supplied from the first read main bit line to the selected word line.

42. The method according to claim 1, wherein the second read current is supplied from the second read main bit line to the selected word line.

43. The method according to claim 41, wherein a ground potential is applied to the selected word line.

44. The method according to claim 1, wherein the first read current is supplied from the selected word line to the first read main bit line.

45. The method according to claim 1, wherein the second read current is supplied from the selected word line to the second read main bit line.

46. The method according to claim 44, wherein a power supply potential is applied to the selected word line.

47. The method according to claim 1, wherein the second read main bit line is not connected to the sense amplifier.

48. The method according to claim 1, wherein the first and second block select switches are ON, and the third block select switch is OFF.

49. The method according to claim 1, wherein the plurality of second word lines are set to a potential higher or lower than that of the first read main bit line.

50. The method according to claim 49, wherein each of the first to third block select switches is a diode.

51. The method according to claim 49, wherein the high potential is a power supply potential.

52. The method according to claim 49, wherein the low potential is a ground potential.

53. The method according to claim 49, wherein when the first read current is to be supplied from the first read main bit line to the selected word line, the plurality of second word lines are set to the high potential.

54. The method according to claim 49, wherein when the first read current is to be supplied from the selected word line to the first read main bit line, the plurality of second word lines are set to the low potential.

* * * * *